US012795974B2

(12) United States Patent
Lin et al.

(10) Patent No.: US 12,795,974 B2
(45) Date of Patent: Nov. 10, 2026

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Ta-Chun Lin, Hsinchu (TW); Jhon-Jhy Liaw, Zhudong Township, Hsinchu County (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 435 days.

(21) Appl. No.: 18/342,910

(22) Filed: Jun. 28, 2023

(65) Prior Publication Data

US 2025/0006827 A1 Jan. 2, 2025

(51) Int. Cl.
*H10D 30/43* (2025.01)
*H10D 30/01* (2025.01)
(Continued)

(52) U.S. Cl.
CPC ........... *H10D 30/43* (2025.01); *H10D 30/014* (2025.01); *H10D 30/6735* (2025.01);
(Continued)

(58) Field of Classification Search
CPC .... H10D 30/43; H10D 30/014; H10D 30/019; H10D 30/0191; H10D 30/0193; H10D 30/0194; H10D 30/0195; H10D 30/0196; H10D 30/0197; H10D 30/0198; H10D 62/021; H10D 62/116; H10D 62/118; H10D 62/119; H10D 62/121; H10D 62/151; H10D 64/017; H10D 64/018; H10D 64/311; H10D 64/518; H10D 64/675; H10D 84/0149; H10D 84/0151; H10D 84/0153; H10D 84/0158; H10D 84/0179; H10D 84/0184;
(Continued)

(56) References Cited

U.S. PATENT DOCUMENTS 9,209,247 B2 12/2015 Colinge et al.
9,236,267 B2 1/2016 De et al.
(Continued)

*Primary Examiner* — Natalia A Gondarenko
(74) *Attorney, Agent, or Firm* — McClure, Qualey & Rodack, LLP

(57) ABSTRACT

Semiconductor structures and methods for manufacturing the same are provided. The semiconductor structure includes an isolation structure formed over a substrate, and first nanostructures formed over an isolation structure along a first direction. The semiconductor includes second nanostructures adjacent to the first nanostructure along the first direction. The semiconductor also includes a dielectric wall between the first nanostructures and the second nanostructures, and the dielectric wall includes a low-k dielectric material. The dielectric wall is in direct contact with the first nanostructures and the second nanostructures, and a top surface of the dielectric wall is higher than a top surface of the isolation structure. The semiconductor includes a gate structure formed over the first nanostructures along a second direction, and a cutting structure formed over the dielectric wall. The gate structure is divided into two portions by the cutting structure.

20 Claims, 48 Drawing Sheets

(51) Int. Cl.

| | |
|---|---|
| ***H10D 30/67*** | (2025.01) |
| ***H10D 62/10*** | (2025.01) |
| ***H10D 62/13*** | (2025.01) |
| ***H10D 64/01*** | (2025.01) |

(52) U.S. Cl.
CPC ......... *H10D 62/121* (2025.01); *H10D 62/151* (2025.01); *H10D 64/017* (2025.01); *H10D 64/018* (2025.01)

(58) Field of Classification Search
CPC ............. H10D 84/0193; H10D 84/833; H10D 84/834; H10D 30/0273; H10D 30/024; H10D 30/501; H10D 30/502; H10D 30/506; H10D 30/507; H10D 30/508; H10D 30/509; H10D 30/6211; H10D 30/6215; H10D 30/6219; H10D 30/6735; B82Y 10/00
USPC .......................... 257/347; 438/282, 283, 284
See application file for complete search history.

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 11,251,284 | B2 * | 2/2022 | Lin | H10D 84/0151 |
| 2019/0393324 | A1 * | 12/2019 | Chen | H10D 64/017 |
| 2021/0265508 | A1 * | 8/2021 | Chiang | H10D 30/014 |
| 2021/0343600 | A1 * | 11/2021 | Chen | H10D 64/017 |
| 2021/0366908 | A1 * | 11/2021 | Pan | H10D 30/6211 |

* cited by examiner

SEMICONDUCTOR STRUCTURE AND METHOD FOR FORMING THE SAME

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 2A-2, 2B-2, 2C-2, 2D-2, 2E-2, 2F-2, 2G-2 and 2H-2 illustrate cross-sectional representations of various stages of manufacturing the semiconductor structure shown along line B-B' in FIG. 1C, in accordance with some embodiments.

FIGS. 2A-3, 2B-3, 2C-3, 2D-3, 2E-3, 2F-3, 2G-3 and 2H-3 illustrate cross-sectional representations of various stages of manufacturing the semiconductor structure shown along line C-C' in FIG. 1C, in accordance with some embodiments.

FIGS. 2A-4, 2B-4, 2C-4, 2D-4, 2E-4, 2F-4, 2G-4 and 2H-4 illustrate cross-sectional representations of various stages of manufacturing the semiconductor structure shown along line D-D' in FIG. 1C, in accordance with some embodiments.

FIGS. 2A-5, 2B-5, 2C-5, 2D-5, 2E-5, 2F-5, 2G-5 and 2H-5 illustrate cross-sectional representations of various stages of manufacturing the semiconductor structure shown along line E-E' in FIG. 1C, in accordance with some embodiments.

FIGS. 3A-1 and 3B-1 illustrate cross-sectional representations of various stages of manufacturing a semiconductor structure shown along line A-A' in FIG. 1B, in accordance with some embodiments.

FIGS. 3A-2 and 3B-2 illustrate cross-sectional representations of various stages of manufacturing the semiconductor structure shown along line B-B' in FIG. 1B, in accordance with some embodiments.

FIGS. 3A-3 and 3B-3 illustrate cross-sectional representations of various stages of manufacturing the semiconductor structure shown along line C-C' in FIG. 1B, in accordance with some embodiments.

FIG. 3B-4 illustrates a cross-sectional representation of a manufacturing stage of the semiconductor structure shown along line D-D' in FIG. 1C, in accordance with some embodiments.

FIG. 3B-5 illustrates a cross-sectional representation of a manufacturing stage of the semiconductor structure shown along line E-E' in FIG. 1C, in accordance with some embodiments.

FIGS. 4A-1, 4B-1, 4C-1 and 4D-1 illustrate cross-sectional representations of various stages of manufacturing a semiconductor structure shown along line A-A' in FIG. 1C, in accordance with some embodiments.

FIGS. 4A-2, 4B-2, 4C-2 and 4D-2 illustrate cross-sectional representations of various stages of manufacturing the semiconductor structure shown along line B-B' in FIG. 1C, in accordance with some embodiments.

FIGS. 4A-3, 4B-3, 4C-3 and 4D-3 illustrate cross-sectional representations of various stages of manufacturing the semiconductor structure shown along line C-C' in FIG. 1C, in accordance with some embodiments.

FIGS. 4A-4, 4B-4, 4C-4 and 4D-4 illustrate cross-sectional representations of various stages of manufacturing the semiconductor structure shown along line D-D' in FIG. 1C, in accordance with some embodiments.

FIGS. 4A-5, 4B-5, 4C-5 and 4D-5 illustrate cross-sectional representations of various stages of manufacturing the semiconductor structure shown along line E-E' in FIG. 1C, in accordance with some embodiments.

FIGS. 5A-1 and 5B-1 illustrate cross-sectional representations of various stages of manufacturing a semiconductor structure shown along line A-A' in FIG. 1C, in accordance with some embodiments.

FIGS. 5A-2 and 5B-2 illustrate cross-sectional representations of various stages of manufacturing the semiconductor structure shown along line B-B' in FIG. 1C, in accordance with some embodiments.

FIGS. 5A-3 and 5B-3 illustrate cross-sectional representations of various stages of manufacturing the semiconductor structure shown along line C-C' in FIG. 1C, in accordance with some embodiments.

FIGS. 5A-4 and 5B-4 illustrate cross-sectional representations of various stages of manufacturing the semiconductor structure shown along line D-D' in FIG. 1C, in accordance with some embodiments.

FIGS. 5A-5 and 5B-5 illustrate cross-sectional representations of various stages of manufacturing the semiconductor structure shown along line E-E' in FIG. 1C, in accordance with some embodiments.

FIGS. 6A-1, 6B-1, 6C-1, 6D-1 and 6E-1 illustrate cross-sectional representations of various stages of manufacturing a semiconductor structure shown along line A-A' in FIG. 1C, in accordance with some embodiments.

FIGS. 6A-2, 6B-2, 6C-2, 6D-2 and 6E-2 illustrate cross-sectional representations of various stages of manufacturing the semiconductor structure shown along line B-B' in FIG. 1C, in accordance with some embodiments.

FIGS. 6A-3, 6B-3, 6C-3, 6D-3 and 6E-3 illustrate cross-sectional representations of various stages of manufacturing the semiconductor structure shown along line C-C' in FIG. 1C, in accordance with some embodiments.

FIGS. 6A-4, 6B-4, 6C-4, 6D-4 and 6E-4 illustrate cross-sectional representations of various stages of manufacturing the semiconductor structure shown along line D-D' in FIG. 1C, in accordance with some embodiments.

FIGS. 6A-5, 6B-5, 6C-5, 6D-5 and 6E-5 illustrate cross-sectional representations of various stages of manufacturing the semiconductor structure shown along line E-E' in FIG. 1C, in accordance with some embodiments.

FIGS. 7A-1 and 7B-1 illustrate cross-sectional representations of various stages of manufacturing a semiconductor structure shown along line A-A' in FIG. 1C, in accordance with some embodiments.

FIGS. 7A-2 and 7B-2 illustrate cross-sectional representations of various stages of manufacturing the semiconductor structure shown along line B-B' in FIG. 1C, in accordance with some embodiments.

FIGS. 7A-3 and 7B-3 illustrate cross-sectional representations of various stages of manufacturing the semiconductor structure shown along line C-C' in FIG. 1C, in accordance with some embodiments.

FIGS. 7A-4 and 7B-4 illustrate cross-sectional representations of various stages of manufacturing the semiconductor structure shown along line D-D' in FIG. 1C, in accordance with some embodiments.

FIGS. 7A-5 and 7B-5 illustrate cross-sectional representations of various stages of manufacturing the semiconductor structure shown along line E-E' in FIG. 1C, in accordance with some embodiments.

DETAILED DESCRIPTION

Figure 1A:
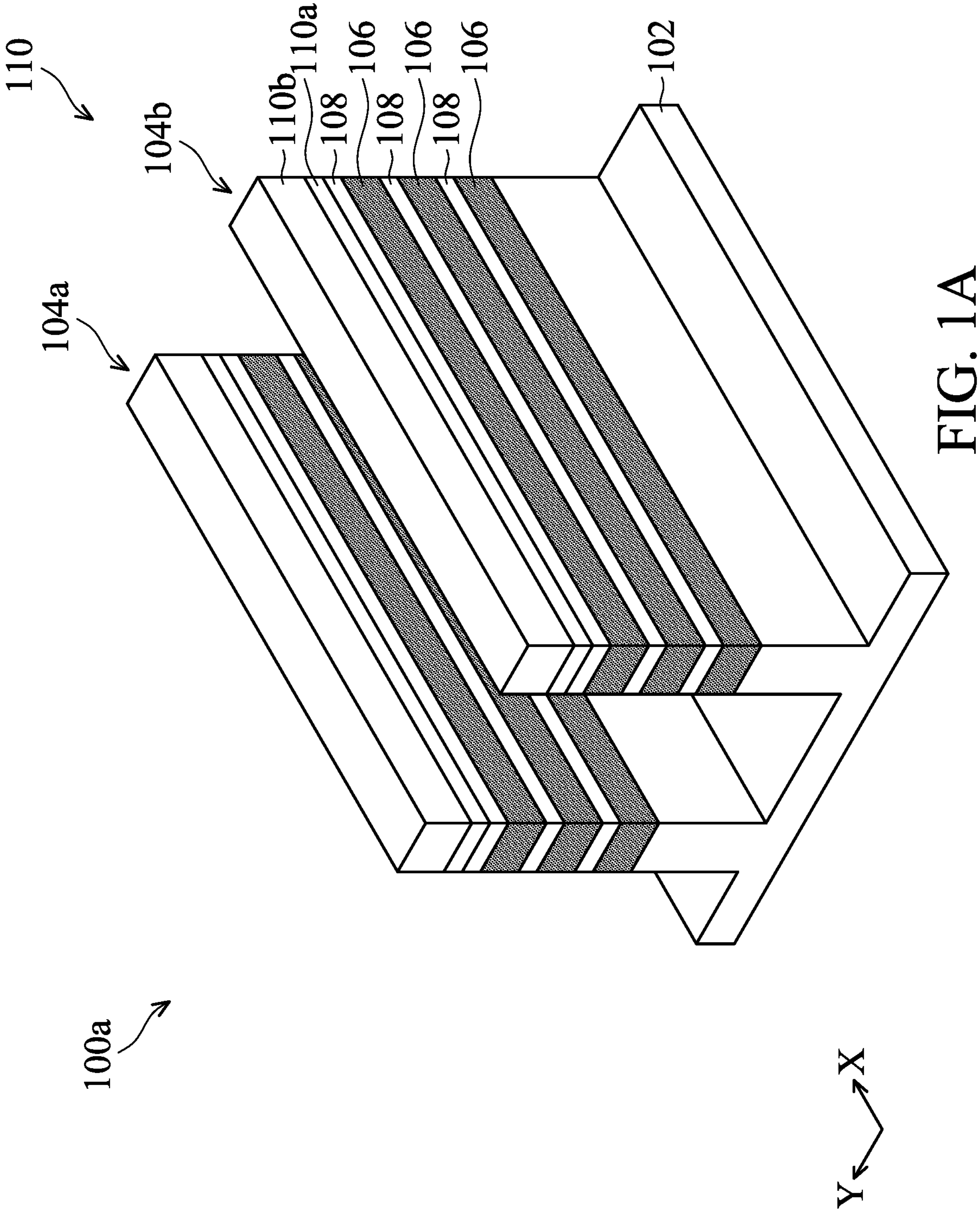
FIGS. 1A, 1B and 1C illustrate perspective views of intermediate stages of manufacturing a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The fins described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches that are smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of semiconductor structures and methods for forming the same are provided. The semiconductor structures may include a first fin structure and a second fin structure formed over a substrate. The first fin structure includes first nanostructures, and the second fin structure includes second nanostructures along a first direction (e.g. x-axis). A first gate structure and a second gate structure formed over the first nanostructures and the second nanostructures. An S/D structure is formed adjacent to the first gate structure. The isolation material is formed between the first fin structure and the second fin structure. The top surface of the isolation material, the top surface of the first nanostructures, and the top surface of the second nanostructures form a planar surface. The dummy gate structure is formed on the planar top surface. After the dummy gate structure is removed, and portion of the isolation material is removed. The portion of the isolation material is removed to form the isolation structure, and the remaining portion of the isolation material forms a dielectric wall. The dielectric wall is between the first nanostructures and the second nanostructures. The dielectric wall extends from a first position, through a second position, to a third position. The first position is directly below the first gate structure, the second position is between two adjacent S/D structures, and the third position is directly below the second gate structure. The dielectric wall is made of low-k dielectric material to reduce the capacitance of the semiconductor structure. This helps improve the performance of the semiconductor structure. The source/drain (S/D) structure or region(s) may refer to a source or a drain, individually or collectively dependent upon the context.

Figure 1B:
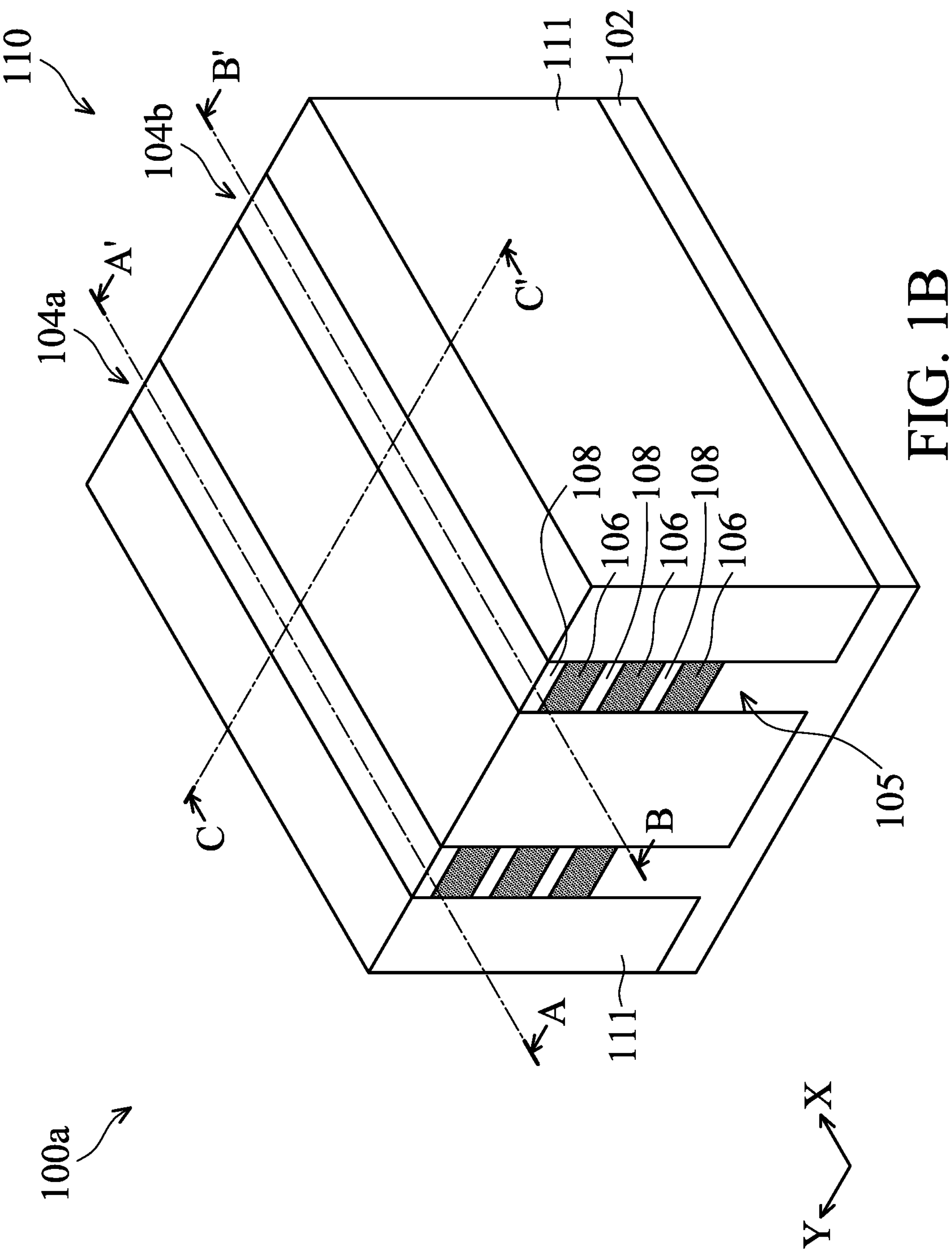
Figure 1C:
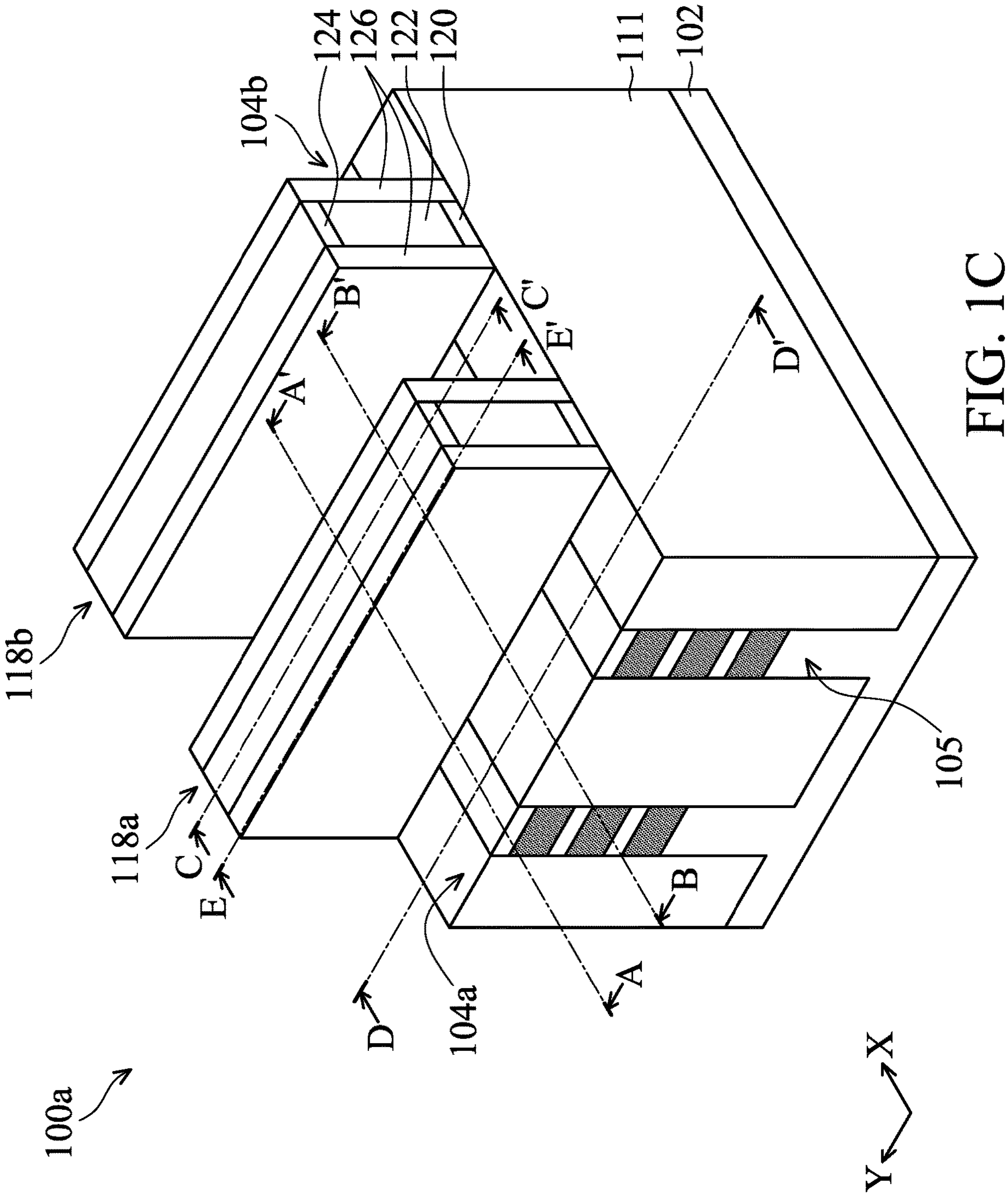

FIGS. 1A to 1C illustrate perspective views of intermediate stages of manufacturing a semiconductor structure 100*a*, in accordance with some embodiments. As shown in FIG. 1A, first semiconductor material layers 106 and second semiconductor material layers 108 are formed over a substrate 102.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide.

Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. It should be noted that although three first semiconductor material layers 106 and three second semiconductor material layers 108 are formed, the semiconductor structure may include more or fewer first semiconductor material layers 106 and second semiconductor material layers 108. For example, the semiconductor structure may include two to five of the first semiconductor material layers 106 and the second semiconductor material layers.

The first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

Afterwards, after the first semiconductor material layers 106 and the second semiconductor material layers 108 are formed as a semiconductor material stack over the substrate 102, the semiconductor material stack is patterned to form a first fin structure 104*a* and a second fin structure 104*b*, in accordance with some embodiments. In some embodiments, each of the first fin structure 104*a* and a second fin structure 104*b* includes a base fin structure 105 and the semiconductor material stack of the first semiconductor material layers 106 and the second semiconductor material layers 108.

In some embodiments, the patterning process includes forming a mask structure 110 over the semiconductor material stack, and etching the semiconductor material stack and the underlying substrate 102 through the mask structure 110. In some embodiments, the mask structure 110 is a multilayer structure including a pad oxide layer 110*a* and a nitride layer 110*b* formed over the pad oxide layer 110*a*. The pad oxide layer 110*a* may be made of silicon oxide, which is formed by thermal oxidation or chemical vapor deposition (CVD), and the nitride layer 110*b* may be made of silicon nitride, which is formed by chemical vapor deposition (CVD), such as low-temperature chemical vapor deposition (LPCVD) or plasma-enhanced CVD (PECVD).

Next, as shown in FIG. 1B, after the first fin structure 104*a* and the second fin structure 104*b* is formed, an isolation material 111 is formed around first fin structure 104*a* and the second fin structure 104*b*, in accordance with some embodiments. Next, a portion of the isolation material 111 and the mask structure 110 are removed by a planarization process such as CMP process.

The isolation material 111 is made of low-k dielectric material with dielectric constant (K value) in a range from about 1 to about 5. In some embodiments, the isolation material 111 is made of silicon oxide, silicon nitride, silicon oxynitride (SiON), another applicable insulating material, or a combination thereof. In some embodiments, the isolation material 111 is formed by a LPCVD process, plasma enhanced CVD (PECVD) process, high density plasma CVD (HDP-CVD) process, high aspect ratio process (HARP) process, flowable CVD (FCVD) process, atomic layer deposition (ALD) process, another suitable method, or a combination thereof.

Afterwards, as shown in FIG. 1C, the first dummy gate structures 118*a* and second dummy gate structures 118*b* are formed over the first fin structure 104*a* and the second fin structure 104*b* and over the isolation material 111, in accordance with some embodiments. The first dummy gate structures 118*a* and the second dummy gate structures 118*b* may be used to define the source/drain (S/D) regions and the channel regions of the resulting semiconductor structure 100*a*.

The top surface of the isolation material 111 is substantially coplanar with the top surface of the first fin structure 104*a* and the top surface of the second fin structure 104*b* before forming the first dummy gate structures 118*a* and second dummy gate structures 118*b*. The isolation material 111, the first fin structure 104*a*, and the second fin structure 104*b* forms a planar top surface, and the first dummy gate structure 118*a* and the second dummy gate structure 118*b* are formed on the planar top surface. Since the planar top surface is formed before forming the first dummy gate structure 118*a* and the second dummy gate structure 118*b*, the risk of collapse issue of the first dummy gate structure 118*a* and the second dummy gate structure 118*b* can be reduced.

The isolation material 111 extends from a first position to a second position along the first direction (e.g. x-axis), the first position is directly below the first dummy gate structure 118*a*, and the second position is between two adjacent S/D structures 136 (formed later) at the S/D region. In addition, the dielectric wall 111 further extends to a third portion, and the third position is directly below the second dummy gate structure 118*b*.

In some embodiments, each of the first dummy gate structures 118*a* and each of the second dummy gate structures 118*b* includes dummy gate dielectric layers 120 and dummy gate electrode layers 122. In some embodiments, the dummy gate dielectric layers 120 are made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layers 120 are formed using thermal oxidation, chemical vapor deposition (CVD), atomic vapor deposition (ALD), physical vapor deposition (PVD), another suitable method, or a combination thereof.

In some embodiments, the conductive material includes polycrystalline-silicon (poly-Si), poly-crystalline silicon-germanium (poly-SiGe), metallic nitrides, metallic silicides, metals, or a combination thereof. In some embodiments, the dummy gate electrode layers 122 are formed using chemical vapor deposition (CVD), physical vapor deposition (PVD), or a combination thereof.

In some embodiments, hard mask layers 124 are formed over the dummy gate structures 118. In some embodiments, the hard mask layers 124 include multiple layers, such as an oxide layer and a nitride layer. In some embodiments, the oxide layer is silicon oxide, and the nitride layer is silicon nitride.

The formation of the dummy gate structures 118 may include conformally forming a dielectric material as the dummy gate dielectric layers 120. Afterwards, a conductive material may be formed over the dielectric material as the dummy gate electrode layers 122, and the hard mask layer 124 may be formed over the conductive material. Next, the dielectric material and the conductive material may be patterned through the hard mask layer 124 to form the dummy gate structures 118.

Next, after the dummy gate structures 118 are formed, gate spacer layers 126 are formed along and covering opposite sidewalls of the dummy gate structure 118, in accordance with some embodiments.

The gate spacer layers 126 may be configured to separate source/drain (S/D) structures from the first dummy gate structure 118*a*, the second dummy gate structures 118*b* and support the first dummy gate structure 118*a*, the second dummy gate structures 118*b*.

In some embodiments, the gate spacer layers 126 is made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. The formation of the gate spacer layers 126 may include conformally depositing a dielectric material covering the first dummy gate structure 118*a*, the second dummy gate structure 118*b*, the first fin structure 104*a*, the second fin structure 104*b* and the isolation structure 116 over the substrate 102, and performing an anisotropic etching process, such as dry plasma etching, to remove the dielectric layer covering the top surfaces of the first dummy gate structure 118*a*, the second dummy gate structure 118*b*, the first fin structure 104*a*, the second fin structure 104*b*, and portions of the isolation structure 116.

Figures 1, 2A:
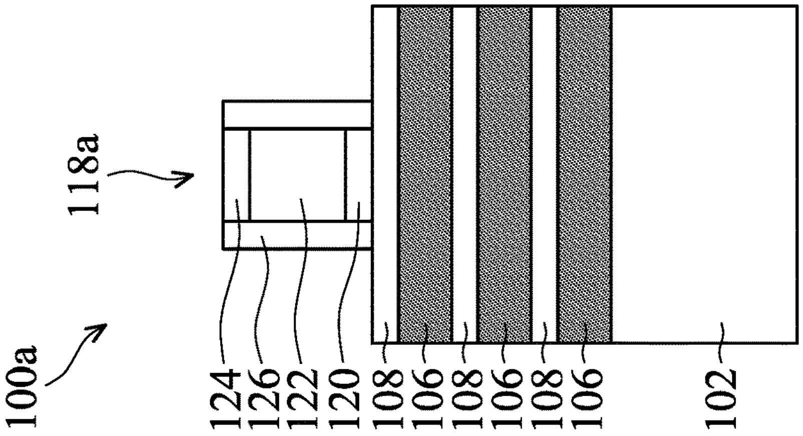
FIGS. 2A-1, 2B-1, 2C-1, 2D-1, 2E-1, 2F-1, 2G-1 and 2H-1 illustrate cross-sectional representations of various stages of manufacturing a semiconductor structure shown along line A-A' in FIG. 1C, in accordance with some embodiments.
Figures 2, 2A:
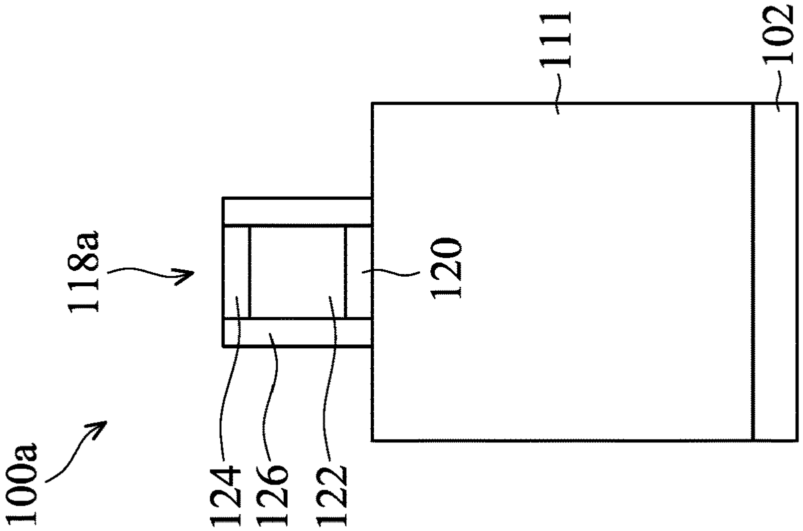
Figures 2, 2A, 3:
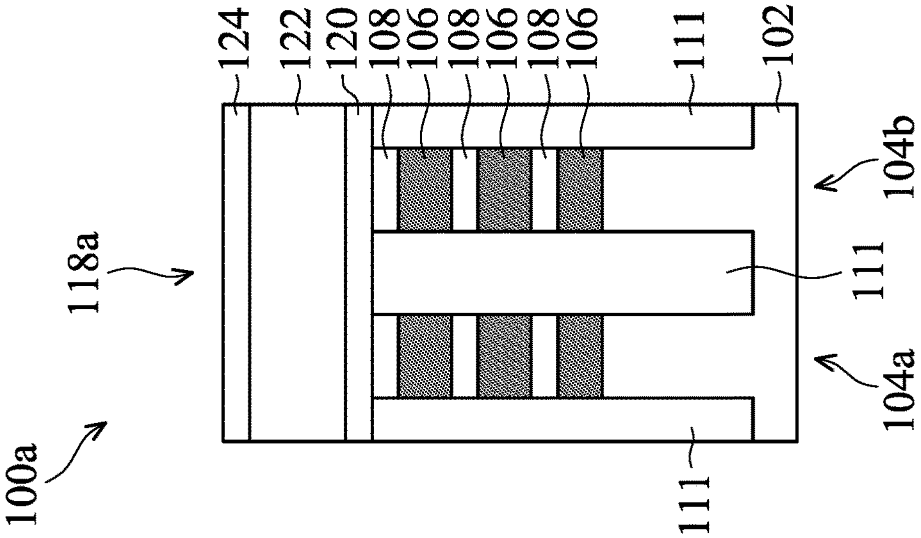
Figures 2, 2A, 3, 4:
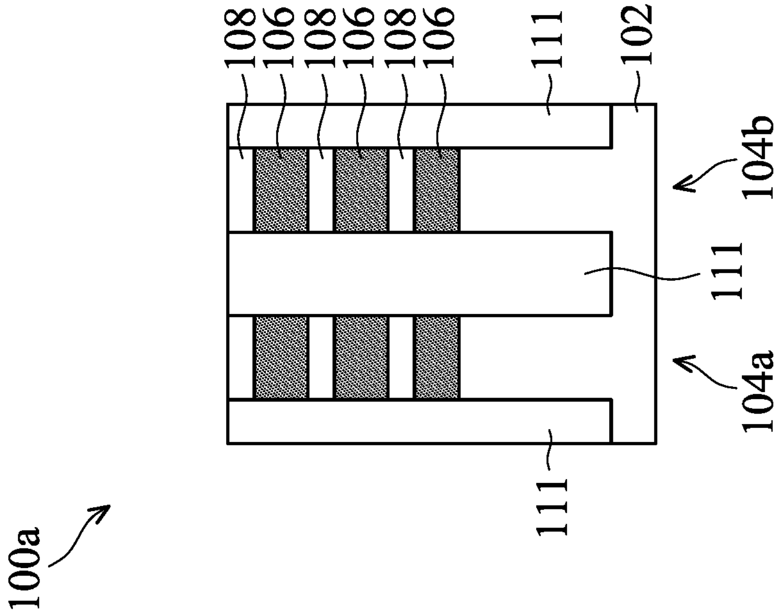
Figures 2, 2A, 3, 4, 5:
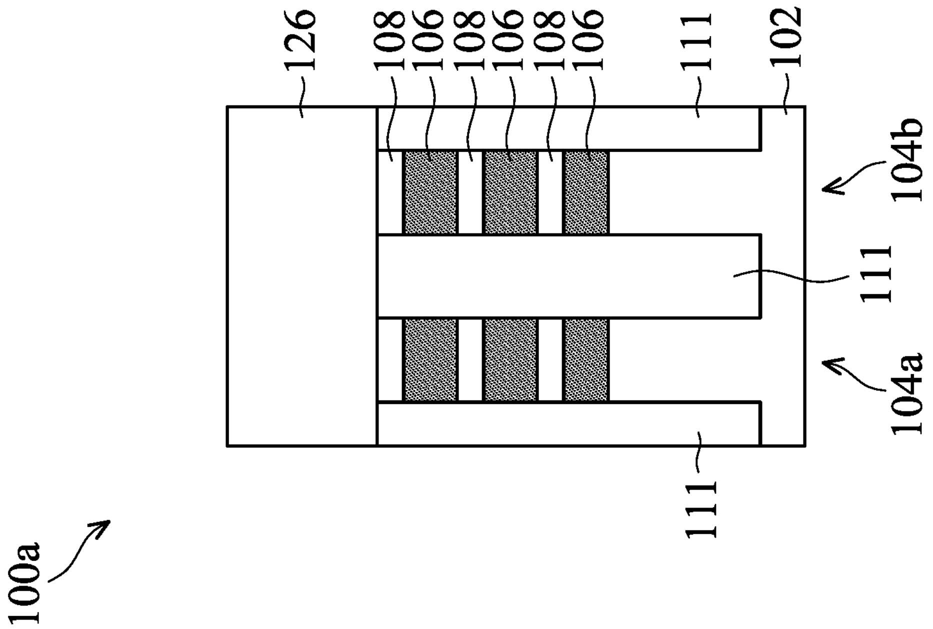
Figures 2, 2B, 3:
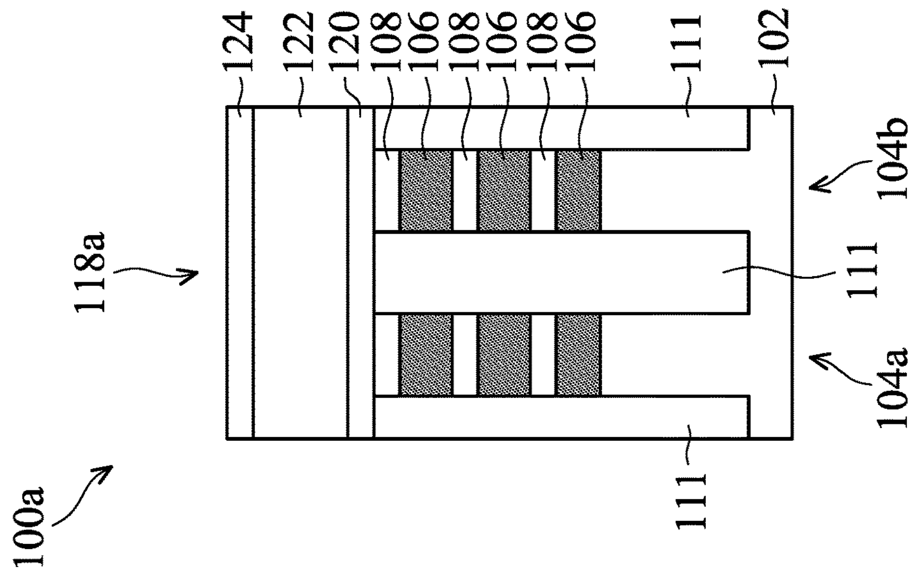
Figures 2, 2B:
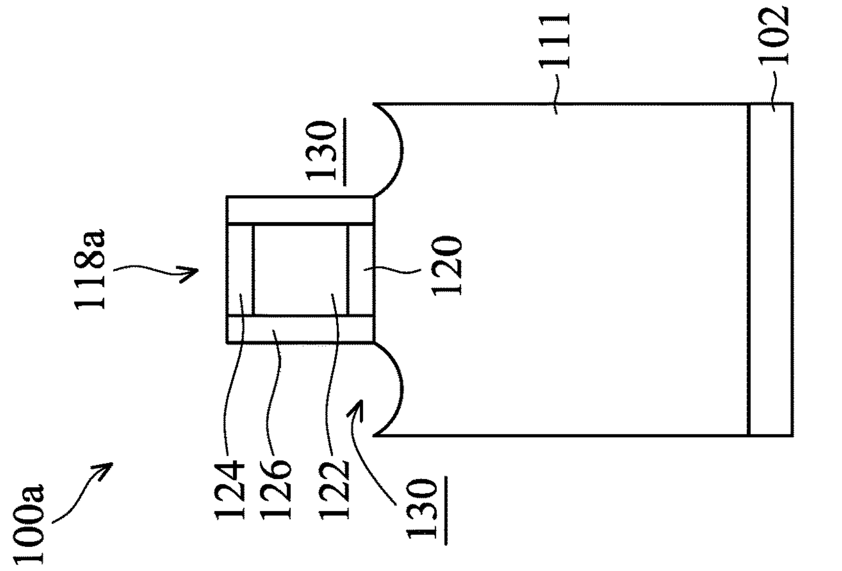
Figures 1, 2B:
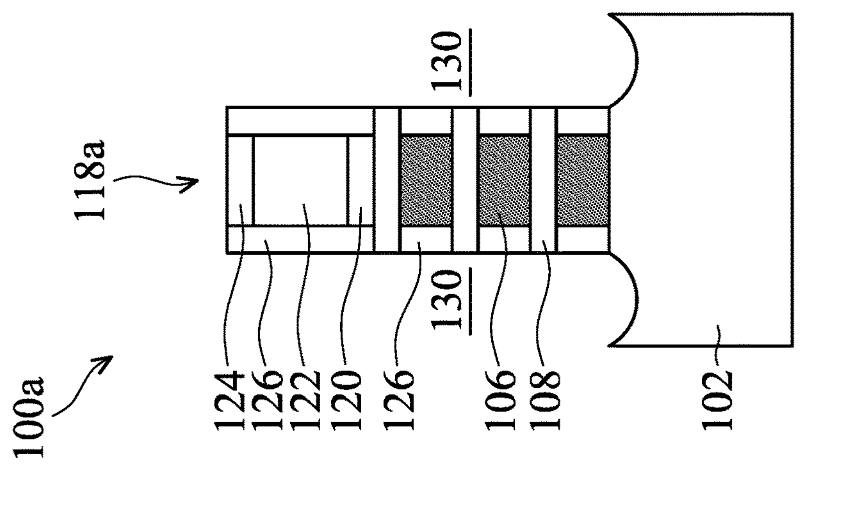
Figures 2, 2B, 3, 4, 5:
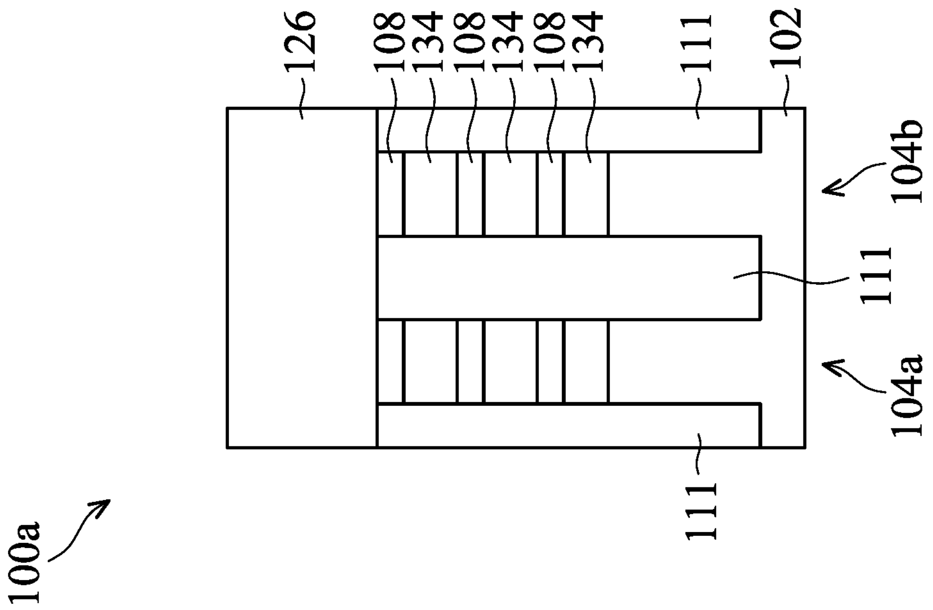
Figures 2, 2B, 3, 4:
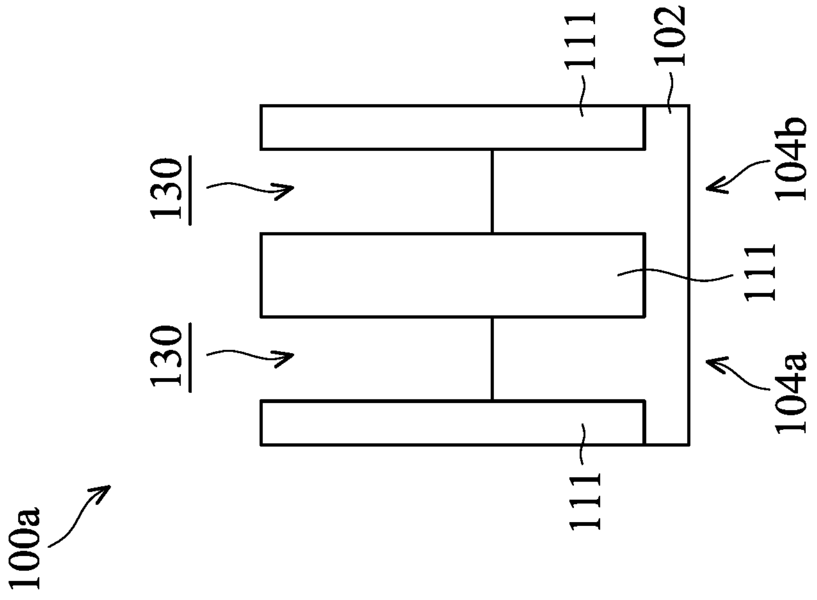
Figures 1, 2C:
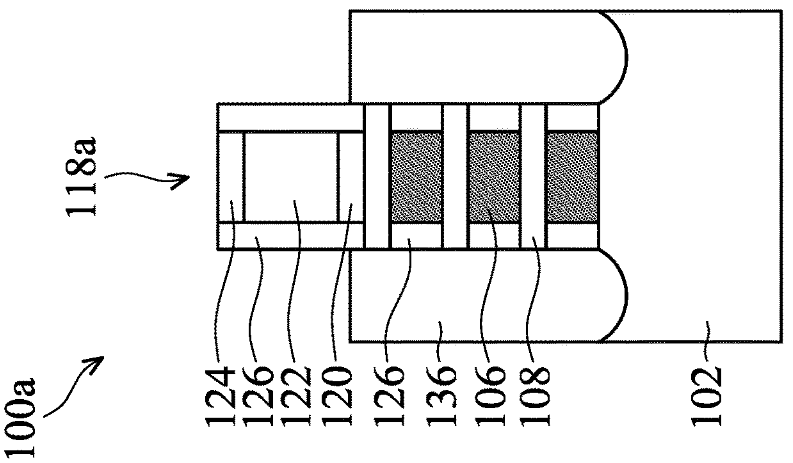
Figures 2, 2C:
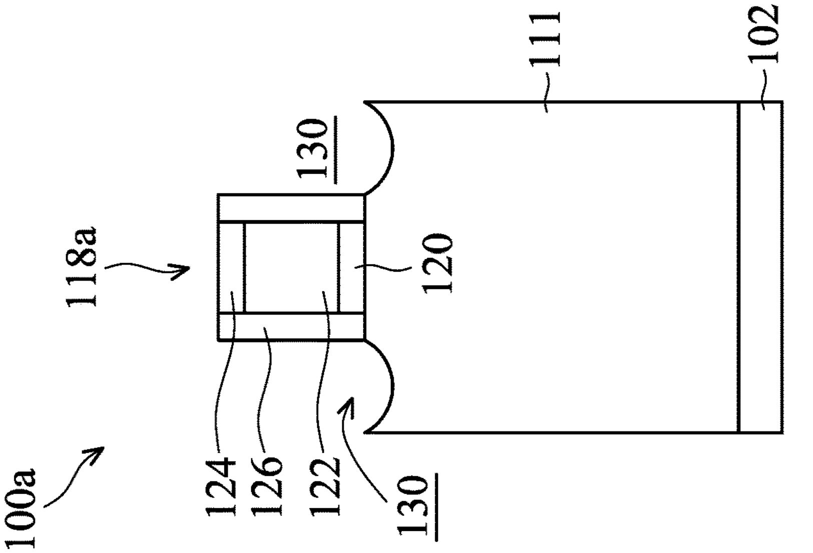
Figures 2, 2C, 3:
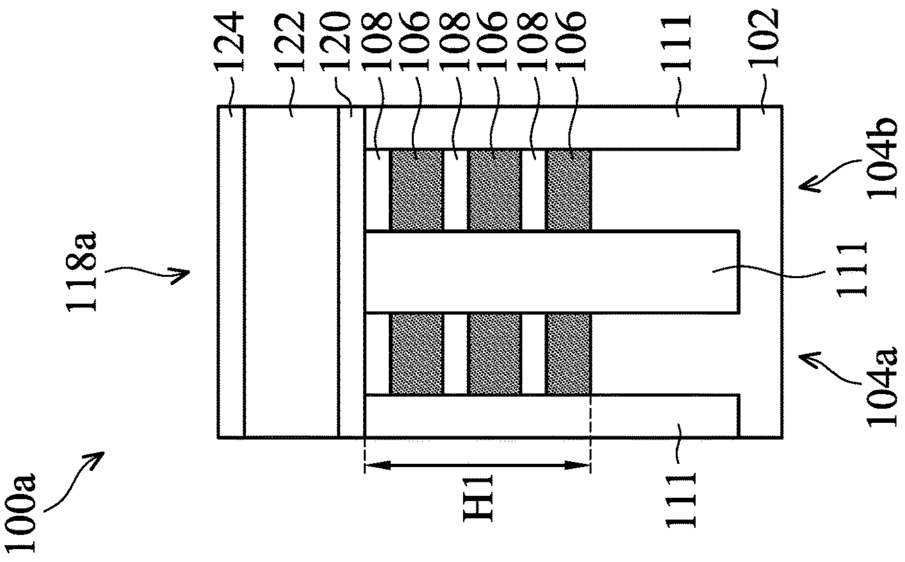
Figures 2, 2C, 3, 4, 5:
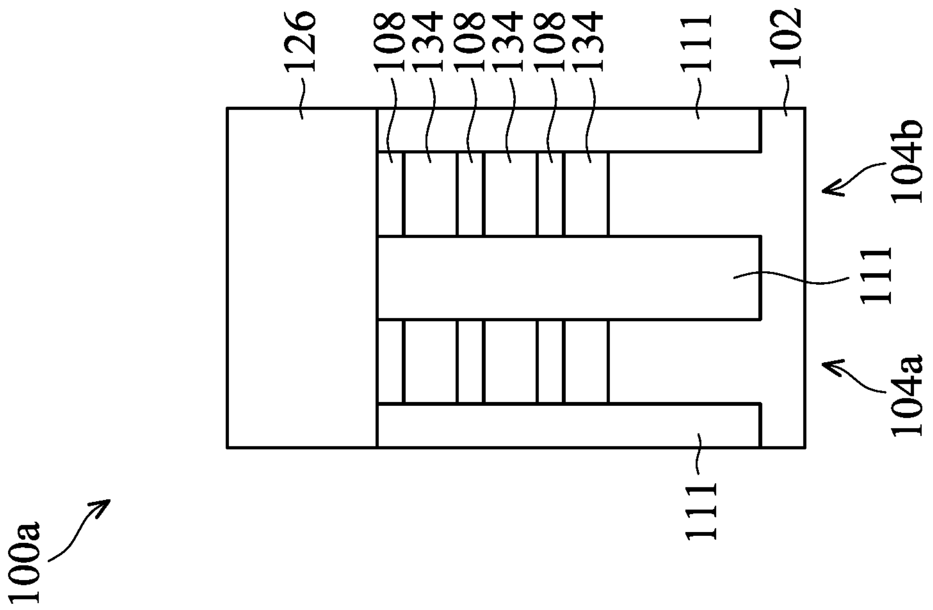
Figures 2, 2C, 3, 4:
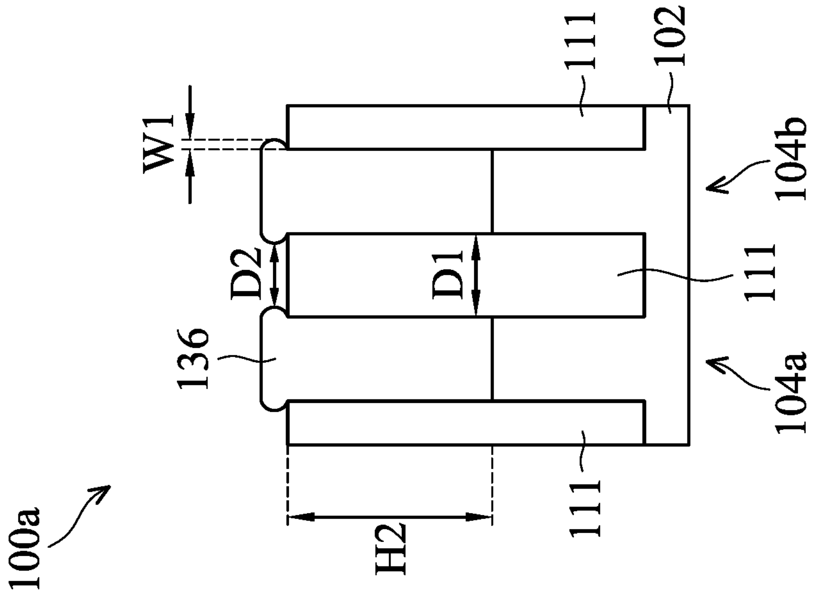
Figures 2, 2D, 3:
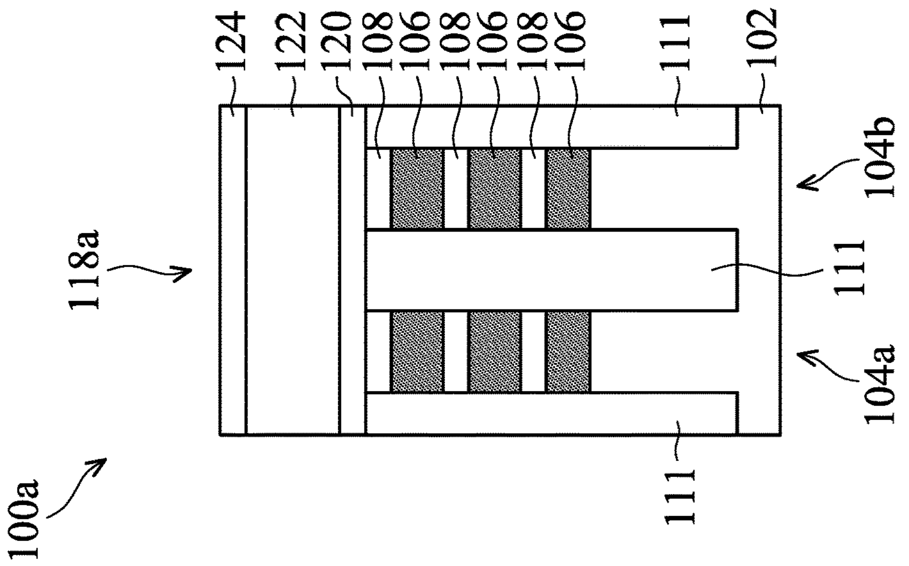
Figures 2, 2D:
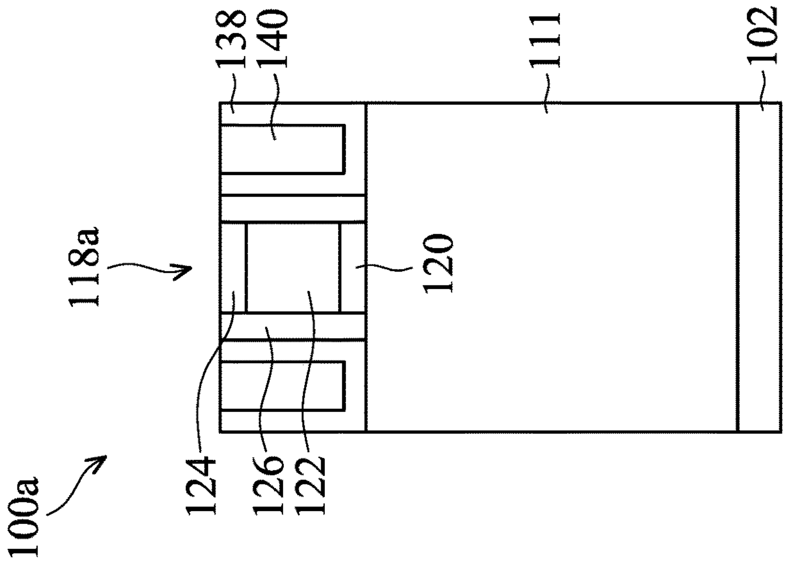
Figures 1, 2D:
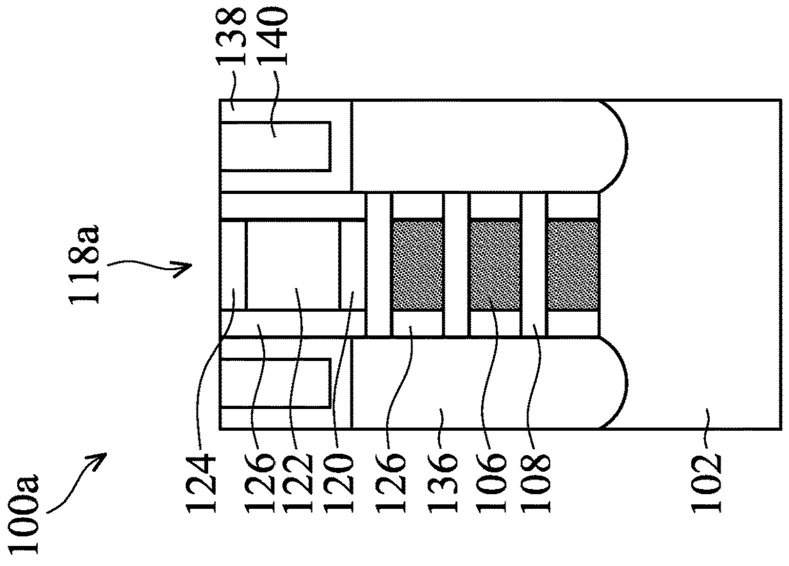
Figures 2, 2D, 3, 4:
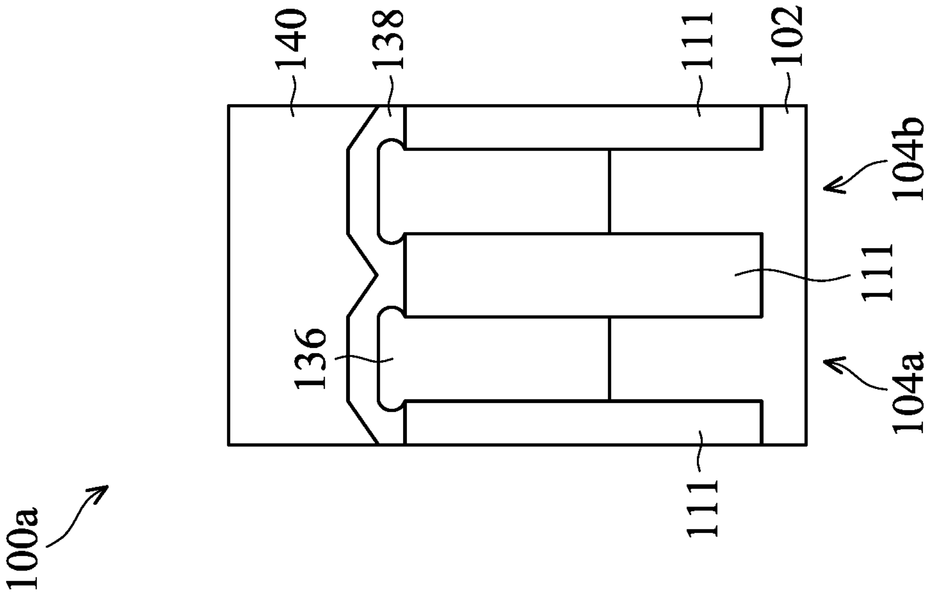
Figures 2, 2D, 3, 4, 5:
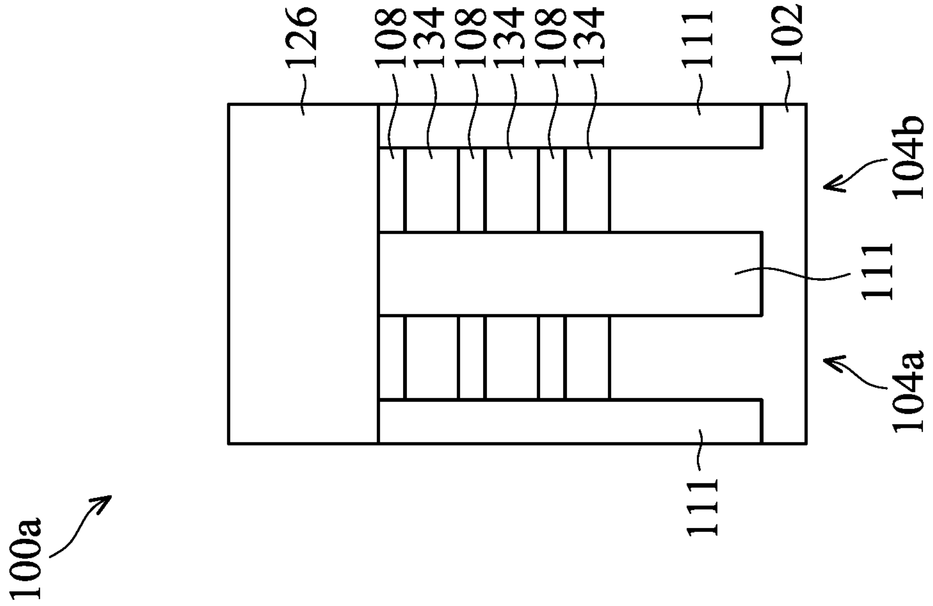
Figures 1, 2E:
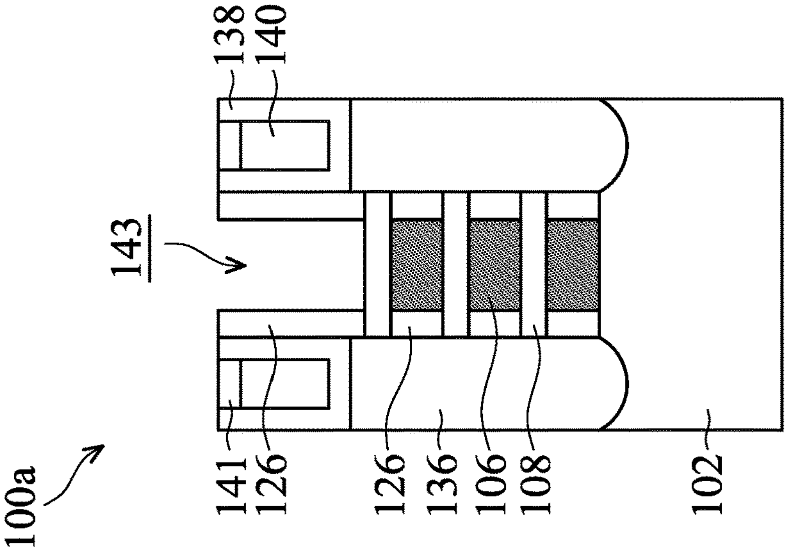
Figures 2, 2E:
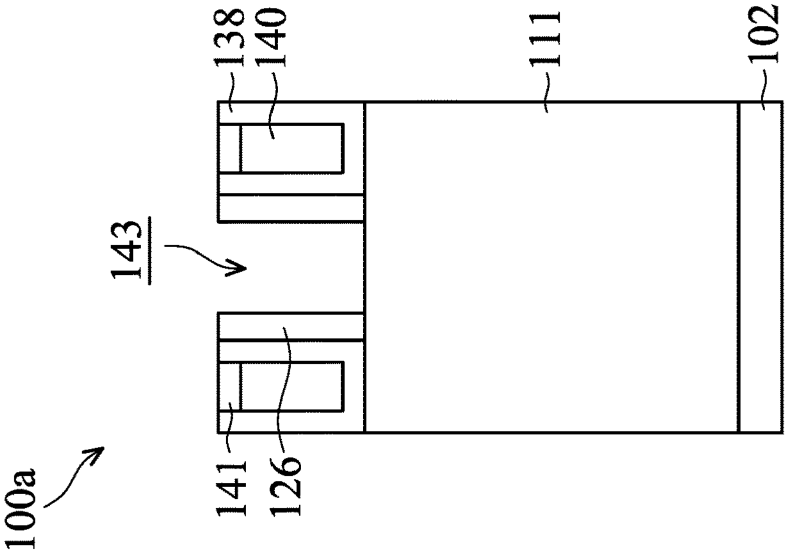
Figures 2, 2E, 3:
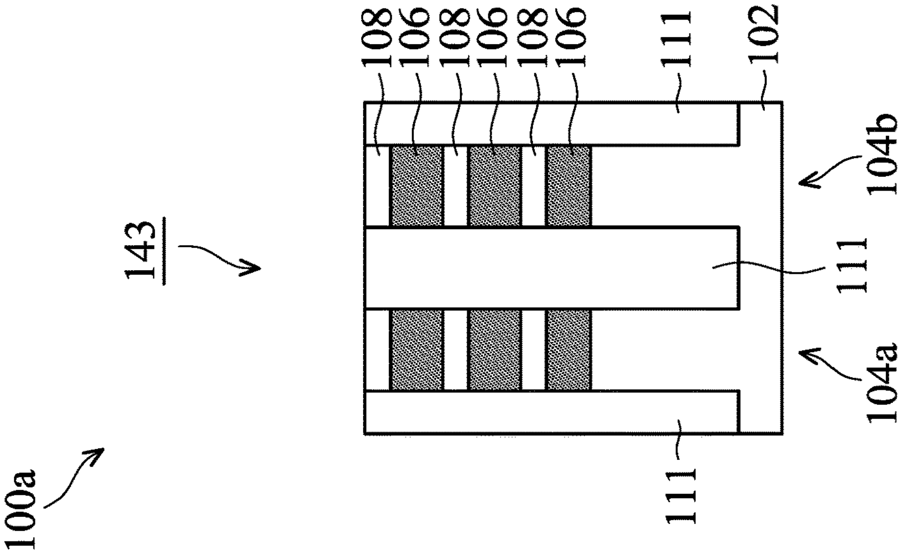
Figures 2, 2E, 3, 4, 5:
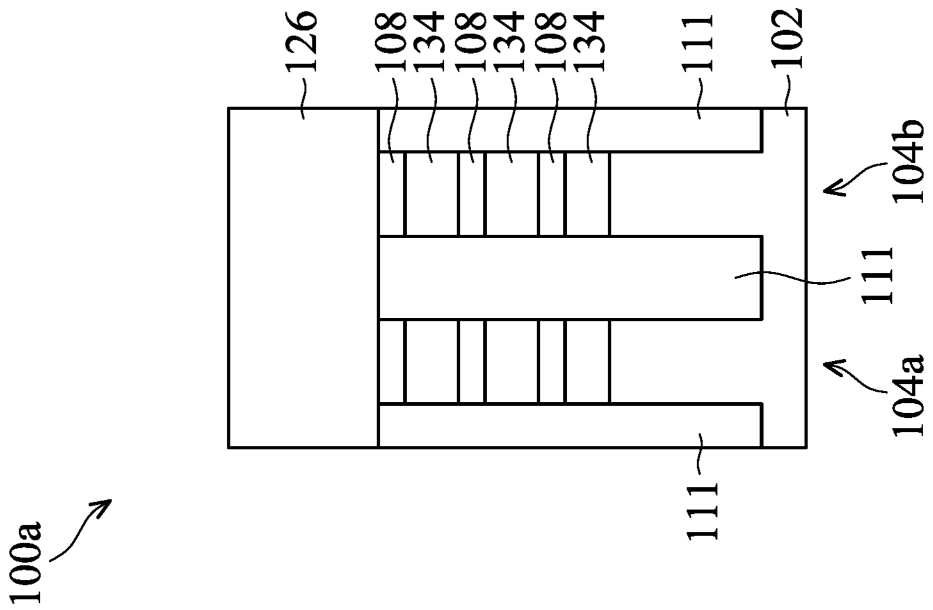
Figures 2, 2E, 3, 4:
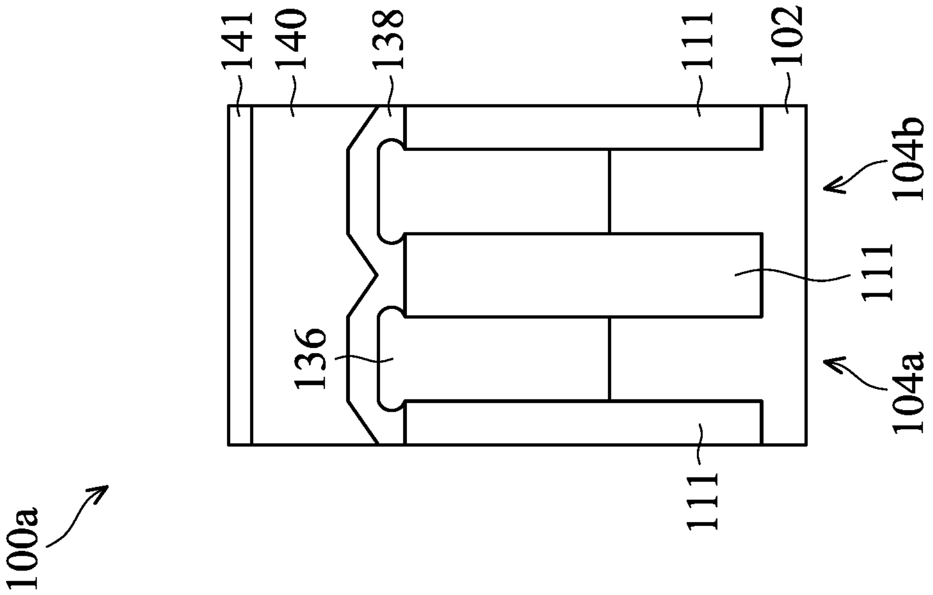
Figures 2, 2F, 3:
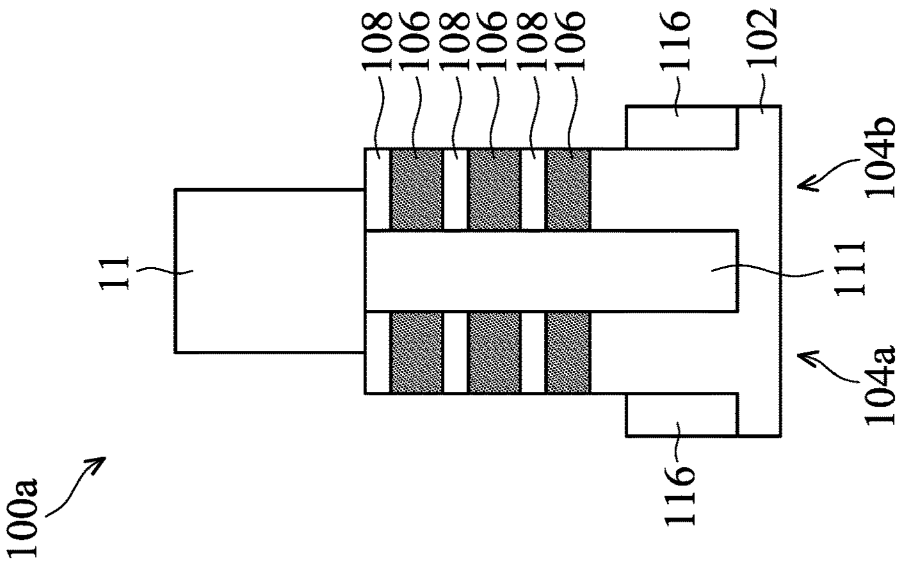
Figures 2, 2F:
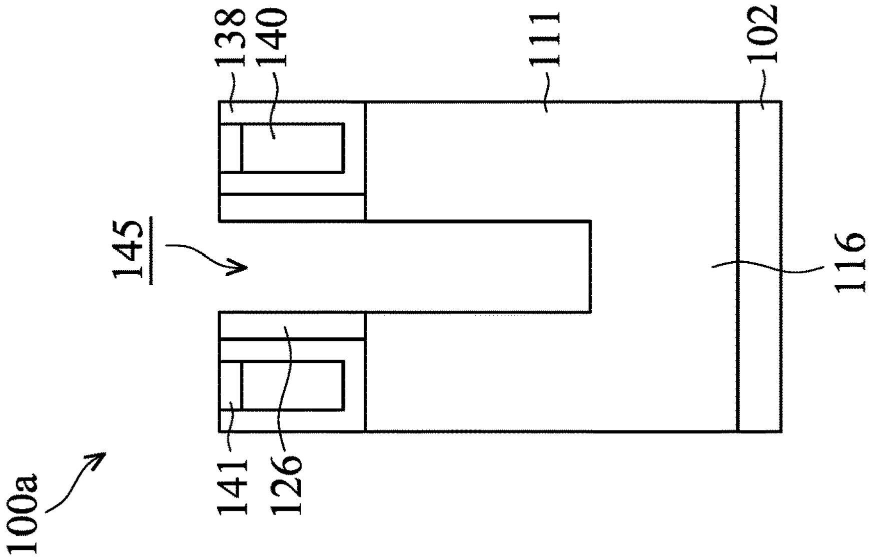
Figures 1, 2F:
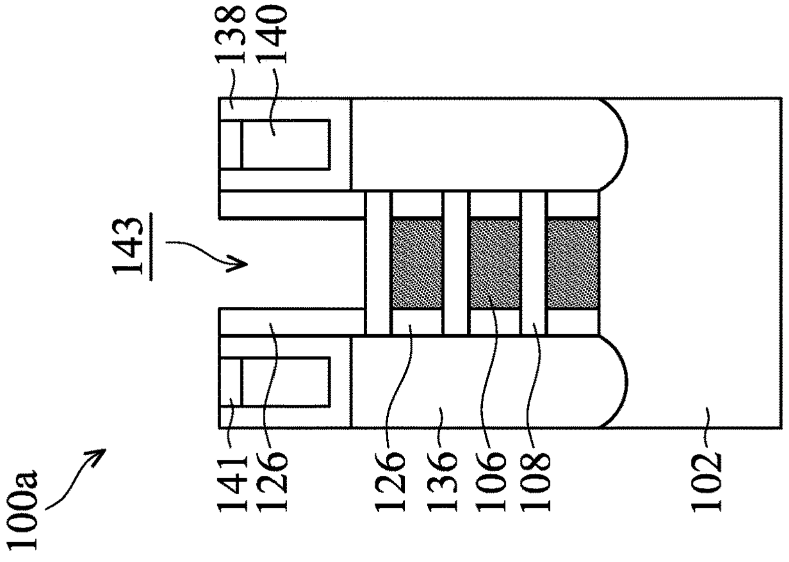
Figures 2, 2F, 3, 4:
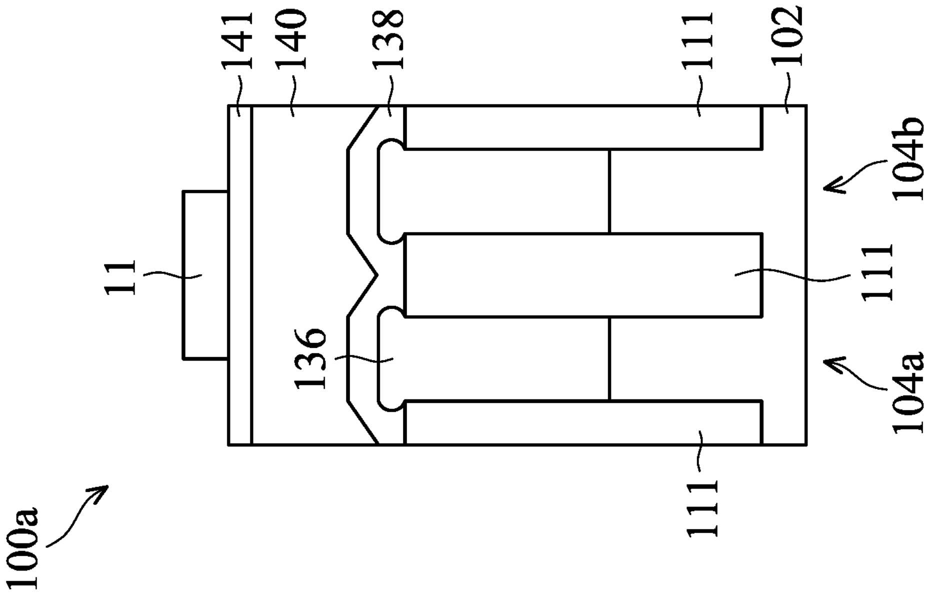
Figures 2, 2F, 3, 4, 5:
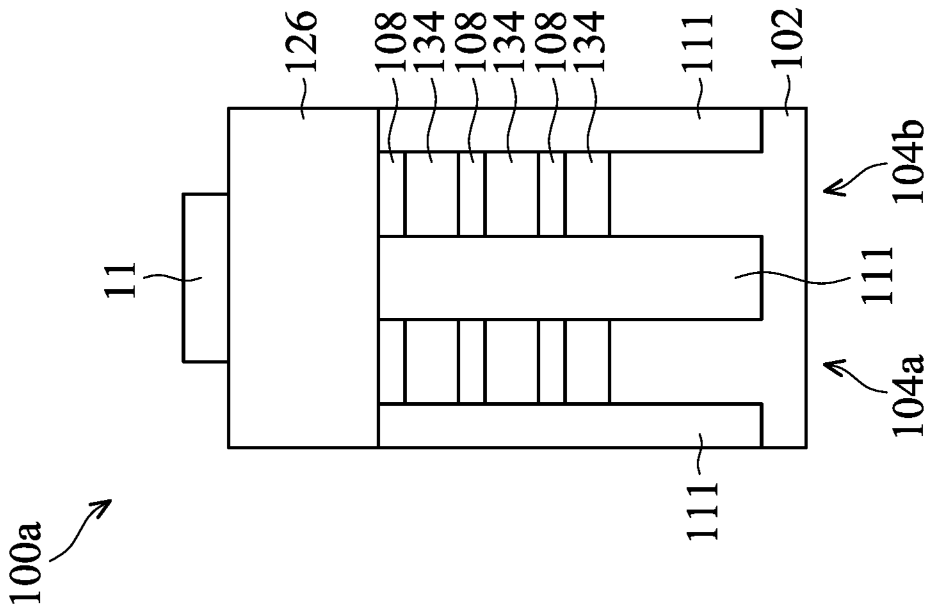
Figures 2, 2G, 3:
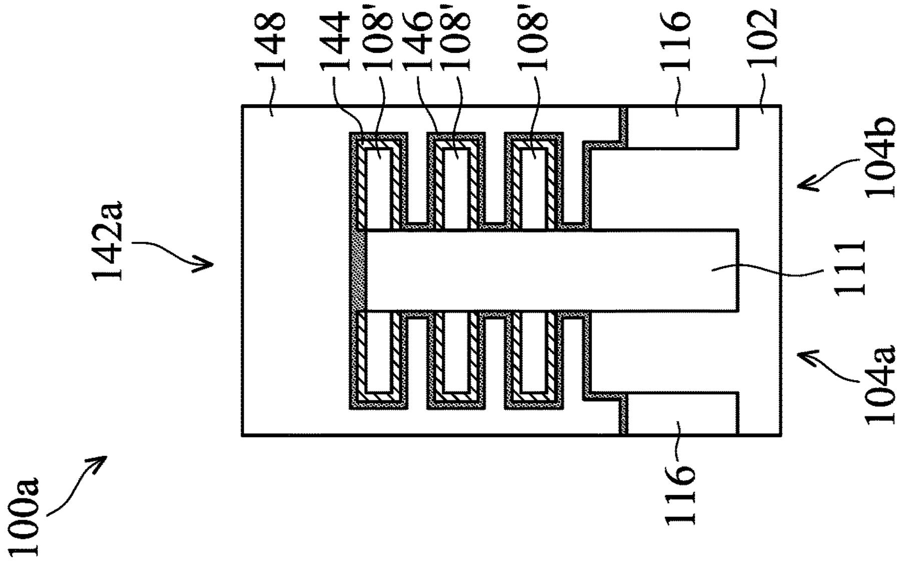
Figures 2, 2G:
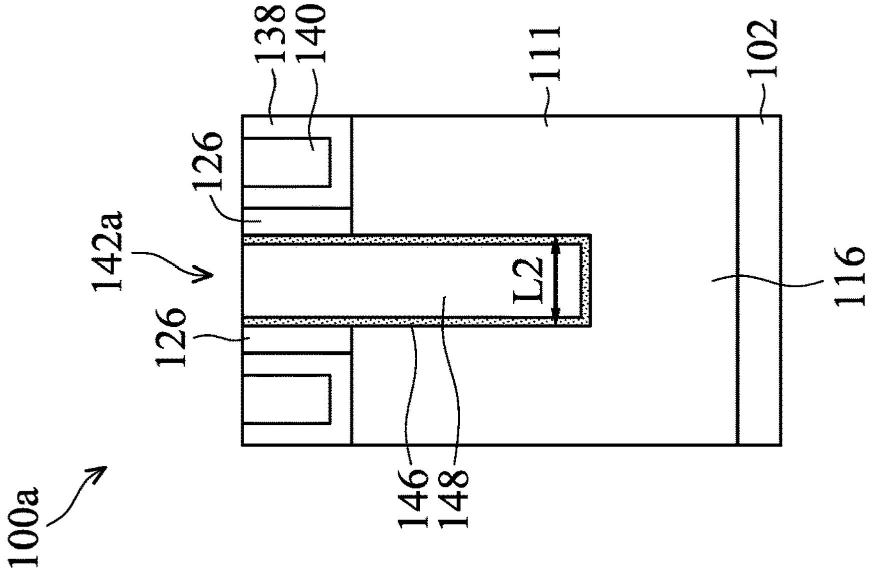
Figures 1, 2G:
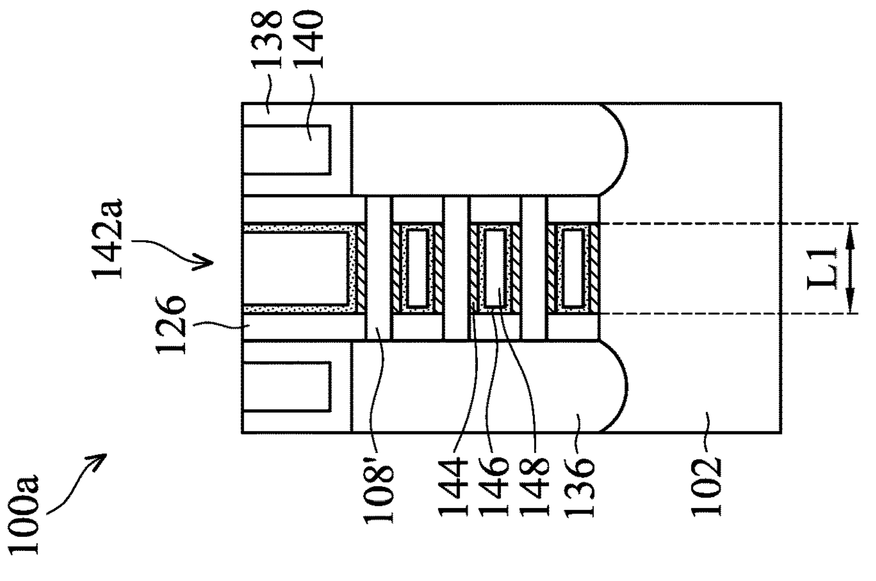
Figures 2, 2G, 3, 4:
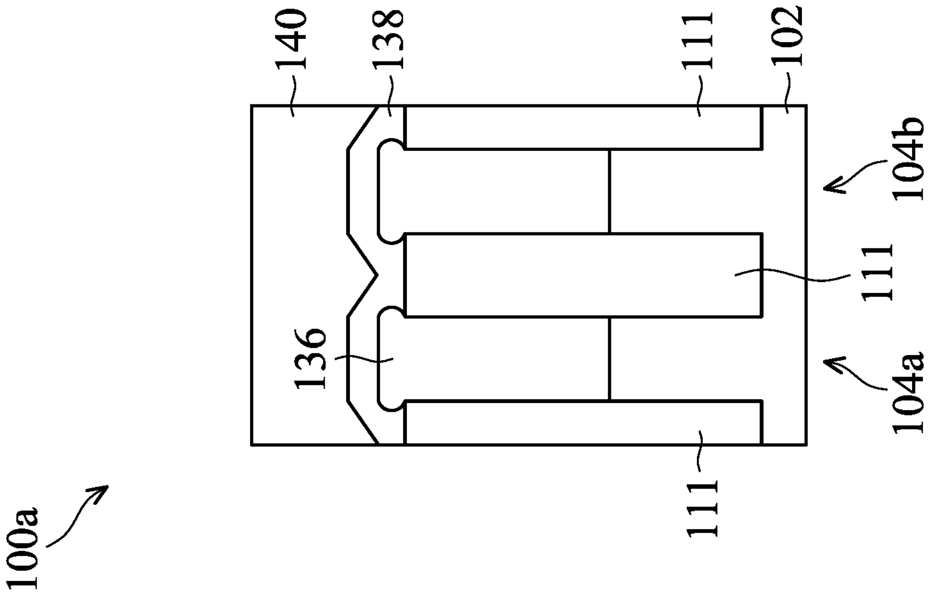
Figures 2, 2G, 3, 4, 5:
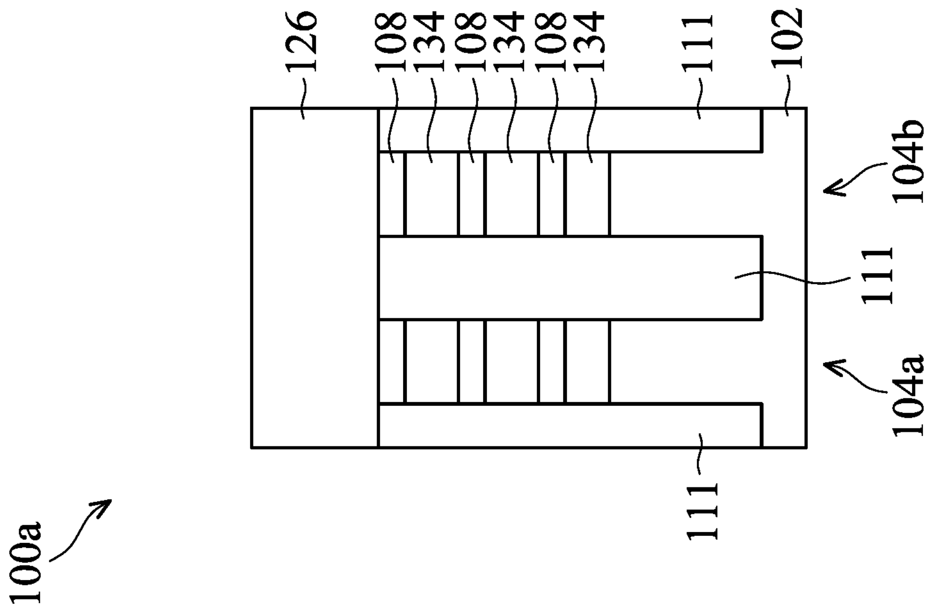
Figures 1, 2H:
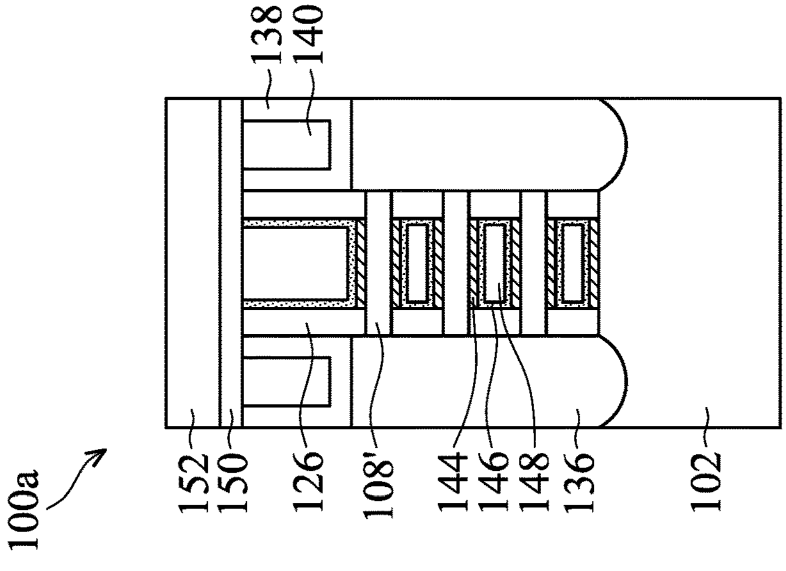
Figures 2, 2H:
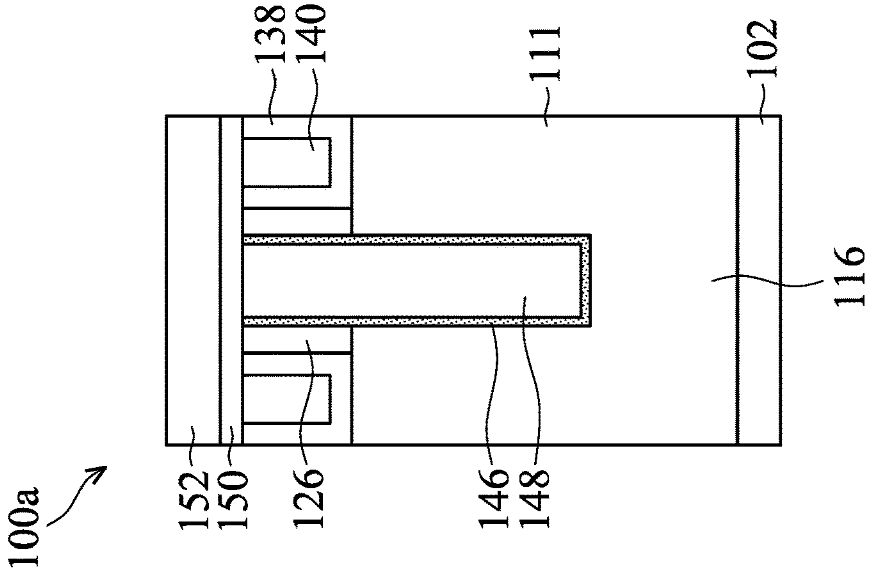
Figures 2, 2H, 3:
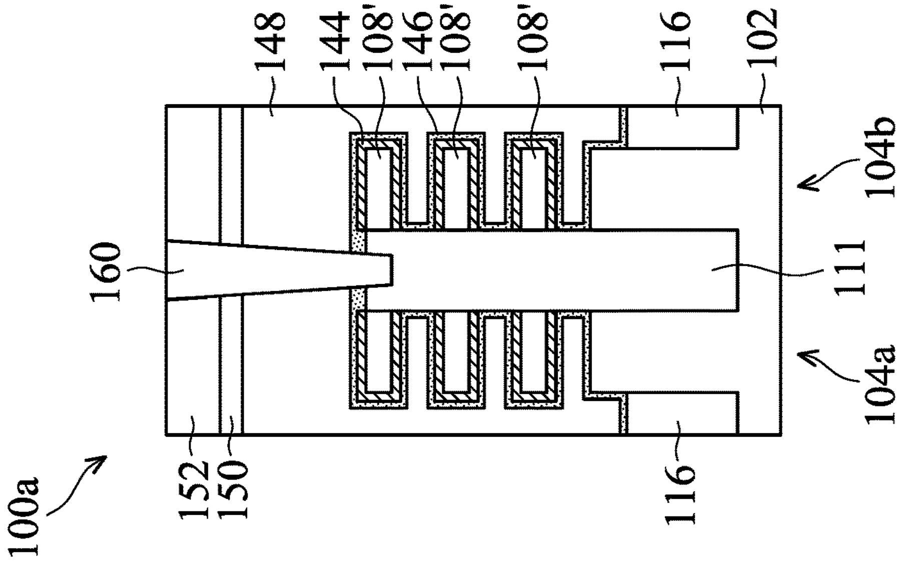
Figures 2, 2H, 3, 4, 5:
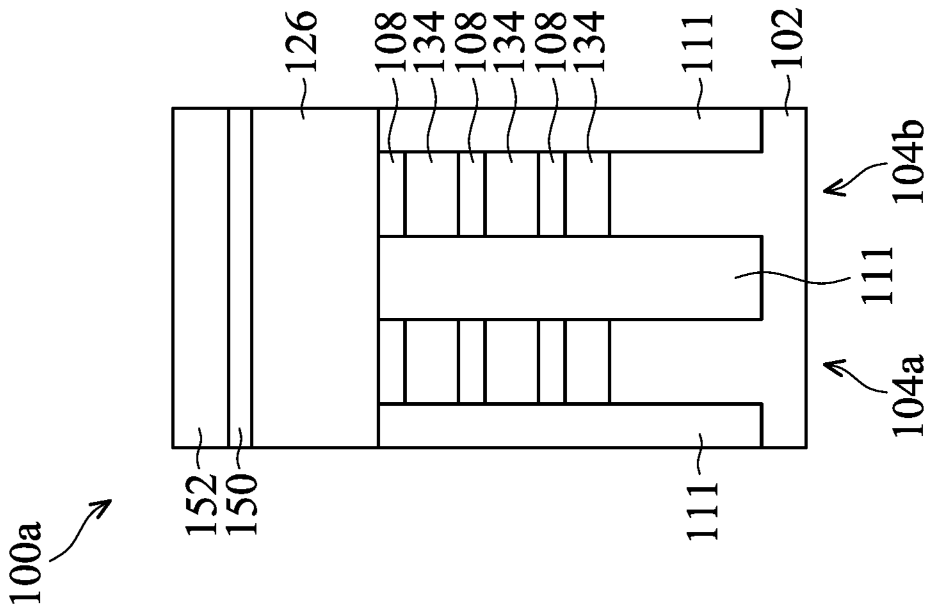
Figures 2, 2H, 3, 4:
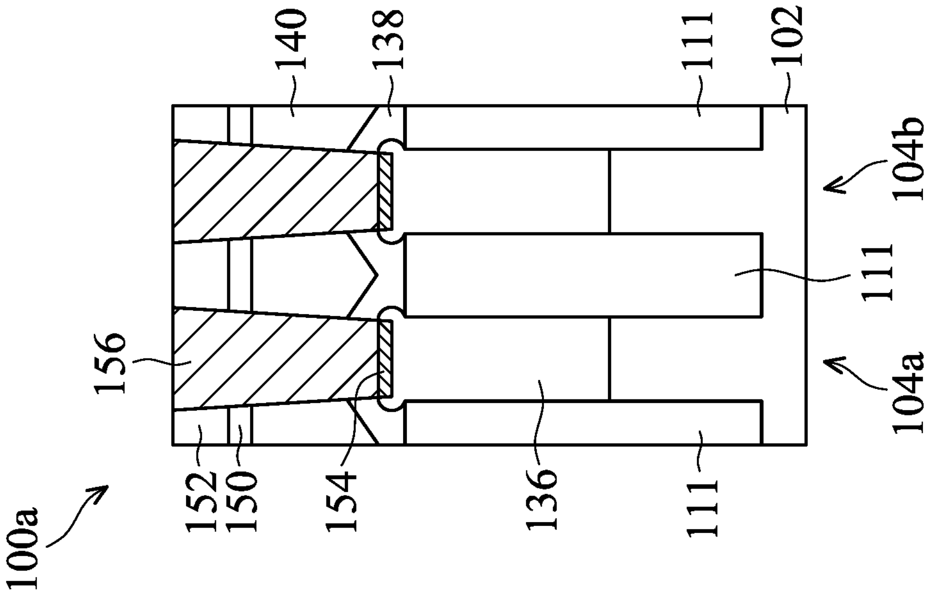

FIGS. 2A-1 to 2H-1 illustrate cross-sectional representations of various stages of manufacturing a semiconductor structure 100*a* shown along line A-A' in FIG. 1C, in accordance with some embodiments. FIGS. 2A-2 to 2H-2 illustrate cross-sectional representations of various stages of manufacturing the semiconductor structure 100*a* shown along line B-B' in FIG. 1C, in accordance with some embodiments. FIGS. 2A-3 to 2H-3 illustrate cross-sectional representations of various stages of manufacturing the semiconductor structure 100*a* shown along line C-C' in FIG. 1C, in accordance with some embodiments. FIGS. 2A-4 to 2H-4 illustrate cross-sectional representations of various stages of manufacturing the semiconductor structure 100*a* shown along line D-D' in FIG. 1C, in accordance with some embodiments. FIGS. 2A-5 to 2H-5 illustrate cross-sectional representations of various stages of manufacturing the semiconductor structure 100*a* shown along line E-E' in FIG. 1C, in accordance with some embodiments.

As shown in FIGS. 2A-1, 2A-2, 2A-3, 2A-4 and 2A-5, the first dummy gate structure 118*a* is formed over the first fin structure 104*a* and the isolation material 111. In addition, the gate spacer layer 126 is formed on opposite sidewall surfaces of the first dummy gate structure 118*a*.

Next, as shown in FIGS. 2B-1, 2B-2, 2B-3, 2B-4 and 2B-5, after the gate spacer layers 126 are formed, the source/drain (S/D) regions of the first fin structure 104*a* and the second fin structure 104*b* are recessed to form source/drain (S/D) recesses 130, as shown in in accordance with some embodiments. More specifically, the first semiconductor material layers 106 and the second semiconductor material layers 108 not covered by the dummy gate structures 118 and the gate spacer layers 126 are removed, in accordance with some embodiments.

In some embodiments, the first fin structure 104*a* and the second fin structure 104*b* are recessed by performing an etching process. The etching process may be an anisotropic etching process, such as dry plasma etching, and the first dummy gate structure 118*a*, the second dummy gate structure 118*b* and the gate spacer layers 126 are used as etching masks during the etching process.

Afterwards, after the source/drain (S/D) recesses 130 are formed, the first semiconductor material layers 106 exposed by the source/drain (S/D) recesses 130 are laterally recessed to form notches (not shown). Next, inner spacers 134, as shown in FIG. 2B-5, are formed in the notches between the second semiconductor material layers 108, in accordance with some embodiments. In some embodiments, the top surface of the isolation material 111 is higher than the topmost surface of the inner spacers 134. In addition, the dielectric constant (k value) of the inner spacer 134 is greater than the dielectric constant (k value) of the isolation material 111.

In some embodiments, an etching process is performed on the semiconductor structure 100*a* to laterally recess the first semiconductor material layers 106 of the fin structure 104 from the source/drain recesses 130. In some embodiments, during the etching process, the first semiconductor material layers 106 have a greater etching rate (or etching amount) than the second semiconductor material layers 108, thereby forming notches between adjacent second semiconductor material layers 108. In some embodiments, the etching process is an isotropic etching such as dry chemical etching, remote plasma etching, wet chemical etching, another suitable technique, and/or a The inner spacers 134 are configured to separate the source/drain (S/D) structures and the gate structures formed in subsequent manufacturing processes in accordance with some embodiments. In some embodiments, the inner spacers 134 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. In some embodiments, the inner spacer layer 134 is formed by a deposition process, such as chemical vapor deposition (CVD) process, atomic layer deposition (ALD) process, another applicable process, or a combination thereof.

Afterwards, as shown in FIGS. 2C-1, 2C-2, 2C-3, 2C-4 and 2C-5, after the inner spacers 134 are formed, source/drain (S/D) structures 136 are formed in the S/D recesses 130, in accordance with some embodiments. The isolation material 111 is between two adjacent S/D structures 136 to prevent the merge of the two adjacent S/D structures 136.

In some embodiments, the S/D structures 136 are formed using an epitaxial growth process, such as Molecular beam epitaxy (MBE), Metal-organic Chemical Vapor Deposition (MOCVD), Vapor-Phase Epitaxy (VPE), another applicable epitaxial growth process, or a combination thereof. In some embodiments, the S/D structures 136 are made of any applicable material, such as Ge, Si, GaAs, AlGaAs, SiGe, GaAsP, SiP, SiC, SiCP, or a combination thereof.

In some embodiments, the S/D structures 136 are in-situ doped during the epitaxial growth process. For example, the S/D structures 136 may be the epitaxially grown SiGe doped with boron (B). For example, the S/D structures 136 may be the epitaxially grown Si doped with carbon to form silicon: carbon (Si:C) source/drain features, phosphorous to form silicon: phosphor (Si:P) source/drain features, or both carbon and phosphorous to form silicon carbon phosphor (SiCP) source/drain features. In some embodiments, the S/D structures 136 are doped in one or more implantation processes after the epitaxial growth process.

Since the S/D recess 130 is formed by removing a portion of the isolation material 111, the sidewall surface of the isolation material 111 is exposed by the S/D recess 130. The S/D structures 136 are formed in the S/D recess 130 and along the sidewall surface of the isolation material 111. The heights of the S/D structures 136 depend on the depths of the S/D recesses 130. Since the depth of the S/D recess 130 in high isolation material 111 is deeper than that of the S/D recess in low isolation material, the adjacent S/D structures 136 extend upwardly along the sidewall surface of the deep S/D recess 130. The risk of unwanted merge issue of the two adjacent S/D structures 136 is reduced.

In some embodiments, as shown in FIG. 2C-4, the S/D structure 136 has a vertical portion and a lateral portion, the vertical portion is embedded in the isolation material 111, and the lateral portion extends laterally. In some embodiments, there is a lateral width $W_1$ between the outer sidewall surface of the vertical portion and the outer sidewall surface of the lateral portion. In some embodiments, the lateral width $W_1$ is in a range from about 1 nm to about 3 nm.

There is a first distance $D_1$ between two adjacent bottom portions of two adjacent S/D structures 136. In some embodiments, there is a second distance $D_2$ between two adjacent top portions of two adjacent S/D structures 136. The first distance $D_1$ is greater than the second distance $D_2$.

As shown in FIG. 2C-3, there is a first height $H_1$ between the top surface of the isolation material 111 directly below the first dummy gate structure 118*a* and the bottommost first semiconductor material layer 106. As shown in FIG. 2C-4, there is a second height $H_2$ between the top surface of the isolation material 111 at the S/D region and the bottommost first semiconductor material layer 106. In some embodiments, the first height $H_1$ is greater than the second height $H_2$. Since a portion of the isolation material 111 at the S/D region may be removed during formation of the S/D recess 130, and therefore the top surface of the isolation material 111 at the S/D region is lower than the top surface of the isolation material 111 directly below the first dummy gate structure 118*a*.

Afterwards, as shown in FIGS. 2D-1, 2D-2, 2D-3, 2D-4 and 2D-5, a contact etch stop layer (CESL) 138 is conformally formed to cover the first S/D structures 136*a*, the second S/D structure 136*b* and an interlayer dielectric (ILD) layer 140 is formed over the contact etch stop layers 138, in accordance with some embodiments.

In some embodiments, the contact etch stop layer 138 is made of a dielectric materials, such as silicon nitride, silicon oxide, silicon oxynitride, another suitable dielectric material, or a combination thereof. The dielectric material for the contact etch stop layers 138 may be conformally deposited over the semiconductor structure by performing chemical vapor deposition (CVD), ALD, another application method, or a The ILD layer 140 may include multilayers made of multiple dielectric materials, such as silicon oxide, silicon nitride, silicon oxynitride, phosphosilicate glass (PSG), borophosphosilicate glass (BPSG), or another applicable low-k dielectric material. The ILD layer 140 may be formed by chemical vapor deposition (CVD), physical vapor deposition, (PVD), atomic layer deposition (ALD), or another applicable process.

After the contact etch stop layer 138 and the ILD layer 140 are deposited, a planarization process such as CMP or an etch-back process may be performed until the gate electrode layers 120 of the dummy gate structures 118 are exposed, as shown in FIGS. 2D-1 and 2D-2, in accordance with some embodiments.

Next, as shown in FIGS. 2E-1, 2E-2, 2E-3, 2E-4 and 2E-5, a protective layer 141 is formed on the ILD layer 140, and the first dummy gate structure 118*a* and the second dummy gate structure 118*b* are removed to form a trench 143, in accordance with some embodiments. The protective layer 141 is used to protect the underlying ILD layer 140. As a result, the first fin structure 104*a* and the second fin structure 104*b* are exposed by the trench 143.

The protective layer 141 is formed by removing a top portion of the ILD layer 140 to form a recess, and the protective layer 141 is formed in the recess, and then the excess protective layer 141 outside of the recess is removed to form the protective layer 141 on the ILD layer 140.

The protective layer 141 is made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. In some embodiments, the protective layer 141 is formed by performing a deposition process, such as chemical vapor deposition (CVD), physical vapor deposition, (PVD), atomic layer deposition (ALD), or another applicable process.

The removal process may include one or more etching processes. For example, when the dummy gate electrode layer 122 is polysilicon, a wet etchant such as a tetramethylammonium hydroxide (TMAH) solution may be used to selectively remove the dummy gate electrode layer 122. Afterwards, the dummy gate dielectric layer 120 may be removed using a plasma dry etching, a dry chemical etching, and/or a wet etching.

Next, as shown in FIGS. 2F-1, 2F-2, 2F-3, 2F-4 and 2F-5, a photoresist layer 11 is formed over a portion of the isolation material 111, in accordance with some embodiments. The portion of the isolation material 111 is removed to form an isolation structure 116, and the remaining isolation material 111 is called a dielectric wall 111 between the first fin structure 104*a* and the second fin structure 104*b*.

As shown in FIG. 2F-2, the portion of the isolation material 111 directly below the first dummy gate structure 118*a* is removed to form a trench 145, the bottom surface of the trench 145 is lower than the top surface of the isolation material 111.

As shown in FIG. 2F-3, the dielectric wall 111 extends from a first position to a second position along the first direction (e.g. x-axis), the first position is between the first fin structure 104*a* and the second fin structure 104*b* and directly below the first dummy gate structure 118*a*, and the second position is between two adjacent S/D structures 136. In addition, the dielectric wall 111 further extends to a third portion, and the third position is between the first fin structure 104*a* and the second fin structure 104*b* and directly below the second dummy gate structure 118*b*.

Afterwards, as shown in FIGS. 2G-1, 2G-2, 2G-3, 2G-4 and 2G-5, the protective layer 141 is removed, and the photoresist layer 11 is removed, in accordance with some embodiments. Next, the first semiconductor material layers 106 are removed to form nanostructures 108' (or channel layers 108') with the second semiconductor material layers 108. After the nanostructures 108' are formed, a first gate structure 142*a* and a second gate structure 142*b* are formed to surround the nanostructures 108' and over the isolation structure 116, in accordance with some embodiments. The top surface of a topmost first nanostructure 108' is substantially coplanar with the top surface of the dielectric wall 111.

The dielectric wall 111 is in direct contact with the nanostructures 108' (or channel layers 108') of the first gate structure 142*a* and the nanostructures 108' (or channel layers 108') of the second gate structure 142*b*. The dielectric wall 111 extends from a first position, through a second position to the third position, the first position is directly below the first gate structure 142*a*, and the second position is between two adjacent S/D structures 136. The third position is directly below the second gate structure 142*b*.

After the nanostructures 108' are formed, the first gate structure 142*a* and the second gate structure 142*b* are formed wrapped around the nanostructures 108'. The first gate structure 142*a* and the second gate structure 142*b* wrap around the nanostructures 108' to form gate-all-around transistor structures in accordance with some embodiments. In some embodiments, the first gate structure 142*a* includes an interfacial layer 144, a gate dielectric layer 146, and a first gate electrode layer 148*a*. In some embodiments, the second gate structure 142*b* includes an interfacial layer 144, a gate dielectric layer 146, and a second gate electrode layer 148*b*.

In some embodiments, the interfacial layers 144 are oxide layers formed around the nanostructures 108' and on the top of the base fin structure 105. In some embodiments, the interfacial layers 144 are formed by performing a thermal process.

In some embodiments, the gate dielectric layers 146 are formed over the interfacial layers 144, so that the nanostructures 108' are surrounded (e.g. wrapped) by the gate dielectric layers 146. In addition, the gate dielectric layers 146 also cover the sidewalls of the gate spacers 126 and the inner spacers 134 in accordance with some embodiments. In some embodiments, the gate dielectric layers 146 are made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, another suitable high-k dielectric material, or a combination thereof. In some embodiments, the gate dielectric layers 146 are formed using chemical vapor deposition (CVD), atomic layer deposition (ALD), another applicable method, or a combination thereof.

In some embodiments, the first gate structure 142*a* and the second gate structure 142*b* are formed on the gate dielectric layer 146. In some embodiments, the first gate structure 142*a* and the second gate structure 142*b* are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the first gate structure 142*a* and the second gate structure 142*b* are formed using chemical vapor deposition (CVD), atomic layer deposition (ALD), electroplating, another applicable method, or a combination thereof. Other conductive layers, such as work function metal layers, may also be formed in the first gate structure 142*a* and the second gate structure 142*b*, although they are not shown in the figures. In some embodiments, the n-work function layer includes tungsten (W), copper (Cu), titanium (Ti), silver (Ag), aluminum (Al), titanium nitride (TiN), tantalum nitride (TaN), tantalum carbide (TaC), titanium aluminum alloy (TiAl), titanium aluminum nitride (TiAlN), tantalum carbon nitride (TaCN), tantalum silicon nitride (TaSiN), manganese (Mn), zirconium (Zr) or a combination thereof. In some embodiments, the p-work function layer includes titanium (Ti), titanium nitride (TiN), tantalum nitride (TaN), tantalum carbide (TaC), molybdenum nitride, tungsten nitride (WN), ruthenium (Ru) or a combination thereof.

After the interfacial layers 144, the gate dielectric layers 146, and first gate structure 142*a* and the second gate structure 142*b* are formed, a planarization process such as CMP or an etch-back process may be performed until the ILD layer 140 is exposed.

It should be noted that the first portion of the first gate structure 142*a* has a first length $L_1$ (shown in FIG. 2G-1) adjacent to the nanostructures 108' along the first direction (e.g. x-axis), and the second portion of the first gate structure 142*a* over the dielectric wall 111 has a second length $L_2$ (shown in FIG. 2G-2) along the first direction (e.g. x-axis). In some embodiments, the first length $L_1$ is greater than the second length $L_2$.

Next, as shown in FIGS. 2H-1, 2H-2, 2H-3, 2H-4 and 2H-5, after the first gate structure 142*a* and the second gate structure 142*b* are formed, an etch stop layer 150 is formed over the gate structure 142, and a dielectric layer 152 is formed over the etch stop layer 150, in accordance with some embodiments.

Afterwards, a cutting structure 160 is formed through the first gate structure 142*a*, in accordance with some embodiments. The cutting structure 160 is formed on the dielectric wall 111. The first gate structure 142*a* is divided into two portions by the cutting structure 160. In some embodiments, the bottom portion of the cutting structure 160 is embedded in the isolation material 111, and the bottom surface of the cutting structure 160 is lower than the top surface of the isolation material 111.

In some embodiments, the cutting structure 160 is made of oxide, such as $SiO_2$, SiOCN, SiON, or the like. In some embodiments, the cutting structure 160 is made of a high k dielectric material, such as $HfO_2$, $ZrO_2$, $HfAlO_x$, $HfSiO_x$, $Al_2O_3$, or the like. In some embodiments, the cutting structure 160 is formed by performing ALD, CVD, PVD, another suitable process, or a combination thereof.

In some embodiments, the etch stop layer 150 is made of a dielectric materials, such as silicon nitride, silicon oxide, silicon oxynitride, another suitable dielectric material, or a combination thereof. The dielectric material for the etch stop layers 150 may be conformally deposited over the semiconductor structure by performing chemical vapor deposition (CVD), ALD, another application method, or a The dielectric layer 152 may include multilayers made of multiple dielectric materials, such as silicon oxide, silicon nitride, silicon oxynitride, phosphosilicate glass (PSG), borophosphosilicate glass (BPSG), or another applicable low-k dielectric material. The dielectric layer 152 may be formed by chemical vapor deposition (CVD), physical vapor deposition, (PVD), atomic layer deposition (ALD), or another applicable process.

Next, a silicide layer 154 and an S/D contact structure 156 are formed over the S/D structure 136, in accordance with some embodiments. The S/D contact structure 156 is electrically connected to the S/D structure 136. The silicide layer 154 is used to reduce the resistance between the S/D contact structure 156 and the S/D structure 136.

In some embodiments, the contact openings may be formed through the contact etch stop layer 138, the interlayer dielectric layer 140, the etch stop layer 150 and the dielectric layer 152 to expose the top surfaces of the S/D structures 136, and then the silicide layers 154 and the S/D contact structure 156 may be formed in the contact openings. The contact openings may be formed using a photolithography process and an etching process. In addition, some portions of the S/D structure exposed by the contact openings may also be etched during the etching process.

The silicide layers 154 may be formed by forming a metal layer over the top surfaces of the S/D structure 136 and annealing the metal layer so the metal layer reacts with the S/D structure 136 to form the silicide layers 154. The unreacted metal layer may be removed after the silicide layers 154 are formed.

The S/D contact structure 156 may include a barrier layer and a conductive layer. In some other embodiments, the S/D contact structure 156 does not include a barrier layer. In some embodiments, the barrier layer is made of titanium (Ti), titanium nitride (TiN), tantalum (Ta), tantalum nitride (TaN), or another applicable material. In some embodiments, the barrier layer is formed by using a process such as chemical vapor deposition (CVD), physical vapor deposition (PVD), plasma enhanced CVD (PECVD), plasma enhanced physical vapor deposition (PEPVD), atomic layer deposition (ALD), or another applicable deposition process. In some embodiments, the conductive layer is made of tungsten (W), ruthenium (Ru), molybdenum (Mo), or the like. In some embodiments, the conductive layer is formed by performing a deposition process, such as chemical vapor deposition (CVD), physical vapor deposition, (PVD), atomic layer deposition (ALD), or another applicable process.

The dielectric wall (or isolation material) 111 is made of low-k dielectric material with dielectric constant (K value) in a range from about 1 to about 5. In some embodiments, the dielectric constant (K value) of the isolation material 111 is lower than the dielectric constant (K value) of the gate spacer layer 126. In some embodiments, the dielectric constant (K value) of the isolation material 111 is lower than the dielectric constant (K value) of the inner spacer 134. Since the dielectric wall (or isolation material) 111 is made of low-k dielectric material, the capacitor of the semiconductor structure 100*a* is further reduced, and the performance is improved.

Since the planar top surface is formed before forming the first dummy gate structure 118*a* and the second dummy gate structure 118*b*, the risk of collapse issue of the first dummy gate structure 118*a* and the second dummy gate structure 118*b* can be reduced.

In a compared embodiment, the dielectric wall is formed before the first dummy gate structure 118*a*, the dimension (CD) of the formation of the first dummy gate structure 118*a*, and the S/D recess depth may be affected by the dielectric wall. In order to reduce the interaction between the dielectric wall and the first dummy gate structure 118*a*, the dielectric wall (or isolation material) 111 is formed after the first dummy gate structure 118*a* is formed. More specifically, since the dielectric wall (or isolation material) 111 and the isolation structure 116 is formed after the first dummy gate structure 118*a* is removed, the unwanted wall interaction between the dielectric wall and the first dummy gate structure 118*a* is reduced, and uniformity of the depth of the S/D recess 130 is well controlled.

Since the dielectric wall 111 is higher than the isolation structure 116, the growth of the S/D structure 136 is blocked by the high dielectric wall 111, and the later portion of the S/D structure 136 is reduced. Therefore, the risk of unwanted merge issue of the two adjacent S/D structures 136 is reduced.

Figures 3, 3A:
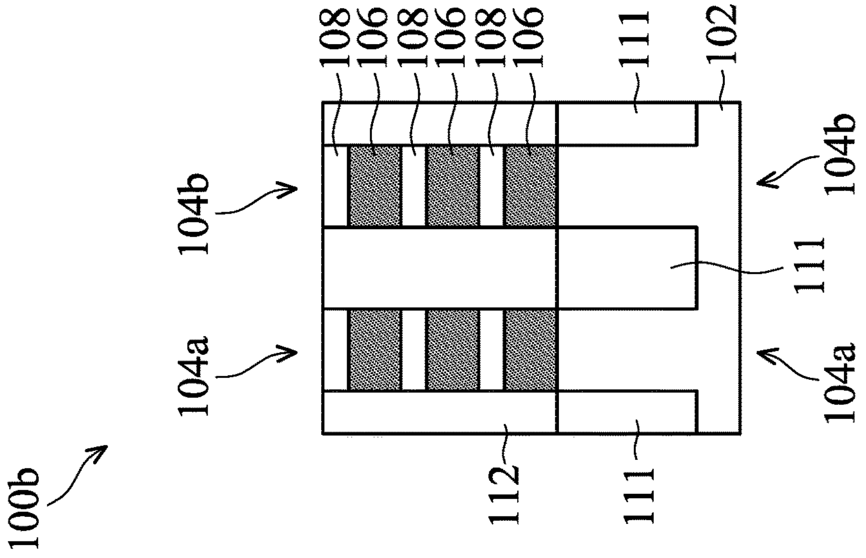
Figures 2, 3A:
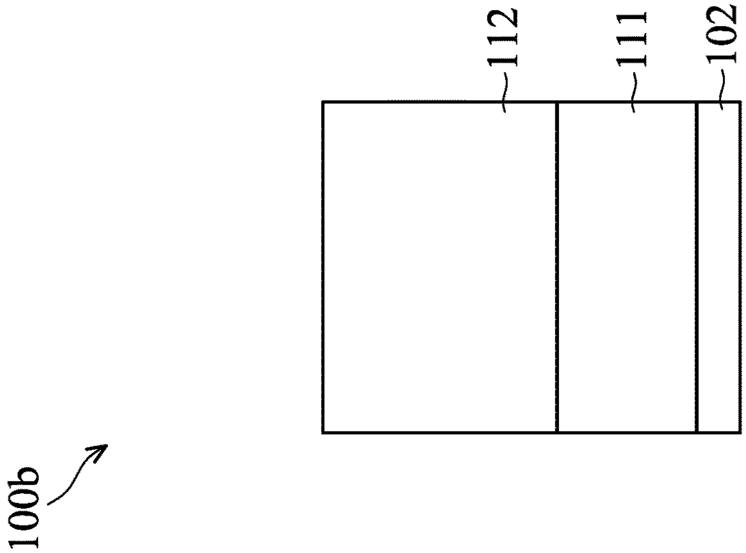
Figures 1, 3A:
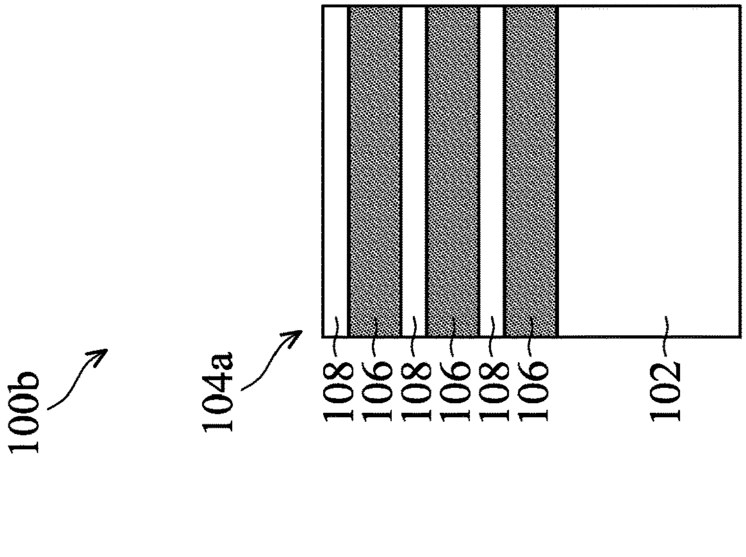
Figures 3, 3B:
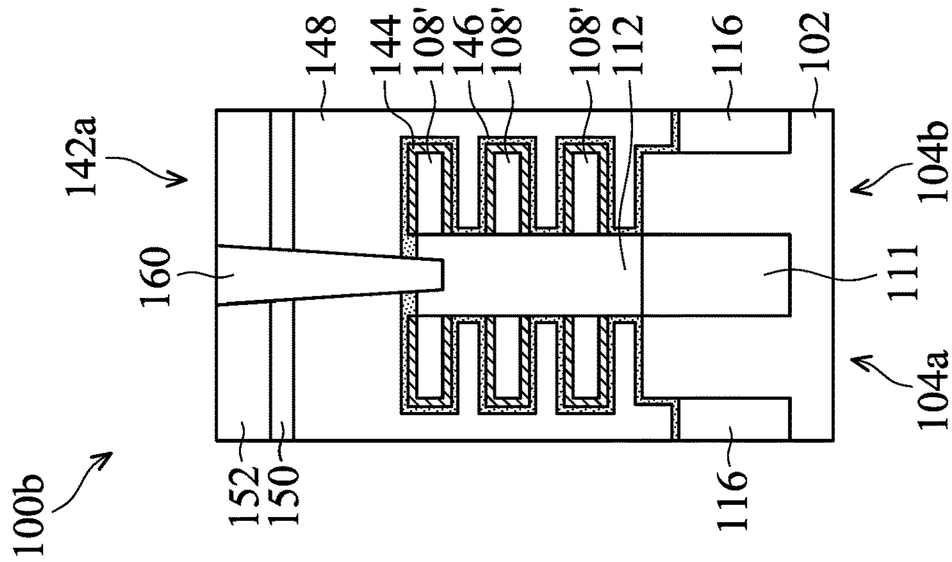
Figures 2, 3B:
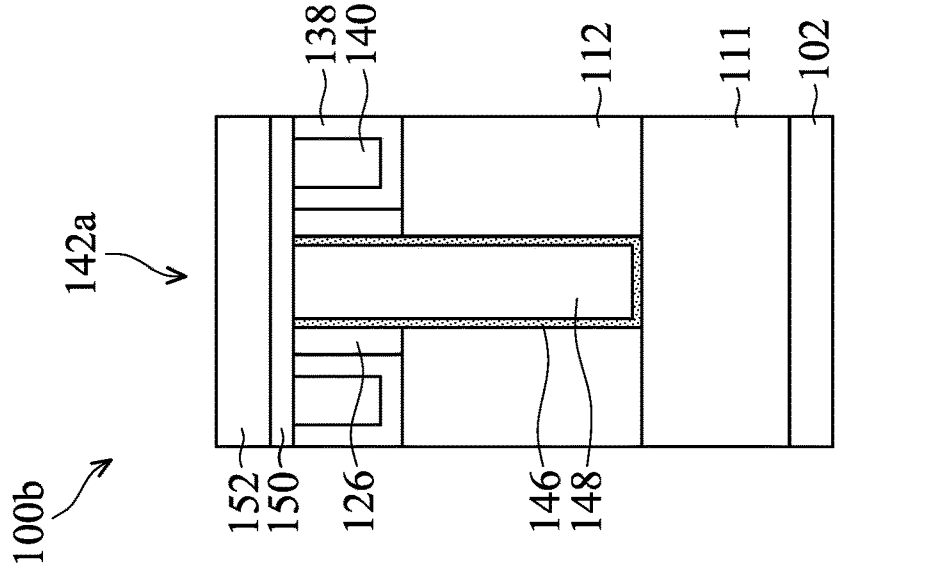
Figures 1, 3B:
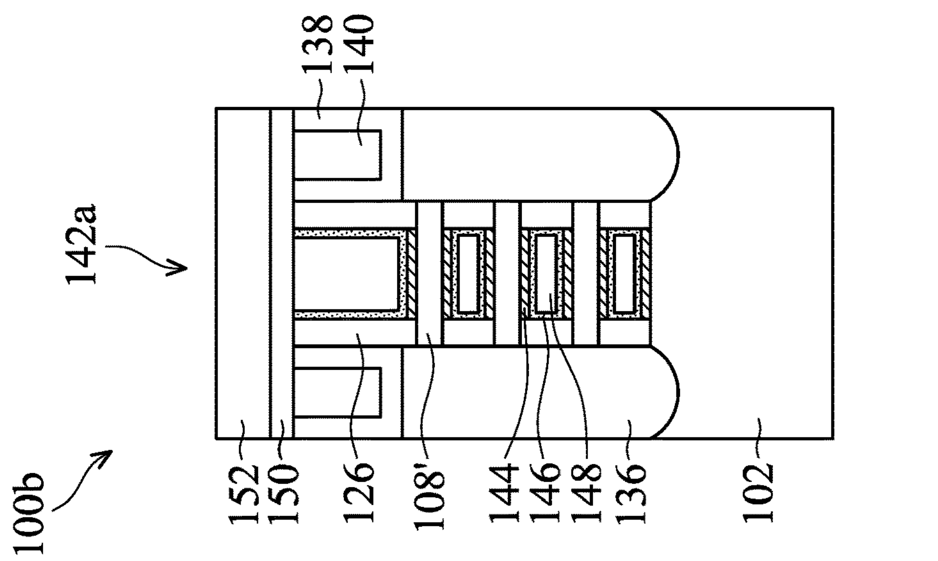
Figures 3, 3B, 4, 5:
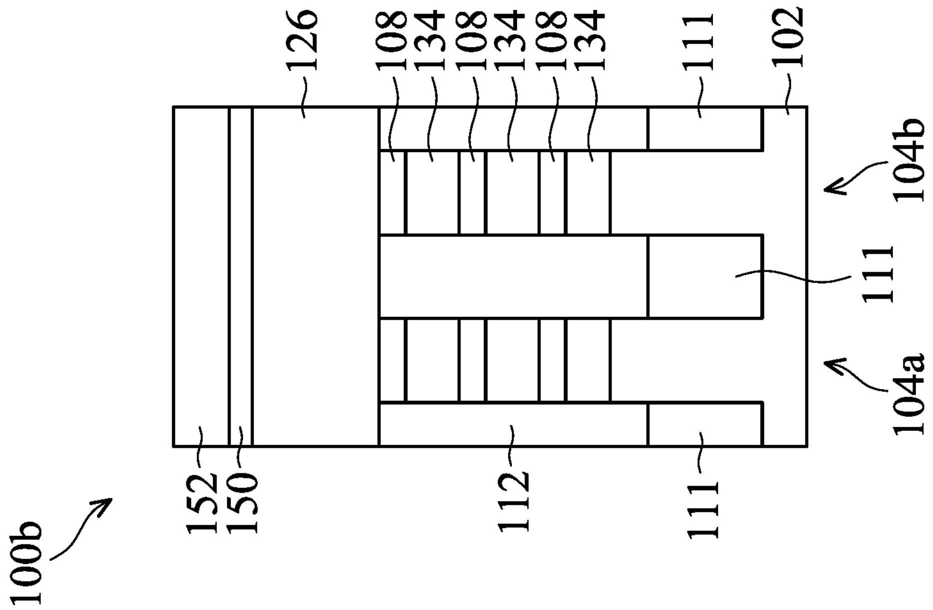
Figures 3, 3B, 4:
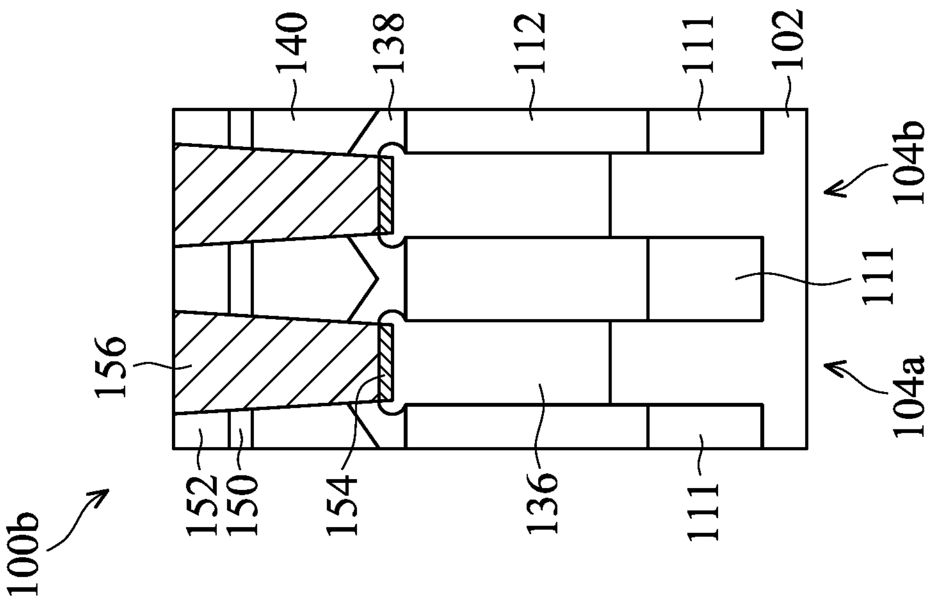

FIGS. 3A-1 to 3B-1 illustrate cross-sectional representations of various stages of manufacturing a semiconductor structure 100*b* shown along line A-A' in FIG. 1B, in accordance with some embodiments. FIGS. 3A-2 to 3B-2 illustrate cross-sectional representations of various stages of manufacturing the semiconductor structure 100*b* shown along line B-B' in FIG. 1B, in accordance with some embodiments. FIGS. 3A-3 to 3B-3 illustrate cross-sectional representations of various stages of manufacturing the semiconductor structure 100*b* shown along line C-C' in FIG. 1B, in accordance with some embodiments. Some processes and materials used to form the semiconductor device structure 100*b* are similar to, or the same as, those used to form the semiconductor device structure 100*a* and are not repeated herein.

As shown in FIGS. 3A-1, 3A-2, 3A-3, a refill material 112 is formed over the isolation material 111. The dielectric wall is constructed by the isolation material 111 and the refill material 112. Since the refill material 112 is different from the isolation material 111, there is an interface between the refill material 112 and the isolation material 111. The top portion of the first fin structure 104*a* is surrounded by the refill material 112, and the bottom portion of the first fin structure 104*a* is surrounded by the isolation material 111. In some embodiments, the interface between the refill material 112 and the isolation material 111 is substantially coplanar with the bottommost surface of the first semiconductor material layer 106. In some embodiments, the interface between the refill material 112 and the isolation material 111 is higher than the bottommost surface of the first semiconductor material layer 106. In some embodiments, the interface between the refill material 112 and the isolation material 111 is lower than the topmost second material layer 108.

Both of the refill material 112 and the isolation material 111 are made of low-k dielectric material with dielectric constant (K value) in a range from about 1 to about 5. In some embodiments, the dielectric constant (K value) of the refill material 112 is greater than the dielectric constant (K value) of the isolation material 111.

In some embodiments, the refill material 112 is made of silicon oxide, silicon nitride, silicon oxynitride (SiON), another applicable insulating material, or a combination thereof. In some embodiments, the isolation material 112 is formed by a LPCVD process, plasma enhanced CVD (PECVD) process, high density plasma CVD (HDP-CVD) process, high aspect ratio process (HARP) process, flowable CVD (FCVD) process, atomic layer deposition (ALD) process, another suitable method, or a combination thereof.

FIG. 3B-4 illustrates a cross-sectional representation of a manufacturing stage the semiconductor structure 100*b* shown along line D-D' in FIG. 1C, in accordance with some embodiments. FIG. 3B-5 illustrates a cross-sectional representation of a manufacturing stage the semiconductor structure 100*b* shown along line E-E' in FIG. 1C, in accordance with some embodiments.

Next, performing the steps similar FIGS. 2A-1-2G-1, 2A-2-2G-2, 2A-3-2G-3, 2A-4-2G-4 and 2A-5-2G-5, as shown in FIGS. 3B-1, 3B-2, 3B-3, 3B-4 and 3B-5, the refill material 112 is formed on the isolation material 111, and the interface between the refill material 112 and the isolation material 111 is lower than the bottommost nanostructure 108'.

As shown in FIG. 3B-2, the bottom surface of the first gate structure 142*a* is substantially leveled with the interface between the refill material 112 and the substrate 102. The gate spacer layer 126 and the CESL 138 are in direct contact with the refill material 112. The bottom surface of the first gate structure 142*a* is lower than the top surface of the refill material 112.

As shown in FIG. 3B-3, the first gate structure 142*a* is divided into two portions by the cutting structure 160. In some embodiments, the bottom portion of the cutting structure 160 is embedded in the refill material 112, and the bottom surface of the cutting structure 160 is lower than the top surface of the refill material 112. In some other embodiments, the bottom surface of the cutting structure 160 is in direct contact with the top surface of the refill material 112. In addition, the top surface of the refill material 112 is higher than the top surface of the isolation structure 116. In some embodiments, the interface between the refill material 112 and the isolation material 111 is lower than the topmost nanostructure 108'.

The dielectric wall having the refill material 112 and the isolation material 111 is made of low-k dielectric material, and therefore the capacitor is reduced to improve the performance of the semiconductor structure 100*b*. In addition, the dielectric constant (k value) of isolation structure 116 is lower than the dielectric constant (k value) of the dielectric wall (111+112).

As shown in FIG. 3B-4, the S/D structures 136 are in direct contact with the refill material 112 and the isolation material 111. The S/D contact structure 156 is formed on and is electrically connected to the S/D structure 136. The bottom surface of the S/D contact structure 156 is higher than the top surface of the refill material 112.

The refill material 112 extends from a first position to a second position, the first position is directly below the first gate structure 142*a*, and the second position is between two adjacent S/D structures 136. Since the refill material 112 is higher than the isolation material 116, the risk of unwanted merge issue of the two adjacent S/D structures 136 is reduced.

As shown in FIG. 3B-5, the refill material 112 is directly below the gate spacer layer 126. The inner spacer 134 is in direct contact with the refill material 112. The topmost surface of the inner spacer 134 is lower than the topmost surface of the refill material 112.

Figures 3, 4A:
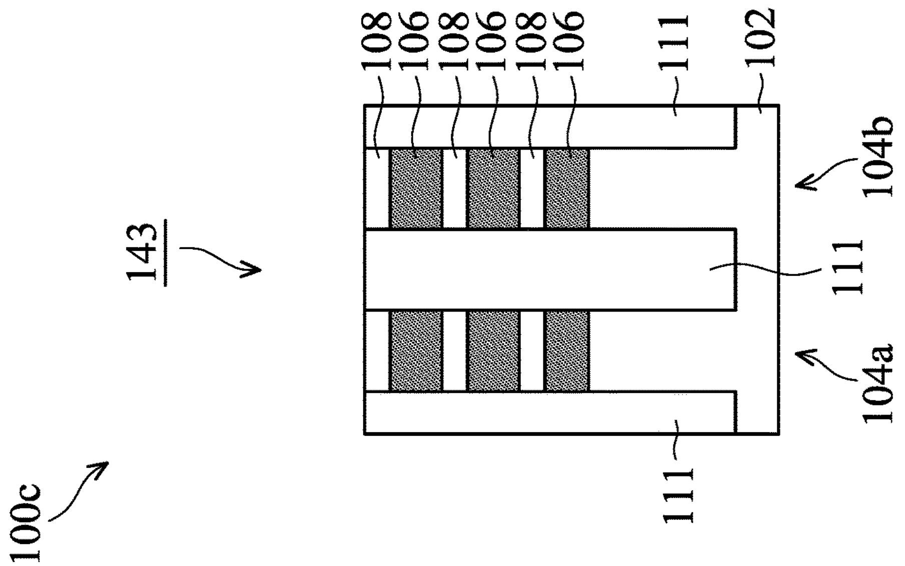
Figures 2, 4A:
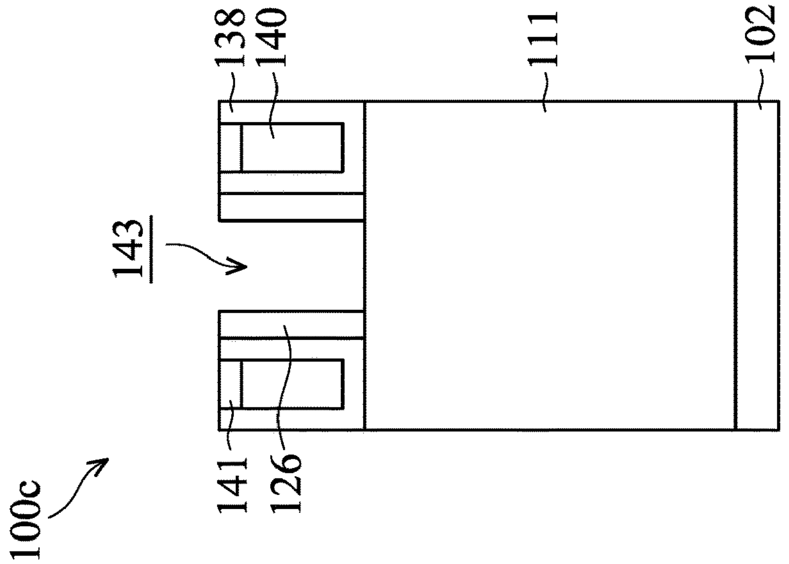
Figures 1, 4A:
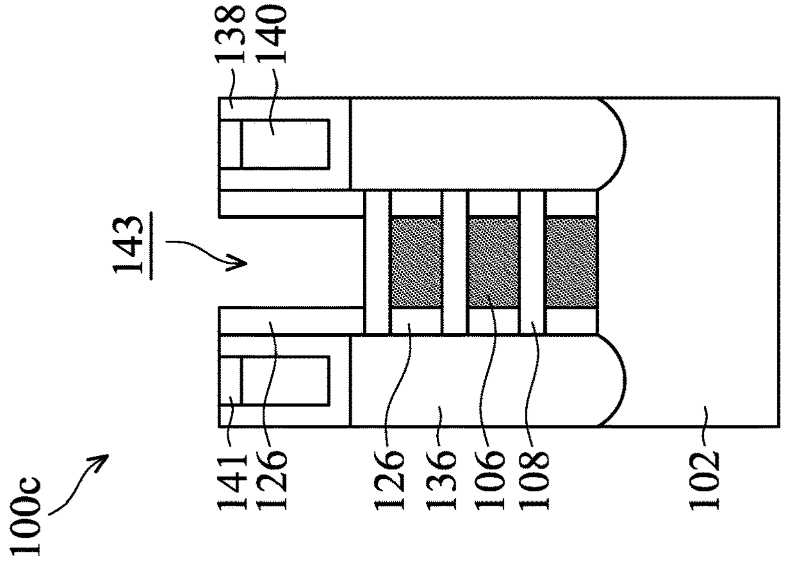
Figures 4, 4A:
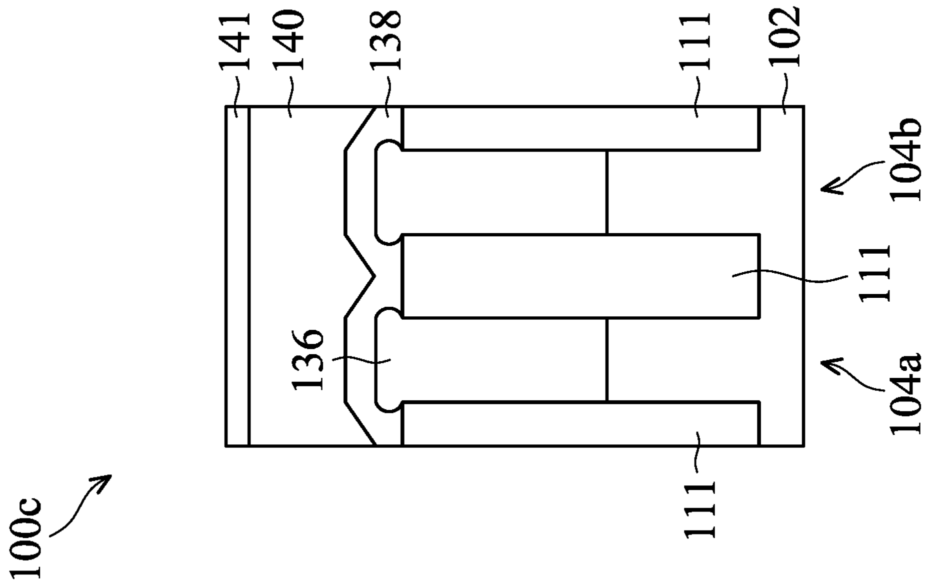
Figures 4, 4A, 5:
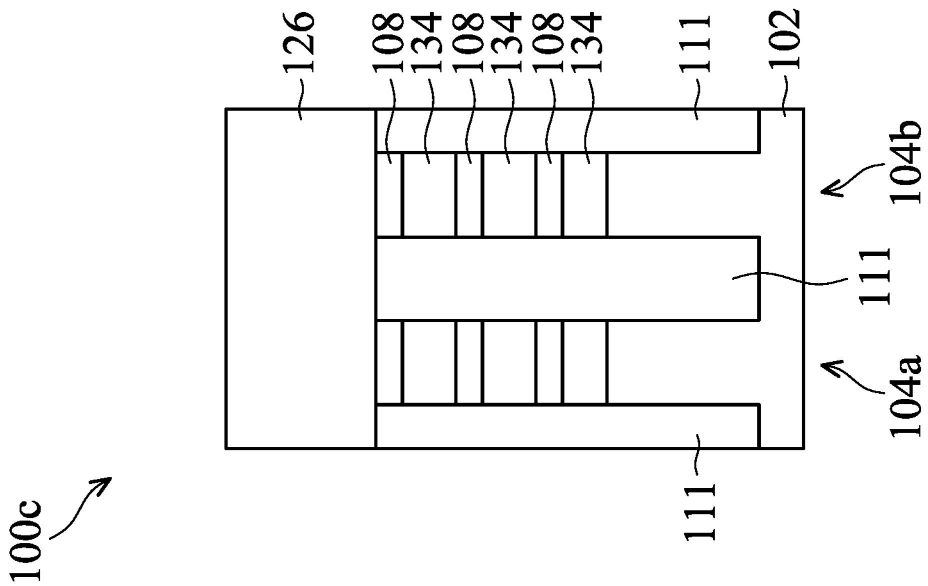
Figures 3, 4B:
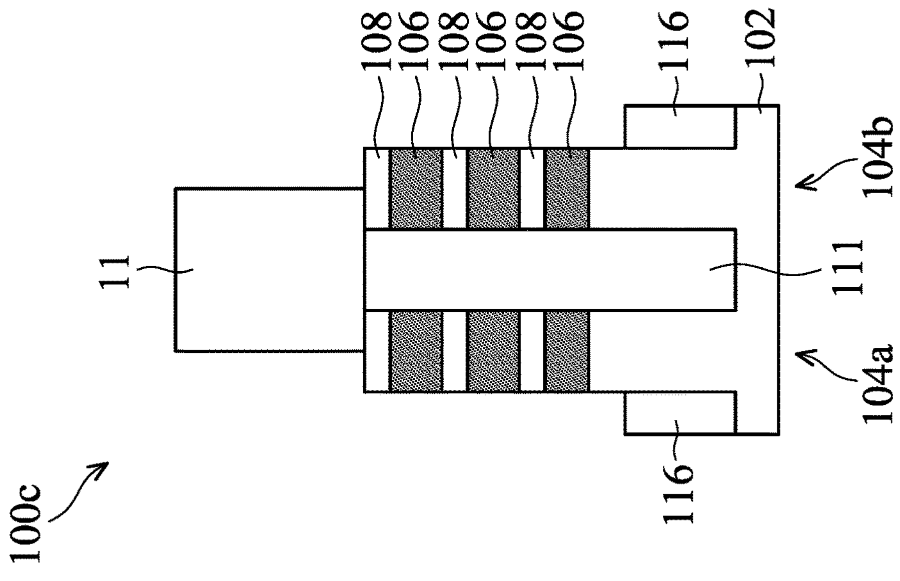
Figures 2, 4B:
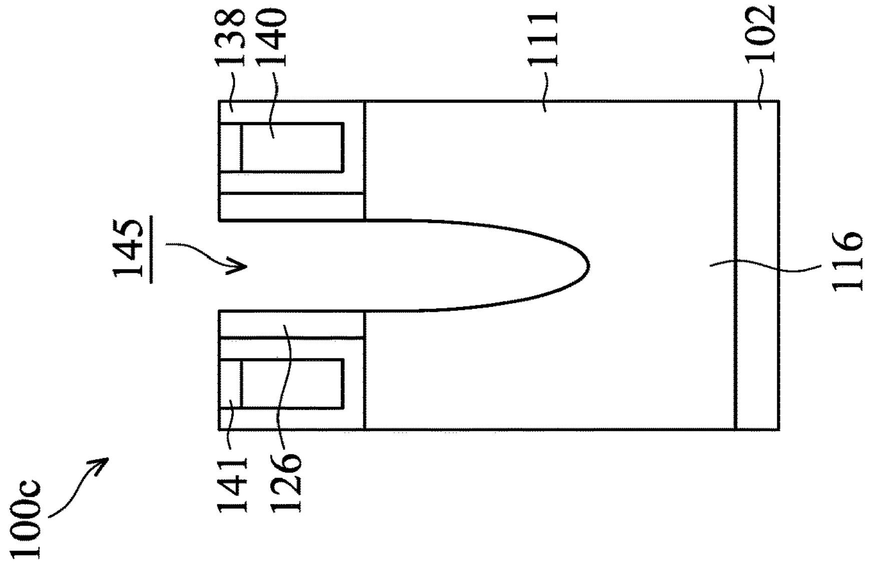
Figures 1, 4B:
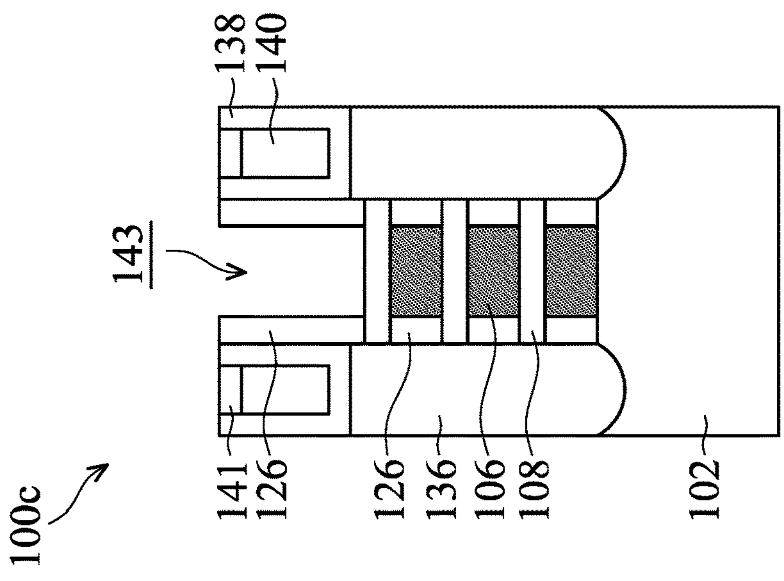
Figures 4, 4B:
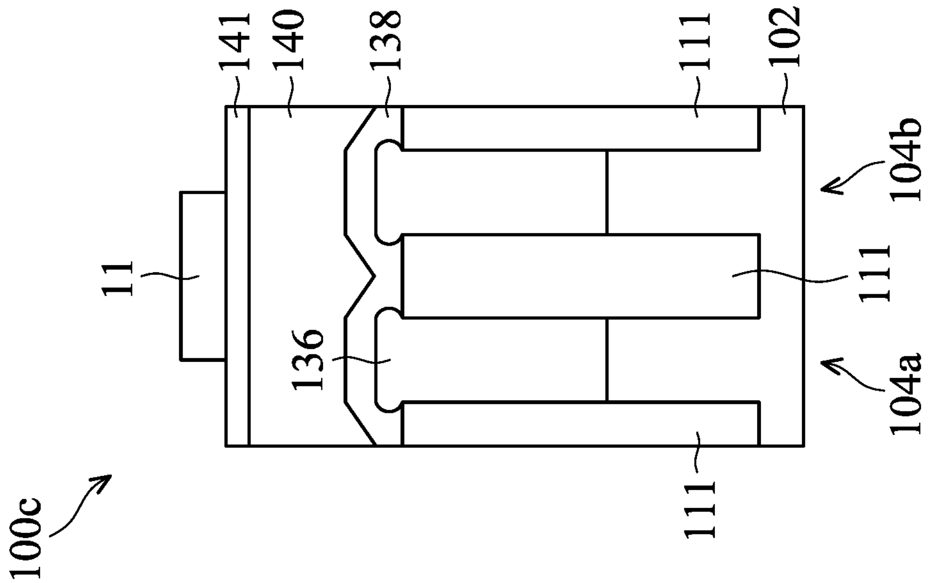
Figures 4, 4B, 5:
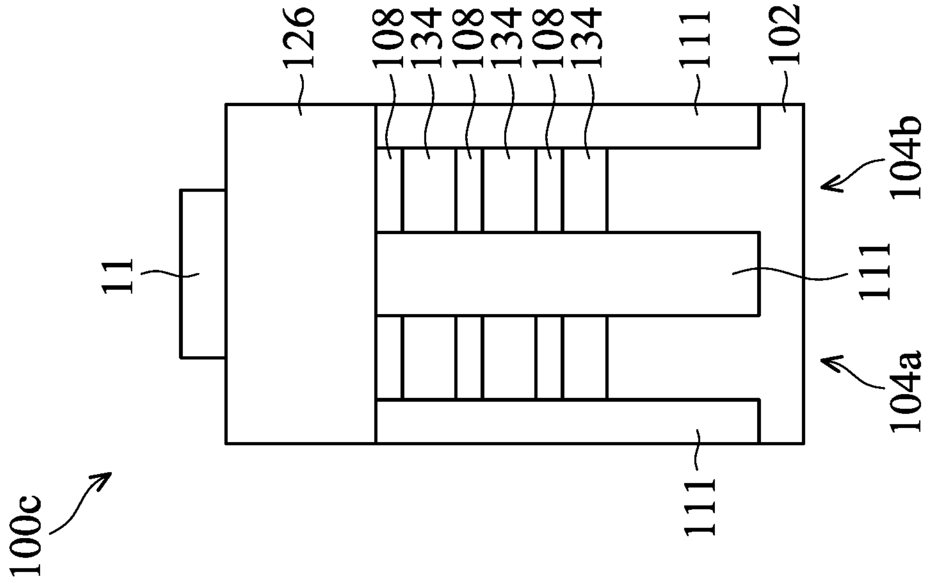
Figures 3, 4C:
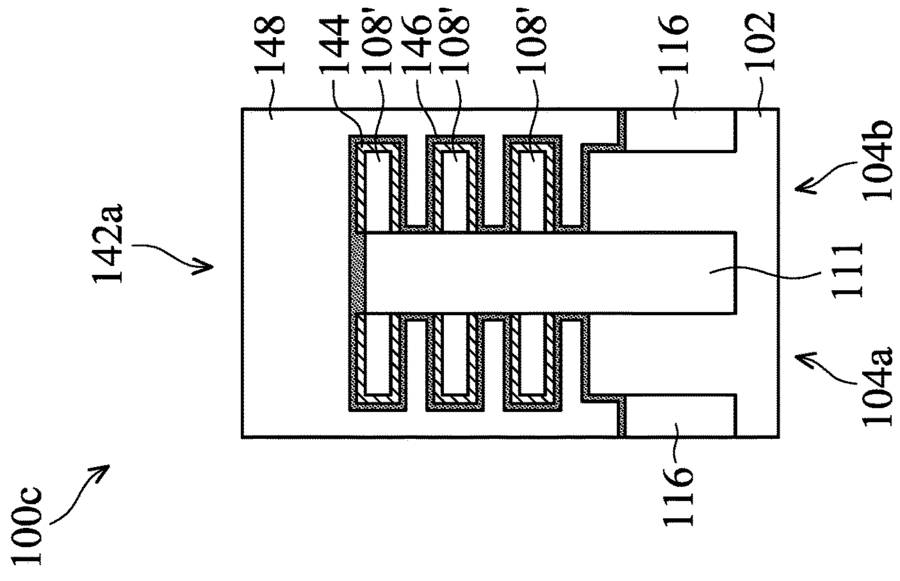
Figures 2, 4C:
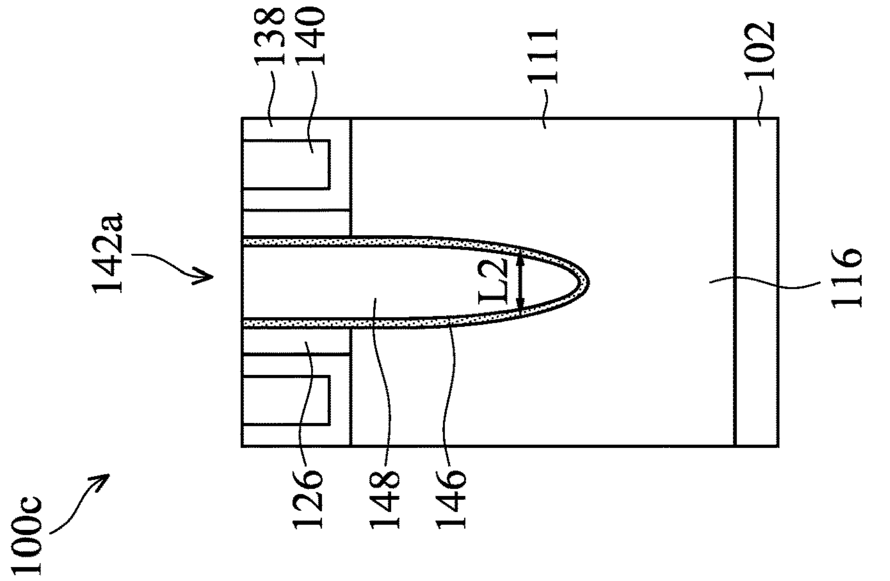
Figures 1, 4C:
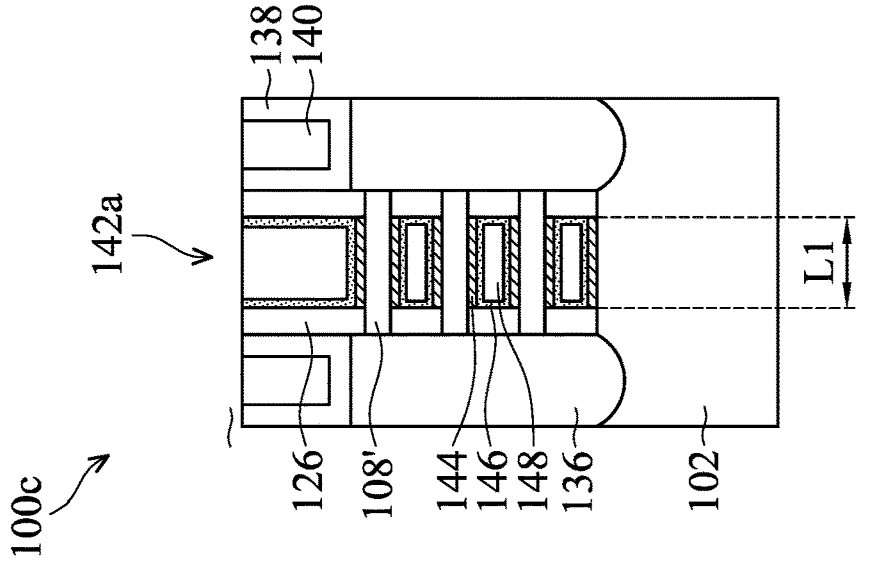
Figures 4, 4C:
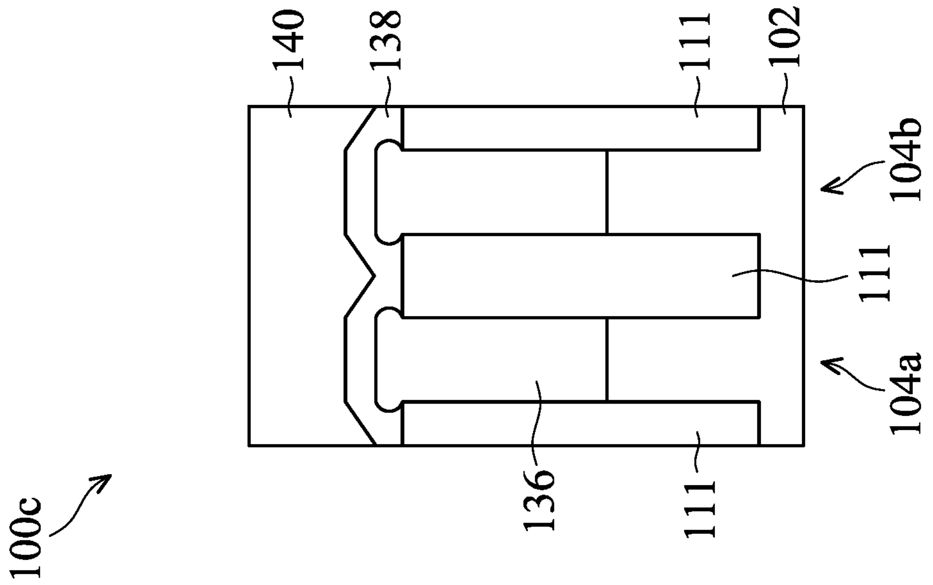
Figures 4, 4C, 5:
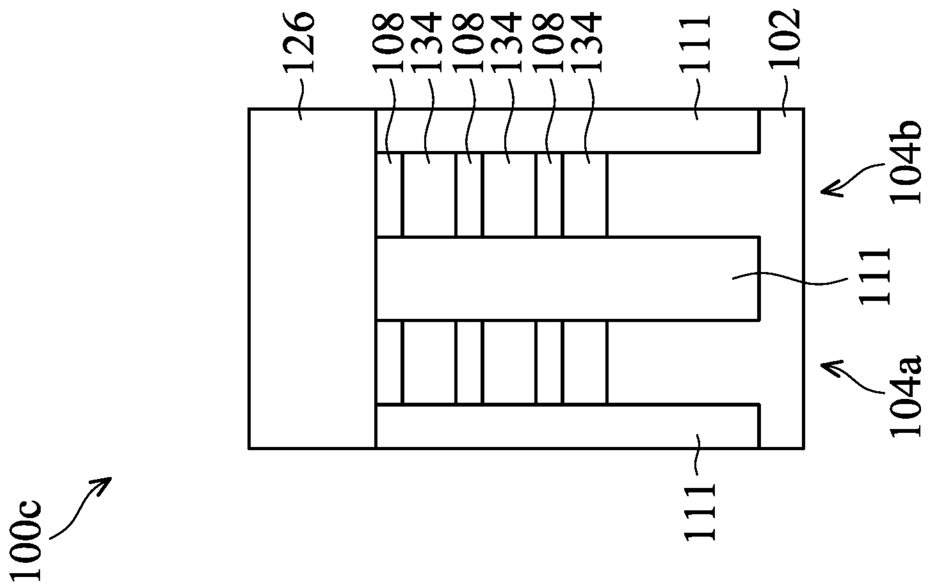
Figures 3, 4D:
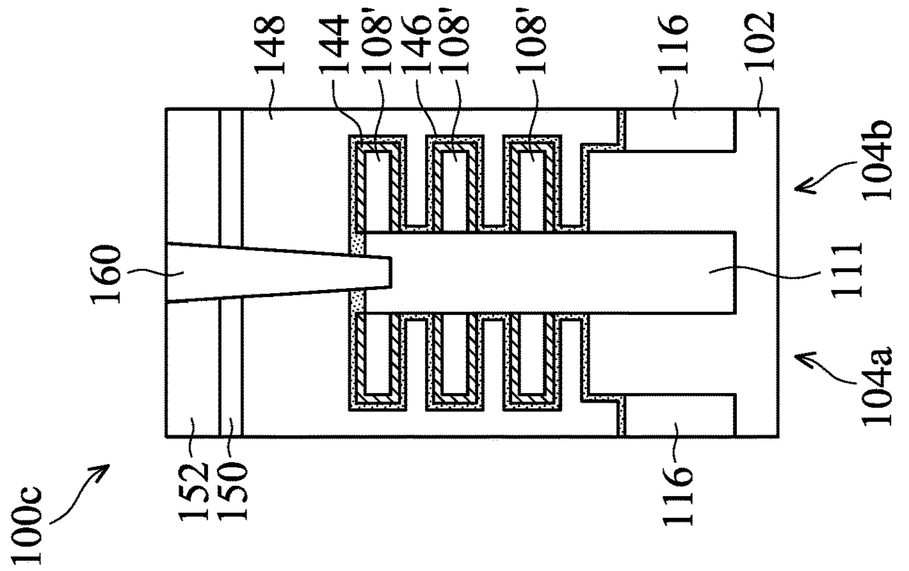
Figures 2, 4D:
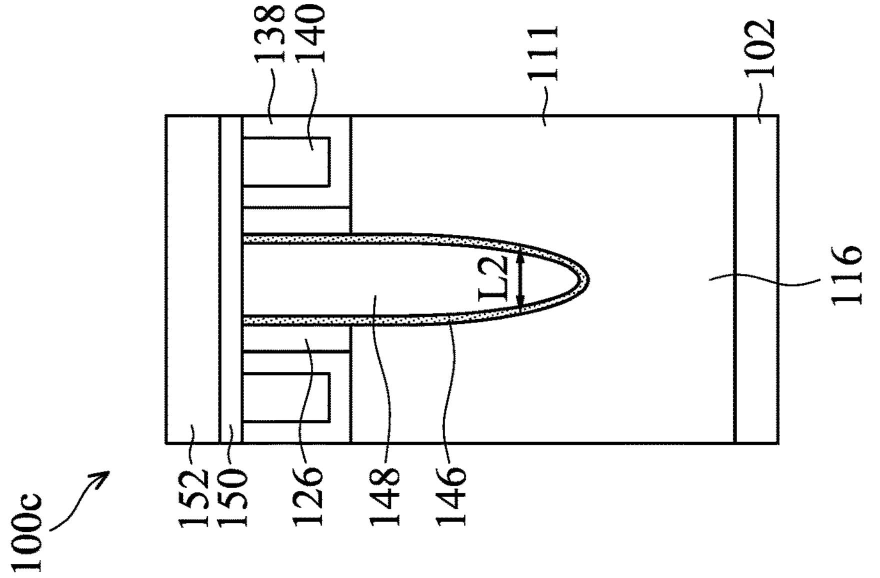
Figures 1, 4D:
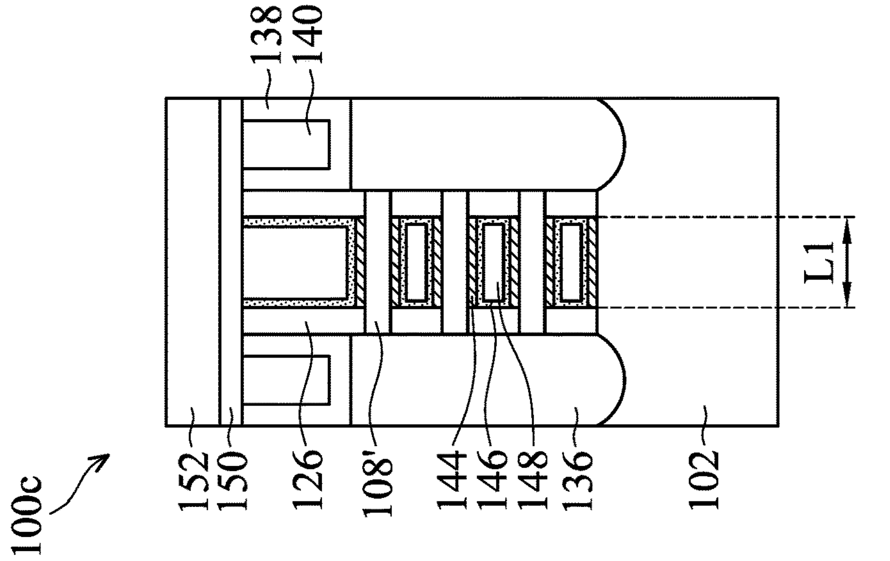
Figures 4, 4D, 5:
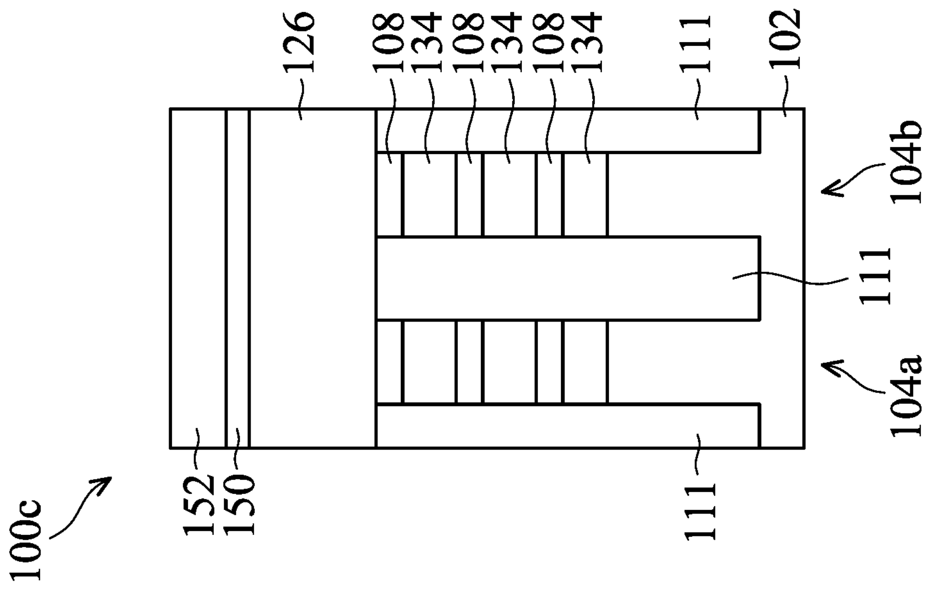
Figures 4, 4D:
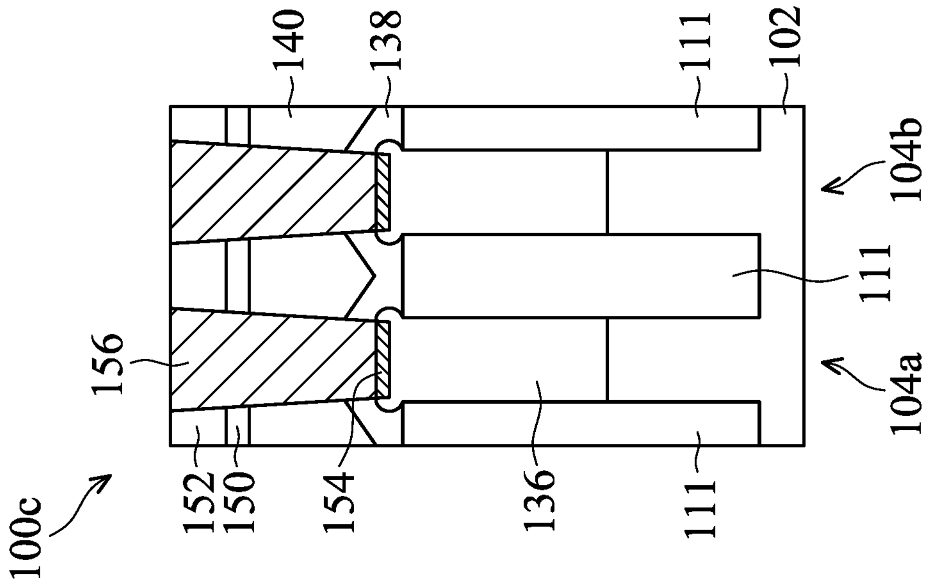

FIGS. 4A-1 to 4D-1 illustrate cross-sectional representations of various stages of manufacturing a semiconductor structure 100*c* shown along line A-A' in FIG. 1C, in accordance with some embodiments. FIGS. 4A-2 to 4D-2 illustrate cross-sectional representations of various stages of manufacturing the semiconductor structure 100*c* shown along line B-B' in FIG. 1C, in accordance with some embodiments. FIGS. 4A-3 to 4D-3 illustrate cross-sectional representations of various stages of manufacturing the semiconductor structure 100*c* shown along line C-C' in FIG. 1C, in accordance with some embodiments. FIGS. 4A-4 to 4D-4 illustrate cross-sectional representations of various stages of manufacturing the semiconductor structure 100*c* shown along line D-D' in FIG. 1C, in accordance with some embodiments. FIGS. 4A-5 to 4D-5 illustrate cross-sectional representations of various stages of manufacturing the semiconductor structure 100*c* shown along line E-E' in FIG. 1C, in accordance with some embodiments. Some processes and materials used to form the semiconductor device structure 100*c* are similar to, or the same as, those used to form the semiconductor device structure 100*a* and are not repeated herein.

As shown in FIGS. 4A-1, 4A-2, 4A-3, 4A-4 and 4A-5, the protective layer 141 is formed on the ILD layer 140, and the first dummy gate structure 118*a* and the second dummy gate structure 118*b* are removed to form the trench 143, in accordance with some embodiments. The protective layer 141 is used to protect the underlying ILD layer 140. As a result, the first fin structure 104*a* and the second fin structure 104*b* are exposed by the trench 143.

Afterwards, as shown in FIGS. 4B-1, 4B-2, 4B-3, 4B-4 and 4B-5, the photoresist layer 11 is formed over a portion of the isolation material 111, in accordance with some embodiments. The portion of the isolation material 111 is removed to form the isolation structure 116, and the remaining isolation material 111 is referred to as the dielectric wall 111 between the first fin structure 104*a* and the second fin structure 104*b*.

As shown in FIG. 4B-2, the portion of the isolation material 111 directly below the first dummy gate structure 118*a* is removed to form a trench 145, the bottom surface of the trench 145 is lower than the top surface of the isolation material 111. Note that the bottom surface of the trench 145 is curved, and the length of the trench 145 in FIG. 2F-2 along the first direction (e.g. x-axis) is smaller than the length of the trench 145 in FIG. 4B-2.

Afterwards, as shown in FIGS. 4C-1, 4C-2, 4C-3, 4C-4 and 4C-5, the protective layer 141 is removed, and the photoresist layer 11 is removed, in accordance with some embodiments. Next, the first semiconductor material layers 106 are removed to form nanostructures 108' (or channel layers 108') with the second semiconductor material layers 108. After the nanostructures 108' are formed, the first gate structure 142*a* is formed to surround the nanostructures 108' and over the isolation structure 116, in accordance with some embodiments.

The dielectric wall 111 is in direct contact with the nanostructures 108' (or channel layers 108') of the first gate structure 142*a*. The dielectric wall 111 extends from a first position to a second position, the first position is directly below the first gate structure 142*a*, and the second position is between two adjacent S/D structures 136.

It should be noted that the first portion of the first gate structure 142*a* has a first length $L_1$ adjacent to the nanostructures 108' along the first direction (e.g. x-axis), and the second portion of the first gate structure 142*a* over the dielectric wall 111 has a second length $L_2$ along the first direction (e.g. x-axis). In some embodiments, the first length $L_1$ is greater than the second length $L_2$. In some embodiments, the difference between the first length $L_1$ and the second length $L_2$ is in a range from about 1 nm to about 6 nm. The shorter second length $L_2$ can reduce the capacitance between the S/D structure 136 and the S/D contact structure 156. This improves the performance of the semiconductor structure 100*c*.

Afterwards, as shown in FIGS. 4D-1, 4D-2, 4D-3, 4D-4 and 4D-5, after the first gate structure 142*a* and the second gate structure 142*b* are formed, the etch stop layer 150 is formed over the gate structure 142, and the dielectric layer 152 is formed over the etch stop layer 150, in accordance with some embodiments.

Afterwards, the cutting structure 160 is formed through the first gate structure 142*a*. The first gate structure 142*a* is divided into two portions by the cutting structure 160. Next, the silicide layer 154 and the S/D contact structure 156 are formed over the S/D structure 136, in accordance with some embodiments. The S/D contact structure 156 is electrically connected to the S/D structure 136. The silicide layer 154 is used to reduce the resistance between the S/D contact structure 156 and the S/D structure 136.

Figures 1, 5A:
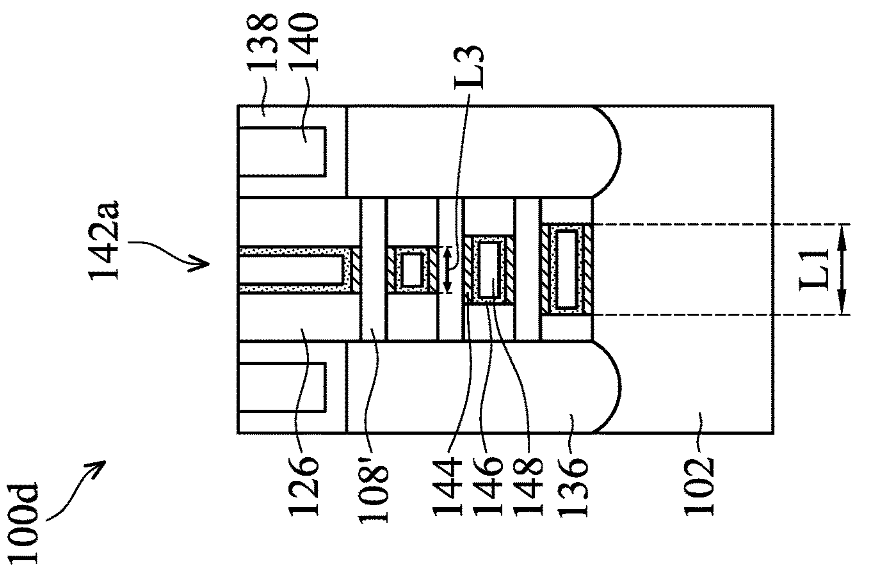
Figures 2, 5A:
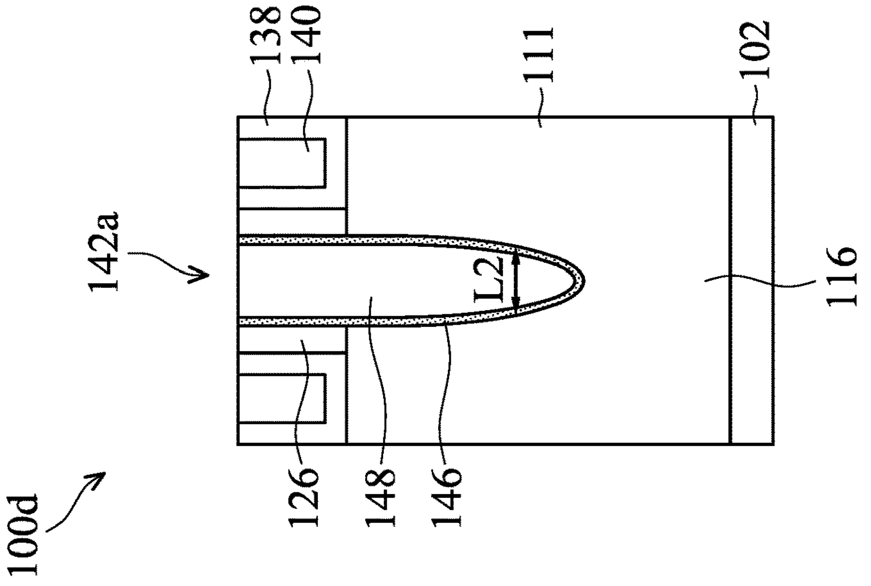
Figures 3, 5A:
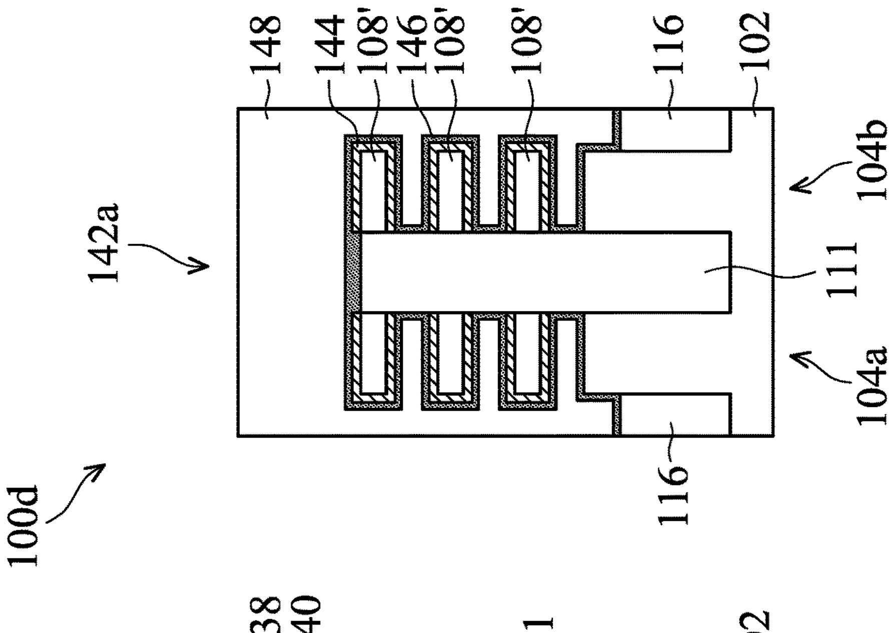
Figures 4, 5A:
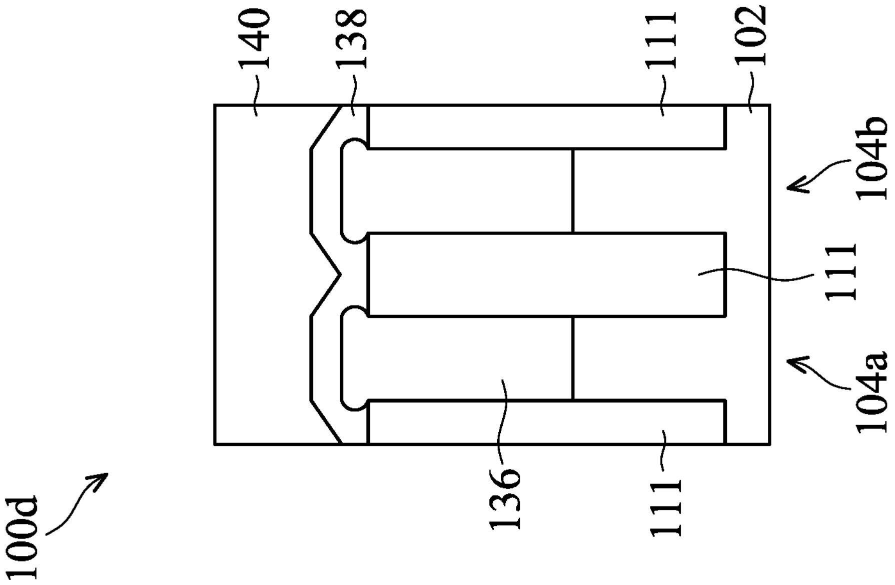
Figures 5, 5A:
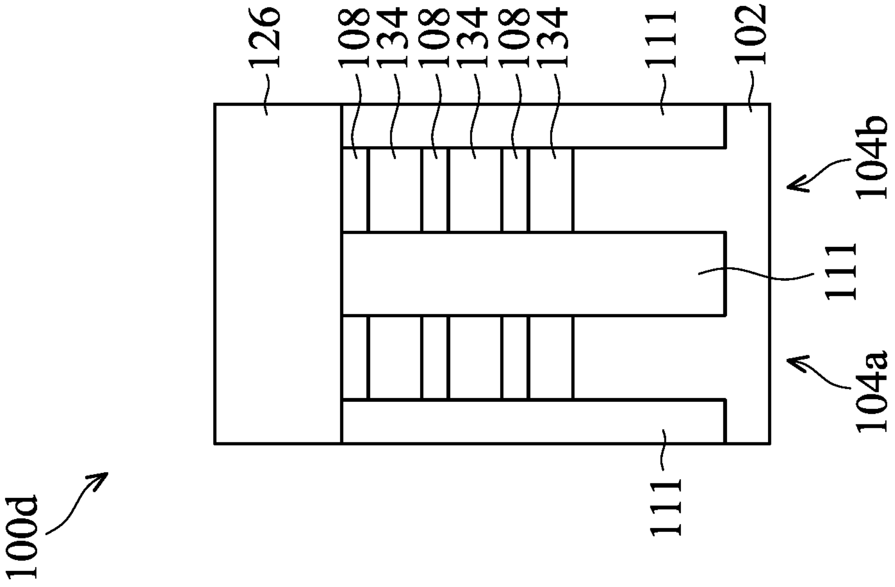
Figures 3, 5B:
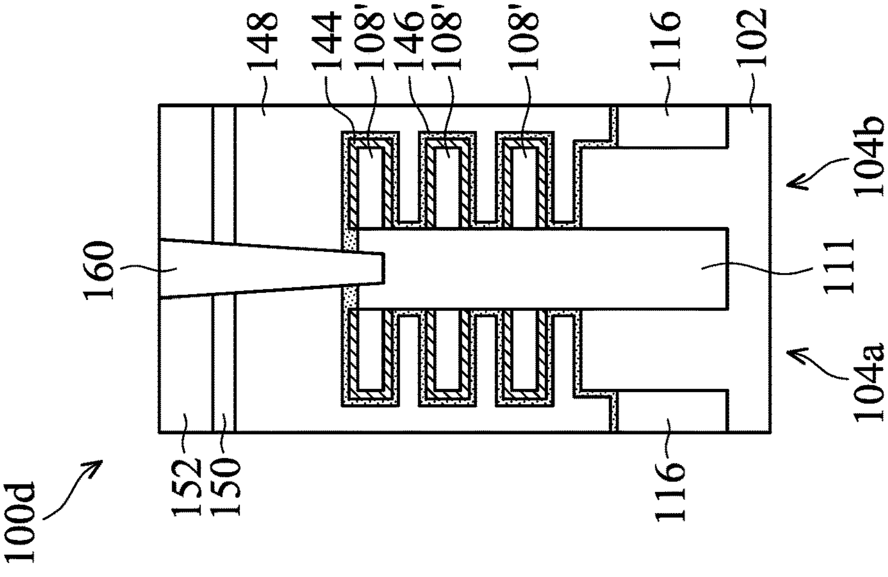
Figures 2, 5B:
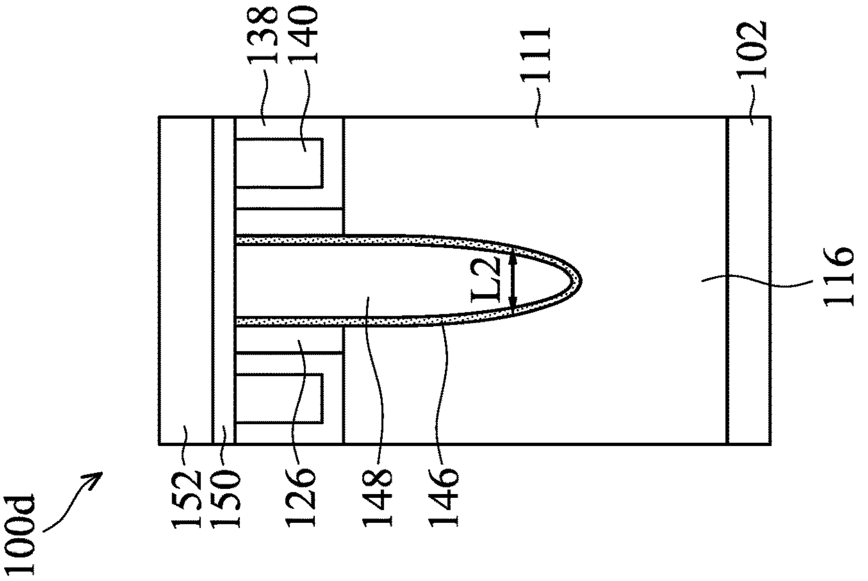
Figures 1, 5B:
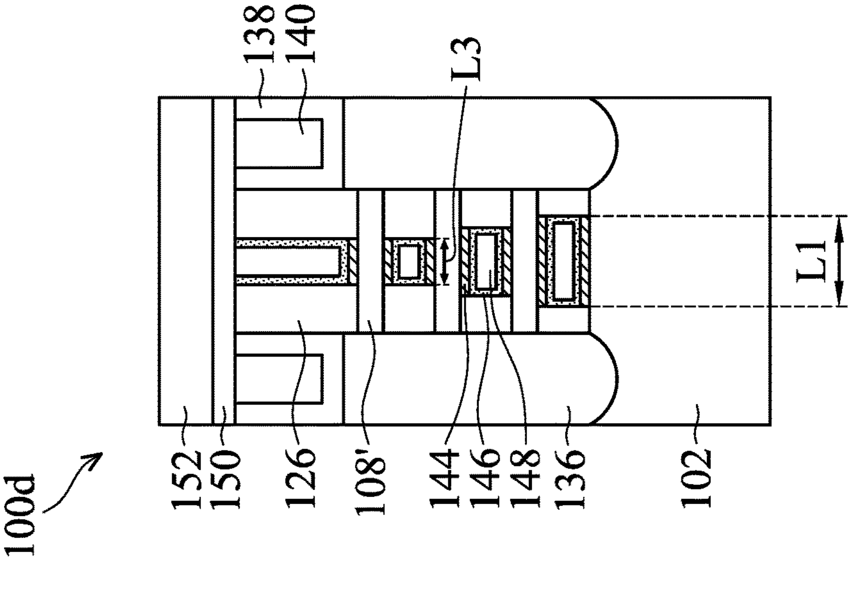
Figures 5, 5B:
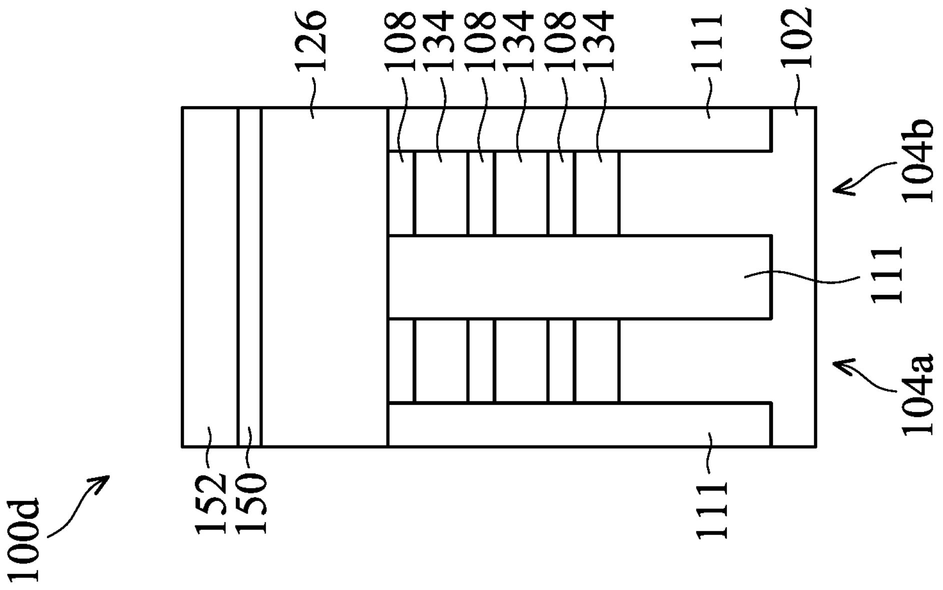
Figures 4, 5B:
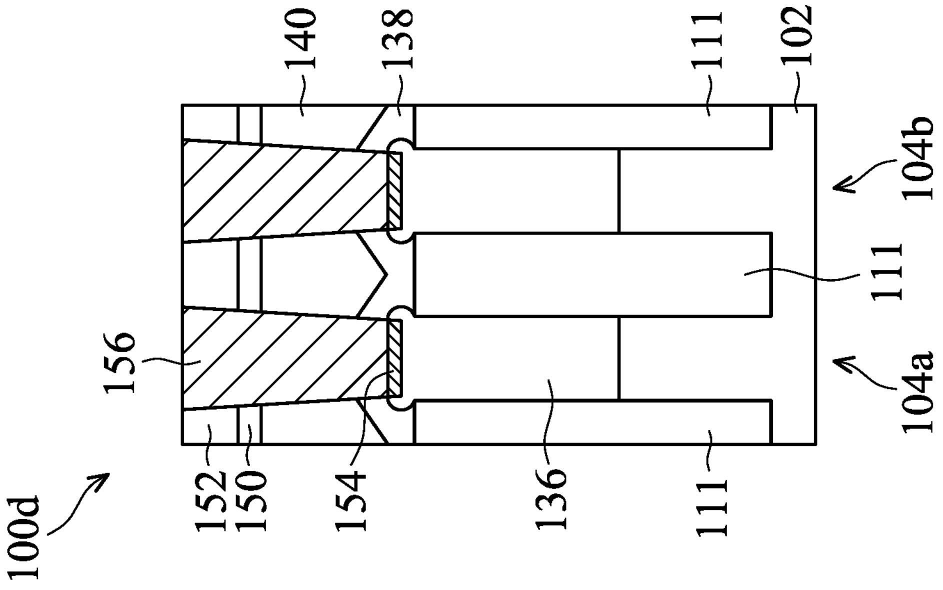

FIGS. 5A-1 to 5B-1 illustrate cross-sectional representations of various stages of manufacturing a semiconductor structure 100*d* shown along line A-A' in FIG. 1C, in accordance with some embodiments. FIGS. 5A-2 to 5B-2 illustrate cross-sectional representations of various stages of manufacturing the semiconductor structure 100*d* shown along line B-B' in FIG. 1C, in accordance with some embodiments. FIGS. 5A-3 to 5B-3 illustrate cross-sectional representations of various stages of manufacturing the semiconductor structure 100*d* shown along line C-C' in FIG. 1C, in accordance with some embodiments. FIGS. 5A-4 to 5B-4 illustrate cross-sectional representations of various stages of manufacturing the semiconductor structure 100*d* shown along line D-D' in FIG. 1C, in accordance with some embodiments. FIGS. 5A-5 to 5B-5 illustrate cross-sectional representations of various stages of manufacturing the semiconductor structure 100$d$ shown along line E-E' in FIG. 1C, in accordance with some embodiments. Some processes and materials used to form the semiconductor device structure 100$d$ are similar to, or the same as, those used to form the semiconductor device structure 100$a$ and are not repeated herein.

As shown in FIGS. 5A-1, 5A-2, 5A-3, 5A-4 and 5A-5, the first portion of the first gate structure 142$a$ has a first length $L_1$ adjacent to the nanostructures 108' along the first direction (e.g. x-axis) and the third portion of the first gate structure 142$a$ has a third length $L_3$ over the first portion of the first gate structure 142$a$. The second portion of the first gate structure 142$a$ over the dielectric wall 111 has a second length $L_2$ along the first direction (e.g. x-axis). In some embodiments, the third length $L_3$ is greater than the second length $L_2$ and smaller than the first length $L_1$. In some embodiments, the difference between the first length $L_1$ and the third length $L_3$ is in a range from about 1 nm to about 6 nm.

Afterwards, as shown in FIGS. 5B-1, 5B-2, 5B-3, 5B-4 and 5B-5, after the first gate structure 142$a$ and the second gate structure 142$b$ are formed, the etch stop layer 150 is formed over the gate structure 142, and the dielectric layer 152 is formed over the etch stop layer 150, in accordance with some embodiments.

Afterwards, the cutting structure 160 is formed through the first gate structure 142$a$. The first gate structure 142$a$ is divided into two portions by the cutting structure 160. Next, the silicide layer 154 and the S/D contact structure 156 are formed over the S/D structure 136, in accordance with some embodiments. The S/D contact structure 156 is electrically connected to the S/D structure 136. The silicide layer 154 is used to reduce the resistance between the S/D contact structure 156 and the S/D structure 136.

Figures 3, 6A:
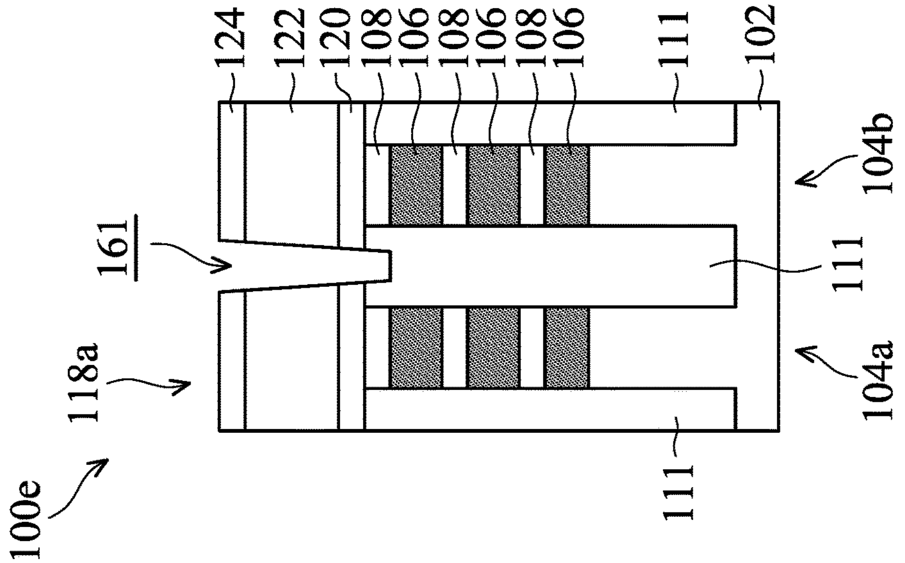
Figures 2, 6A:
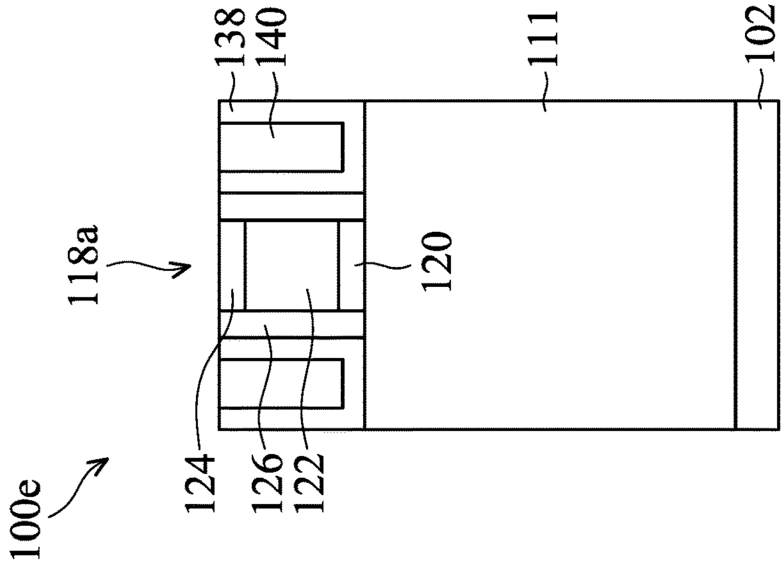
Figures 1, 6A:
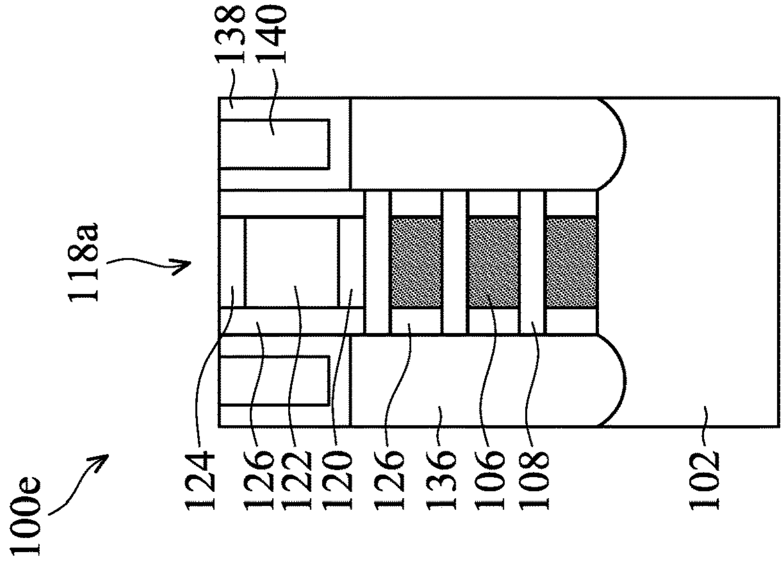
Figures 4, 6A:
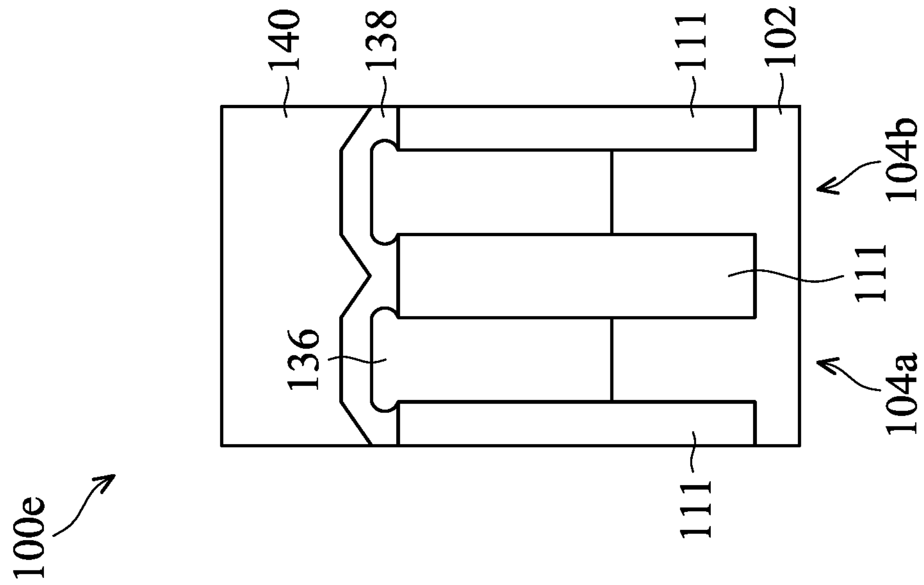
Figures 5, 6A:
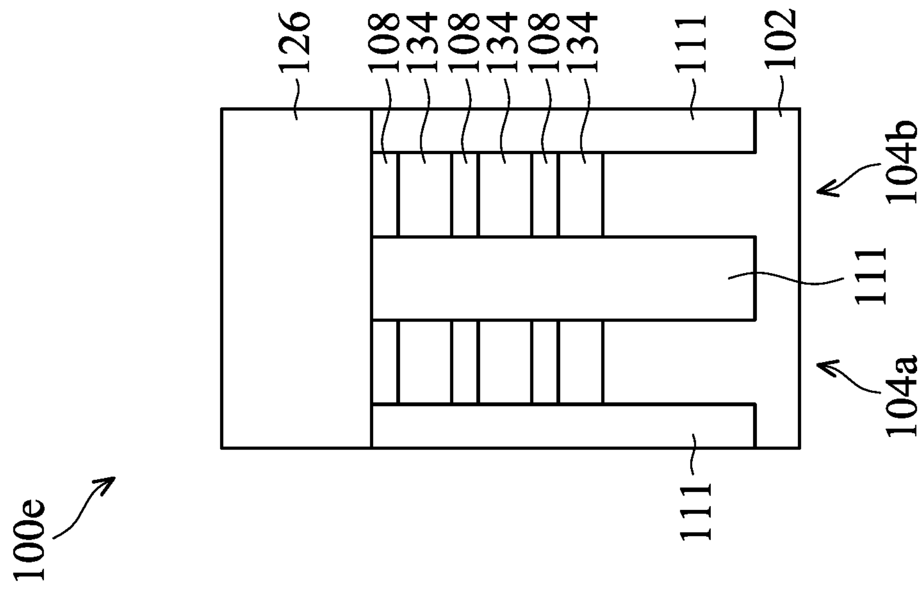
Figures 3, 6B:
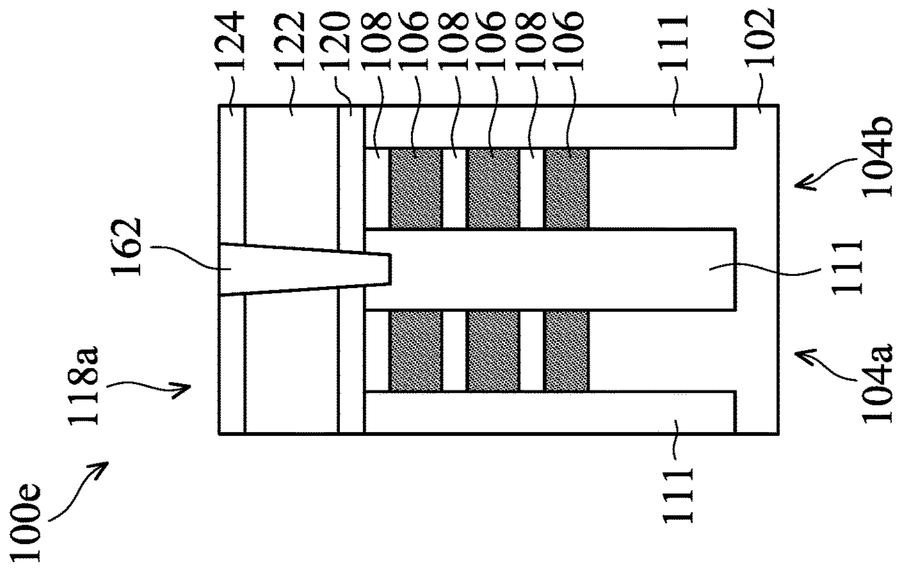
Figures 2, 6B:
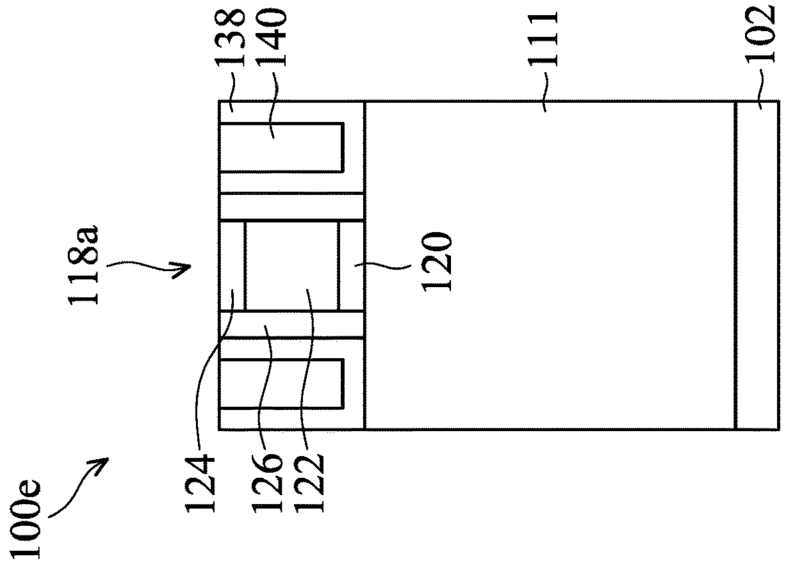
Figures 1, 6B:
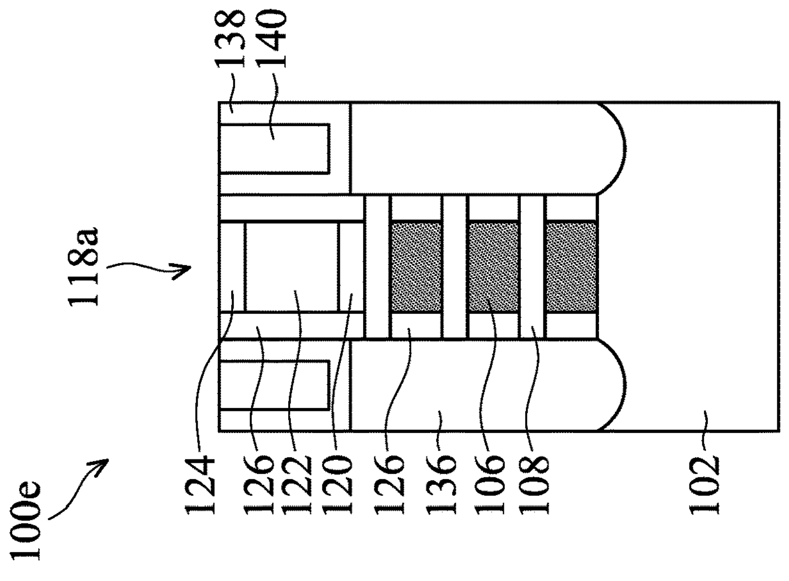
Figures 4, 6B:
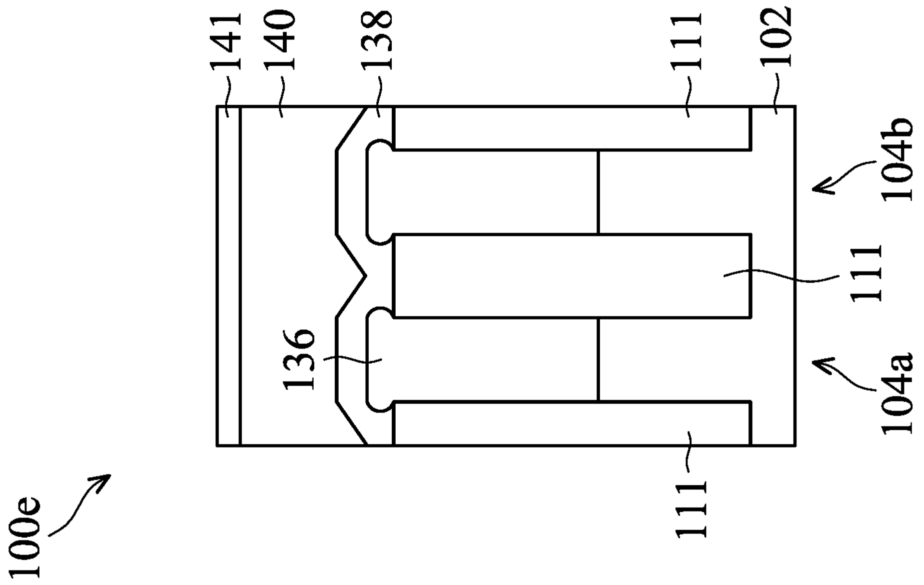
Figures 5, 6B:
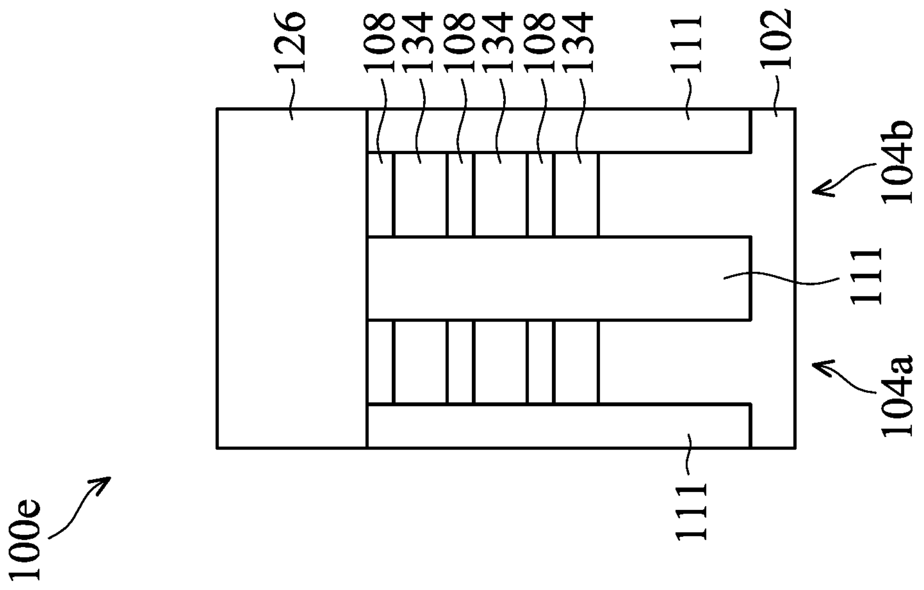
Figures 3, 6C:
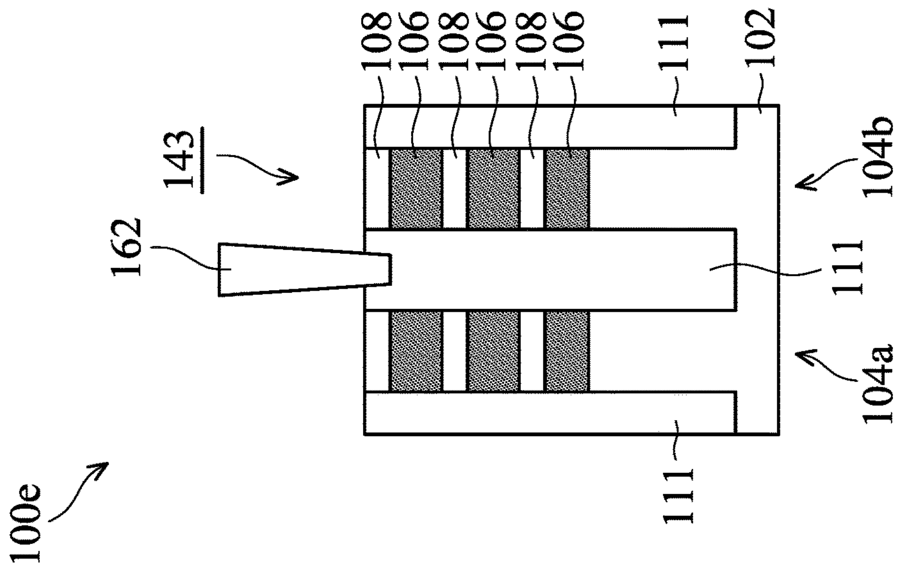
Figures 2, 6C:
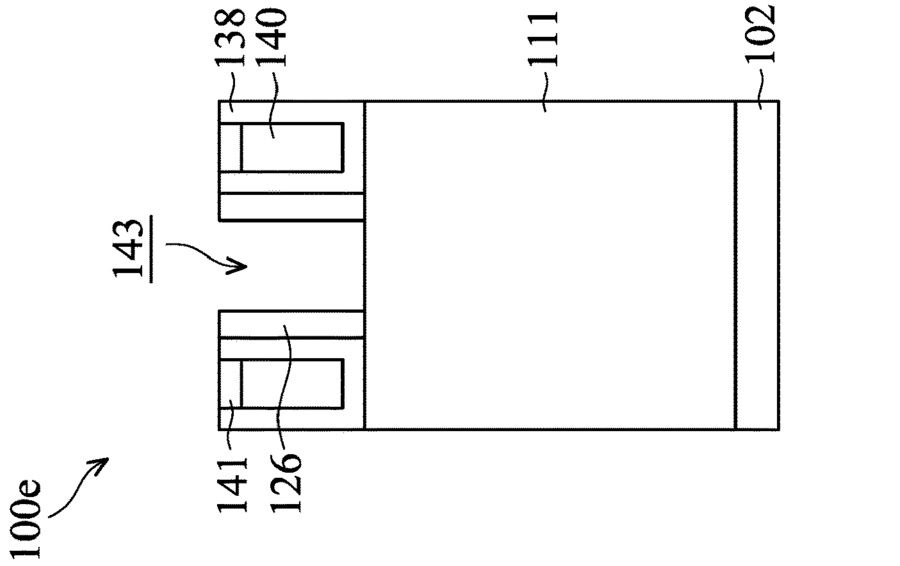
Figures 1, 6C:
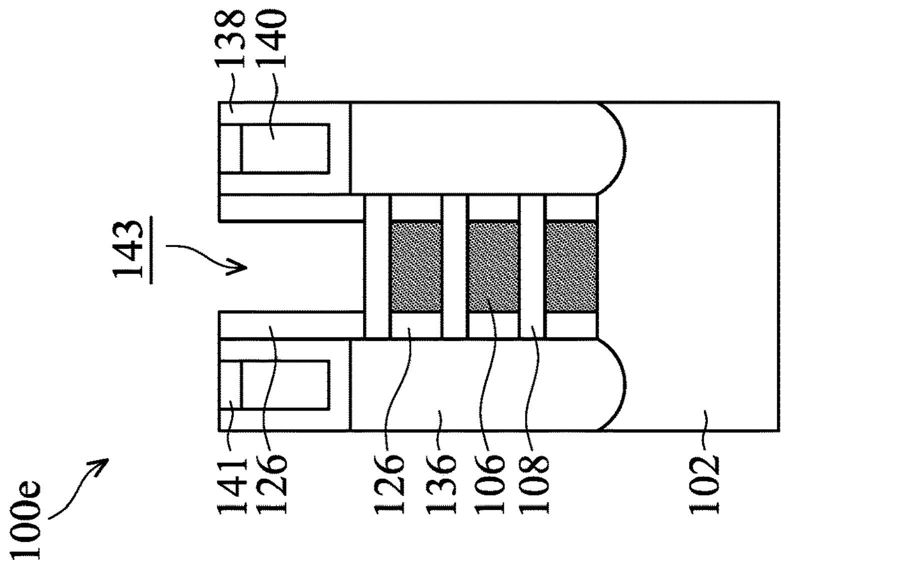
Figures 5, 6C:
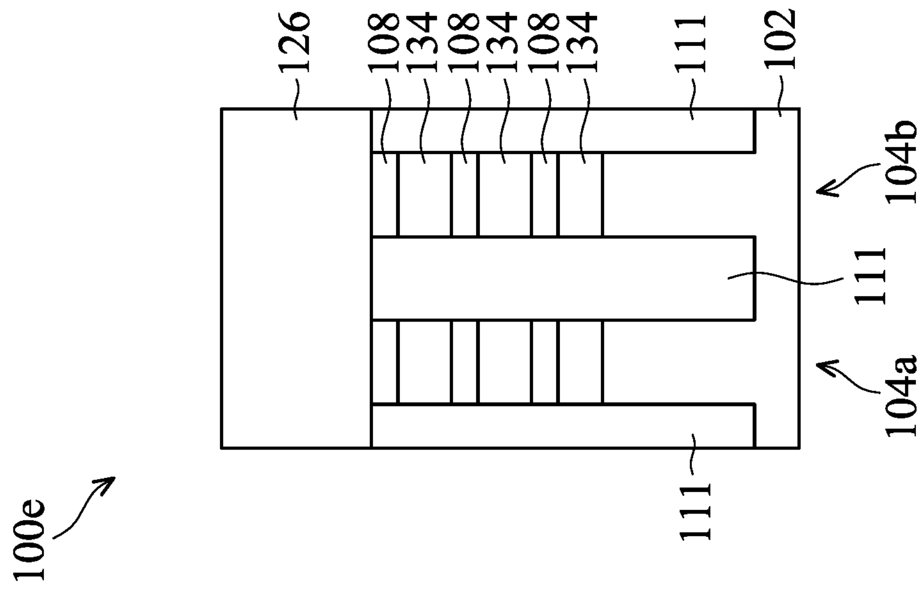
Figures 4, 6C:
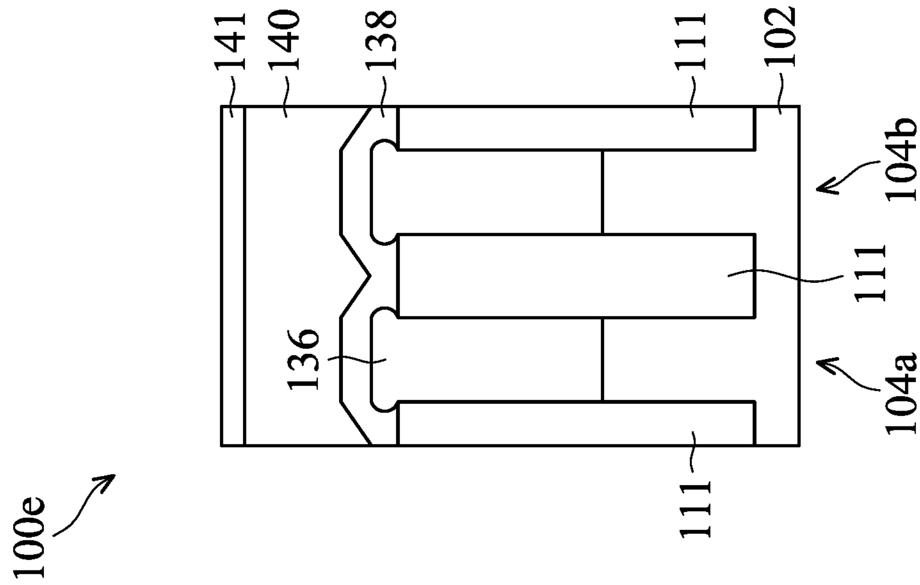
Figures 3, 6D:
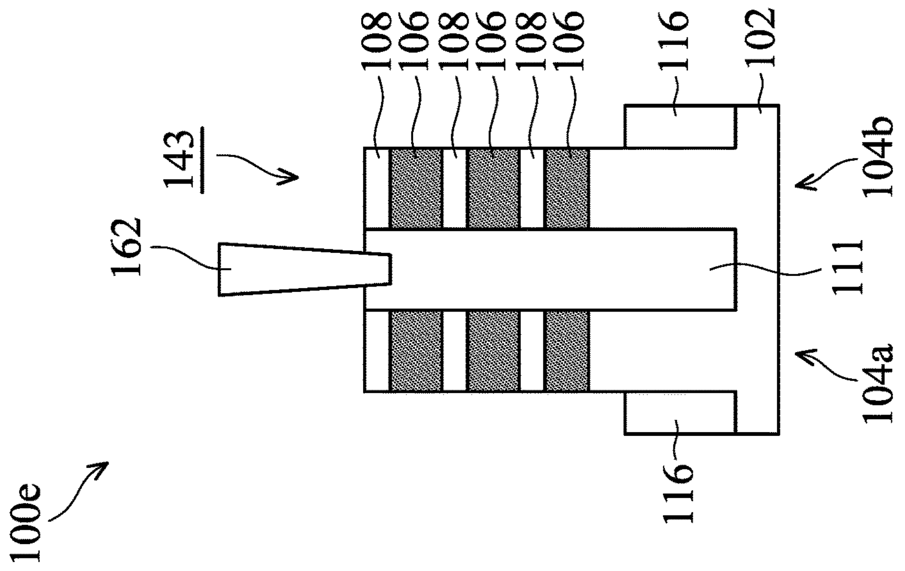
Figures 2, 6D:
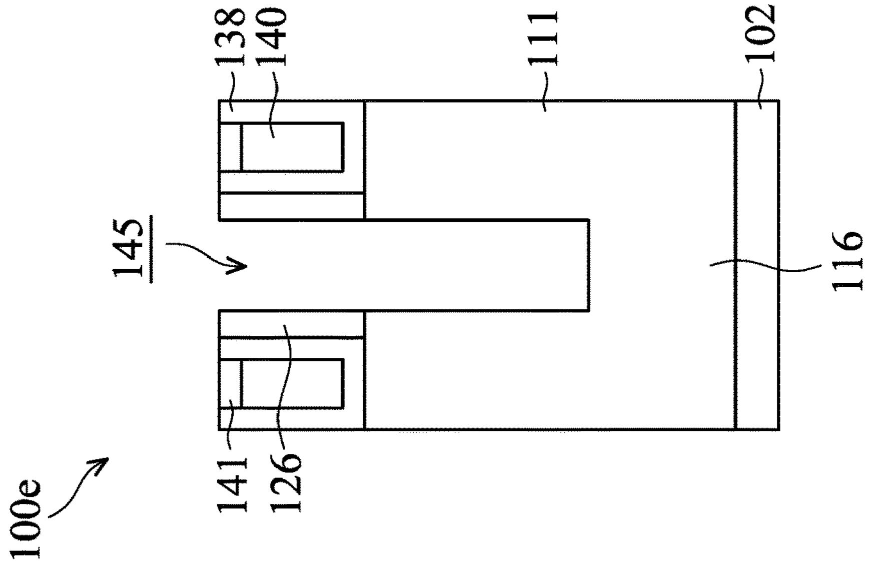
Figures 1, 6D:
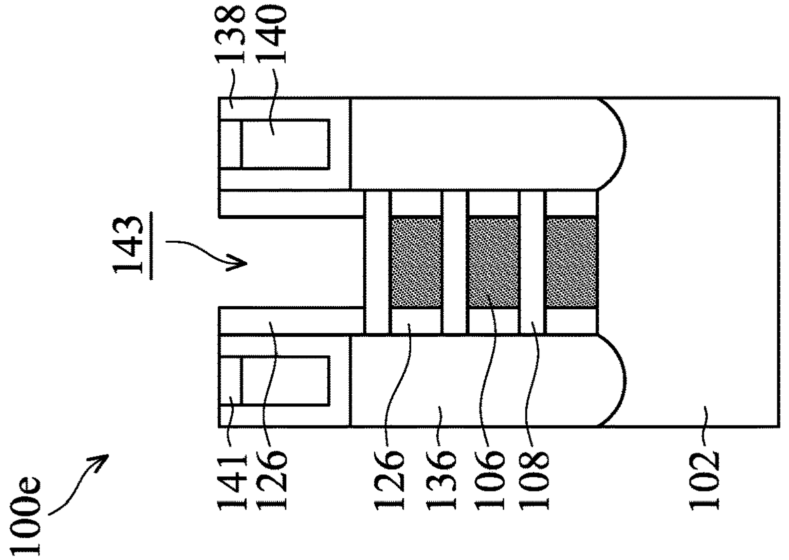
Figures 4, 6D:
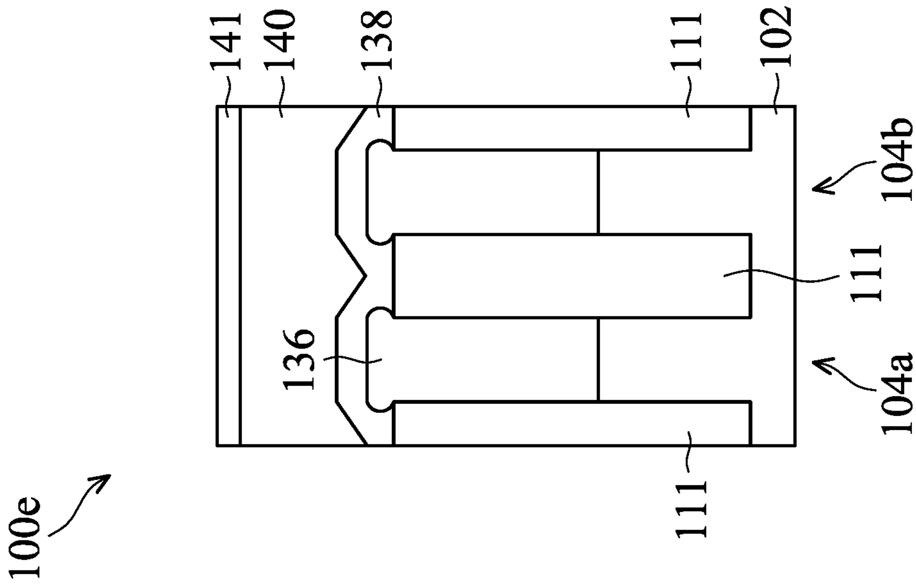
Figures 5, 6D:
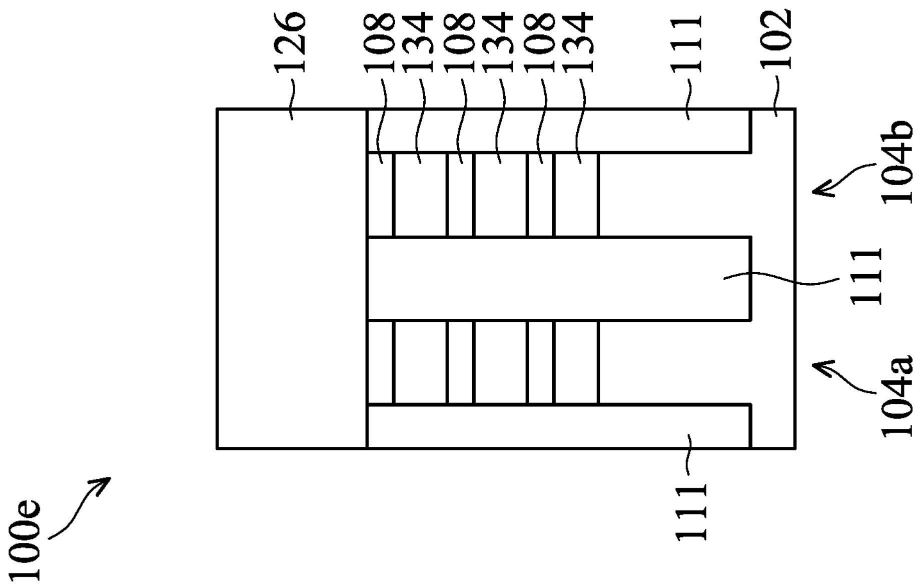
Figures 1, 6E:
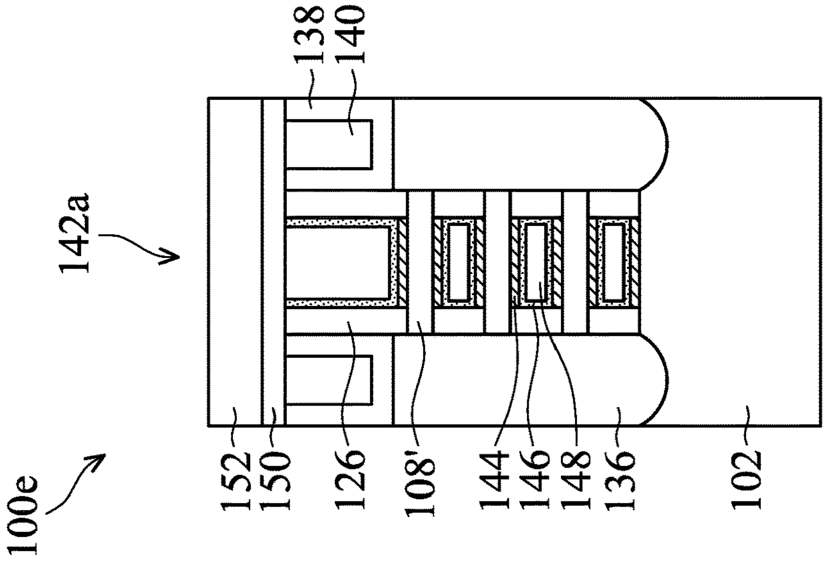
Figures 2, 6E:
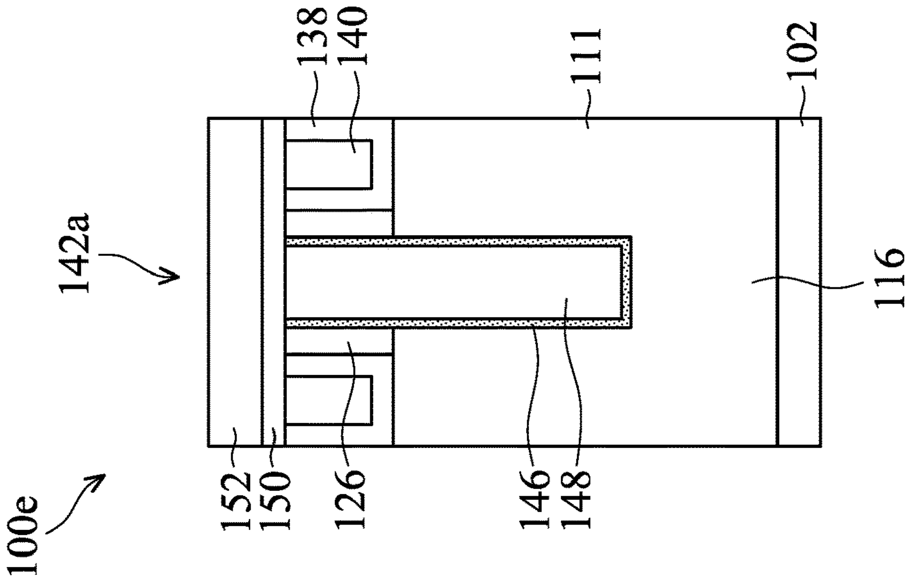
Figures 3, 6E:
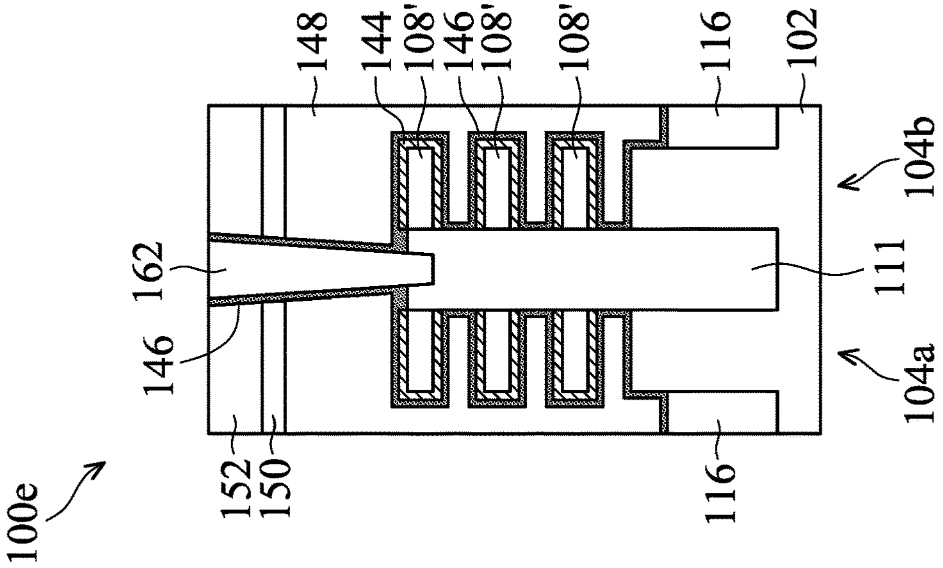
Figures 5, 6E:
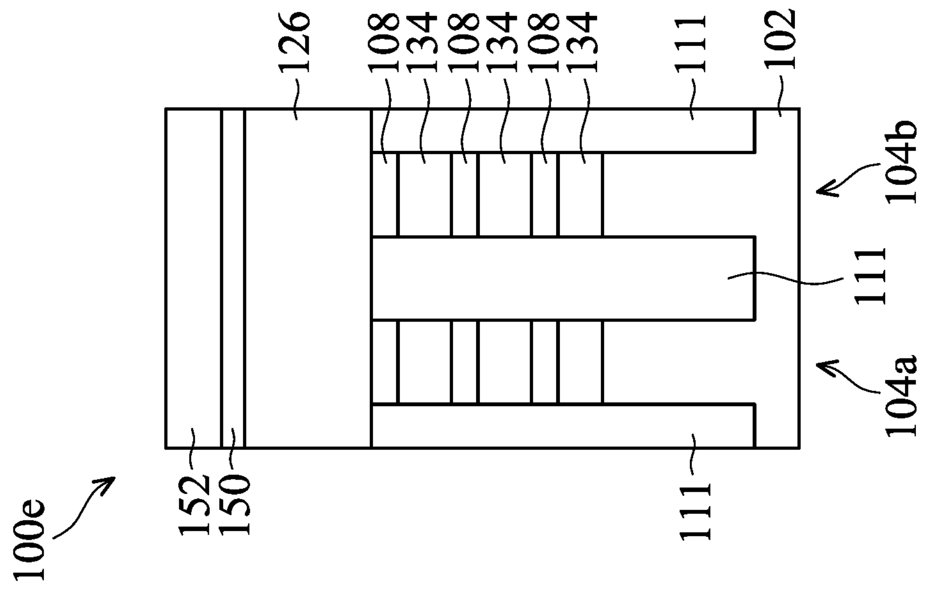
Figures 4, 6E:
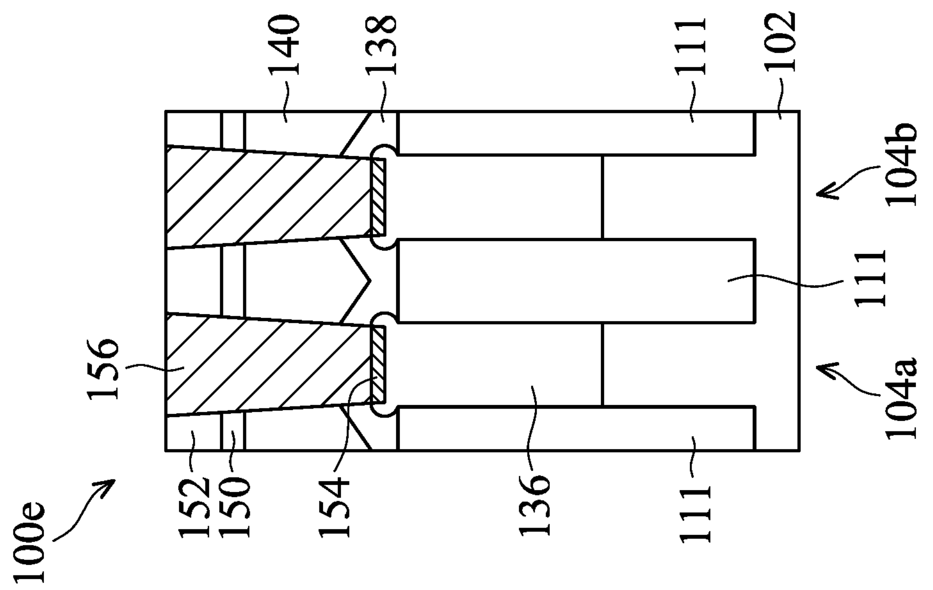

FIGS. 6A-1 to 6E-1 illustrate cross-sectional representations of various stages of manufacturing a semiconductor structure 100$e$ shown along line A-A' in FIG. 1C, in accordance with some embodiments. FIGS. 6A-2 to 6E-2 illustrate cross-sectional representations of various stages of manufacturing the semiconductor structure 100$e$ shown along line B-B' in FIG. 1C, in accordance with some embodiments. FIGS. 6A-3 to 6E-3 illustrate cross-sectional representations of various stages of manufacturing the semiconductor structure 100$e$ shown along line C-C' in FIG. 1C, in accordance with some embodiments. FIGS. 6A-4 to 6E-4 illustrate cross-sectional representations of various stages of manufacturing the semiconductor structure 100$e$ shown along line D-D' in FIG. 1C, in accordance with some embodiments. FIGS. 6A-5 to 6E-5 illustrate cross-sectional representations of various stages of manufacturing the semiconductor structure 100$e$ shown along line E-E' in FIG. 1C, in accordance with some embodiments. Some processes and materials used to form the semiconductor device structure 100$e$ are similar to, or the same as, those used to form the semiconductor device structure 100$a$ and are not repeated herein.

As shown in FIGS. 6A-1, 6A-2, 6A-3, 6A-4 and 6A-5, after the first dummy gate structure 118$a$ is formed over the isolation material 111, a portion of the dummy gate electrode layer 122 and a portion of the dummy gate dielectric layer 120 are removed to form a trench 161, in accordance with some embodiments.

Afterwards, as shown in FIGS. 6B-1, 6B-2, 6B-3, 6B-4 and 6B-5, after the trench 161 is formed, a cutting structure 162 is formed in the trench 161. The bottom portion of the cutting structure 162 is embedded in the isolation material 111. The bottom surface of the cutting structure 162 is lower than the top surface of the isolation material 111.

Afterwards, the protective layer 141 is formed on the ILD layer 140. The protective layer 141 is used to protect the underlying ILD layer 140. The first dummy gate structure 118$a$ is divided into two portions by the cutting structure 162.

In some embodiments, the cutting structure 162 is made of oxide, such as $SiO_2$, SiOCN, SiON, or the like. In some embodiments, the cutting structure 162 is made of a high k dielectric material, such as $HfO_2$, $ZrO_2$, $HfAlO_x$, $HfSiO_x$, $Al_2O_3$, or the like. In some embodiments, the cutting structure 162 is formed by performing ALD, CVD, PVD, another suitable process, or a combination thereof.

Next, as shown in FIGS. 6C-1, 6C-2, 6C-3, 6C-4 and 6C-5, the first dummy gate structure 118$a$ is removed to form a trench 143, in accordance with some embodiments. The first fin structure 104$a$ and the top surface of the isolation material 111 are exposed by the trench 143. In addition, the cutting structure 162 is exposed by the trench 143.

Afterwards, as shown in FIGS. 6D-1, 6D-2, 6D-3, 6D-4 and 6D-5, a photoresist layer (not shown) is formed over a portion of the isolation material 111, in accordance with some embodiments. The portion of the isolation material 111 is removed to form an isolation structure 116, and the remaining isolation material 111 is referred to as a dielectric wall 111 between the first fin structure 104$a$ and the second fin structure 104$b$.

As shown in FIG. 6D-2, the portion of the isolation material 111 directly below the first dummy gate structure 118$a$ is removed to form the trench 145, the bottom surface of the trench 145 is lower than the top surface of the isolation material 111.

As shown in FIG. 6D-3, the cutting structure 162 is formed on the dielectric wall 111 and protrudes from the top surface of the dielectric wall 111.

Next, as shown in FIGS. 6E-1, 6E-2, 6E-3, 6E-4 and 6E-5, the protective layer 141 is removed, and the photoresist layer is removed, in accordance with some embodiments. Next, the first semiconductor material layers 106 are removed to form nanostructures 108' (or channel layers 108') with the second semiconductor material layers 108. After the nanostructures 108' are formed, the first gate structure 142$a$ are formed to surround the nanostructures 108' and over the dielectric wall 111 and the isolation structure 116, in accordance with some embodiments.

The dielectric wall 111 is in direct contact with the nanostructures 108' (or channel layers 108') of the first gate structure 142$a$. The dielectric wall 111 extends from a first position to a second position, the first position is directly below the first gate structure 142$a$, and the second position is between two adjacent S/D structures 136.

As shown in FIG. 6E-3, the gate dielectric layer 142 is formed on the sidewall surface of the cutting structure 162. It should be noted that the cutting structure 162 is formed before the first gate structure 142$a$ is formed, and therefore the gate dielectric layer 142 is formed along the sidewall surface of the cutting structure 162. In FIG. 2H-3, the cutting structure 160 is formed after the first gate structure 142$a$ is formed, and therefore no gate dielectric layer will be formed on the cutting structure 160.

As shown in FIG. 6E-4, the silicide layer 154 and the S/D contact structure 156 are formed over the S/D structure 136, in accordance with some embodiments. The S/D contact structure 156 is electrically connected to the S/D structure

136. The silicide layer 154 is used to reduce the resistance between the S/D contact structure 156 and the S/D structure 136.

Figures 1, 7A:
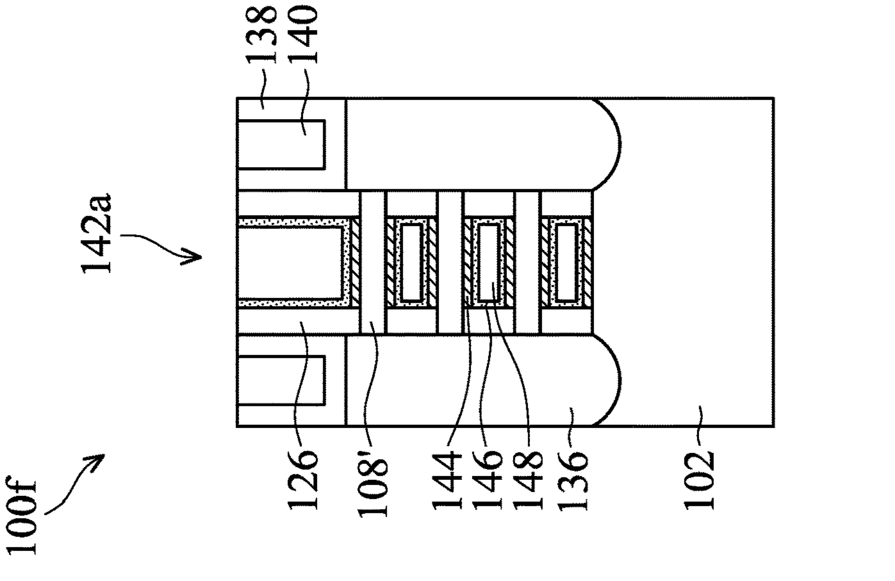
Figures 2, 7A:
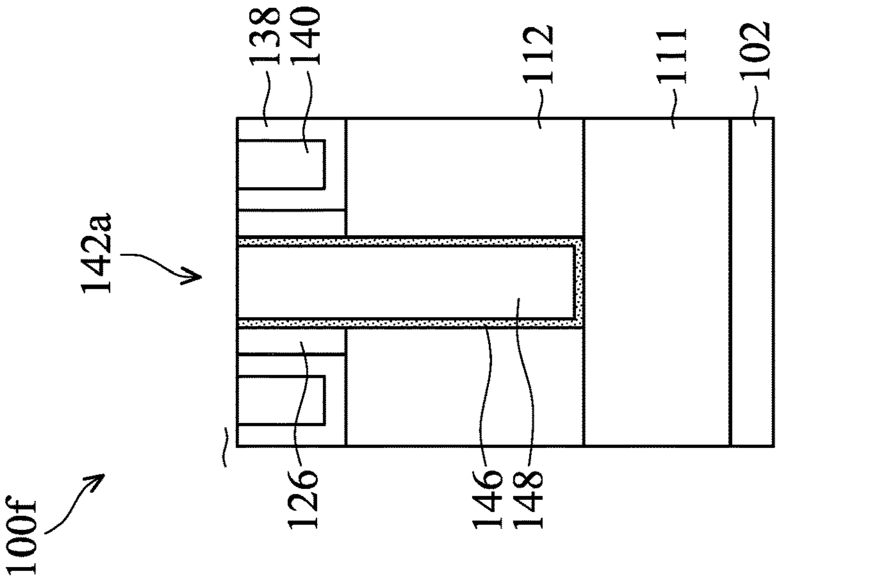
Figures 3, 7A:
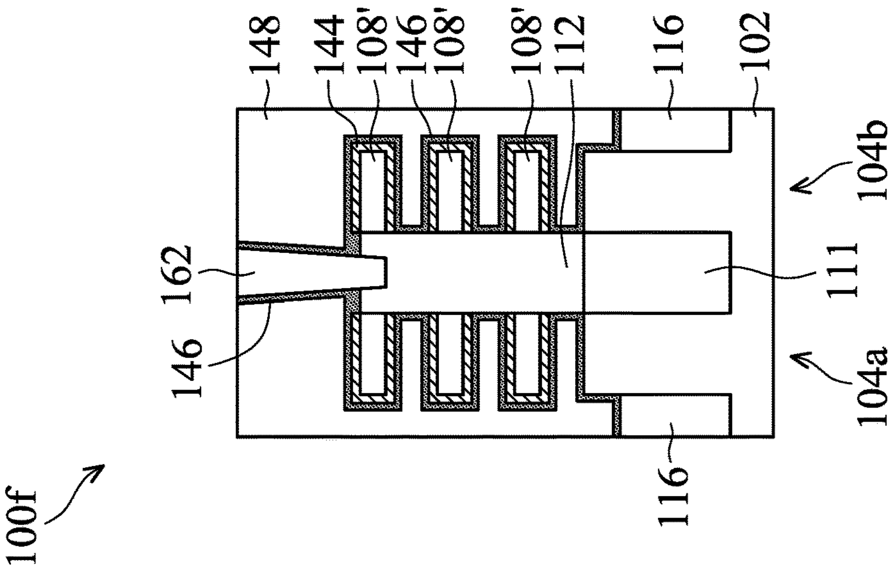
Figures 4, 7A:
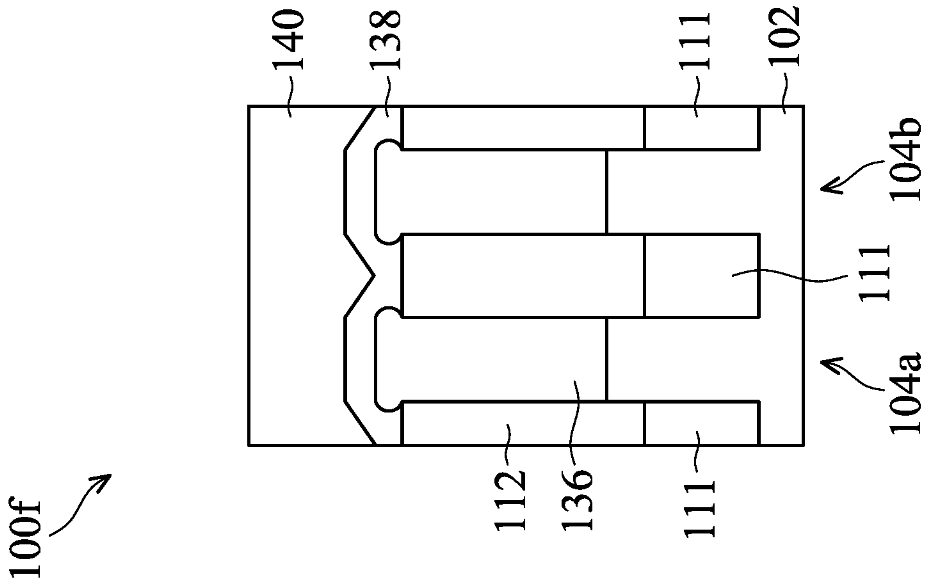
Figures 5, 7A:
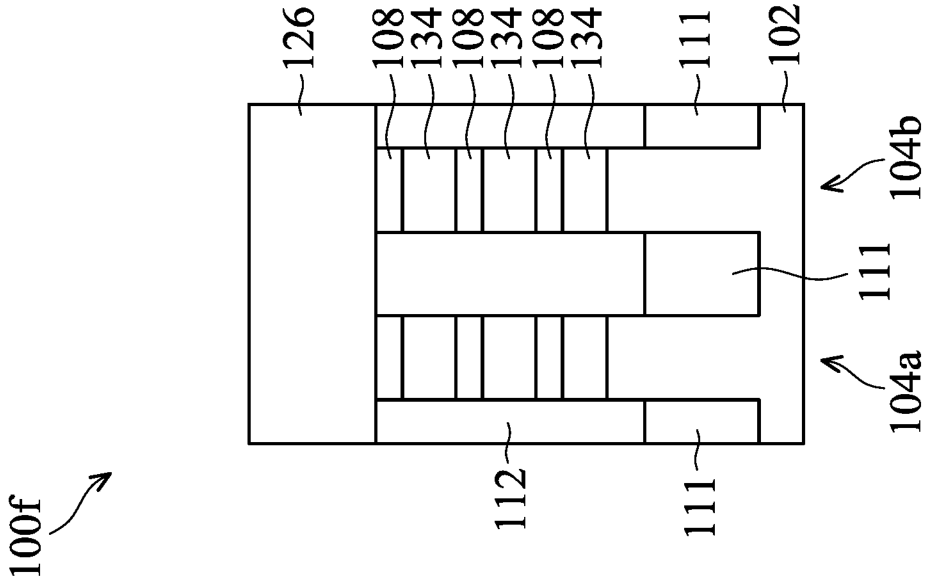
Figures 1, 7B:
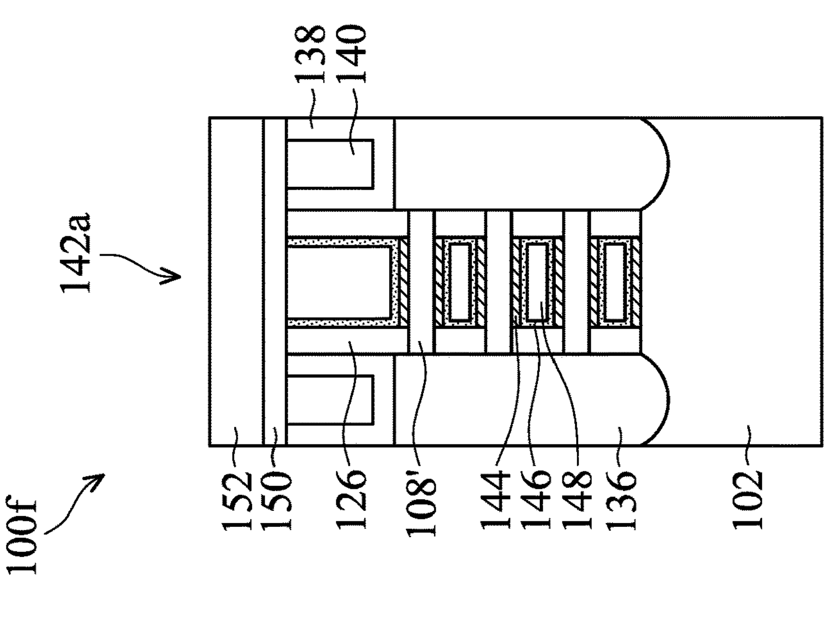
Figures 2, 7B:
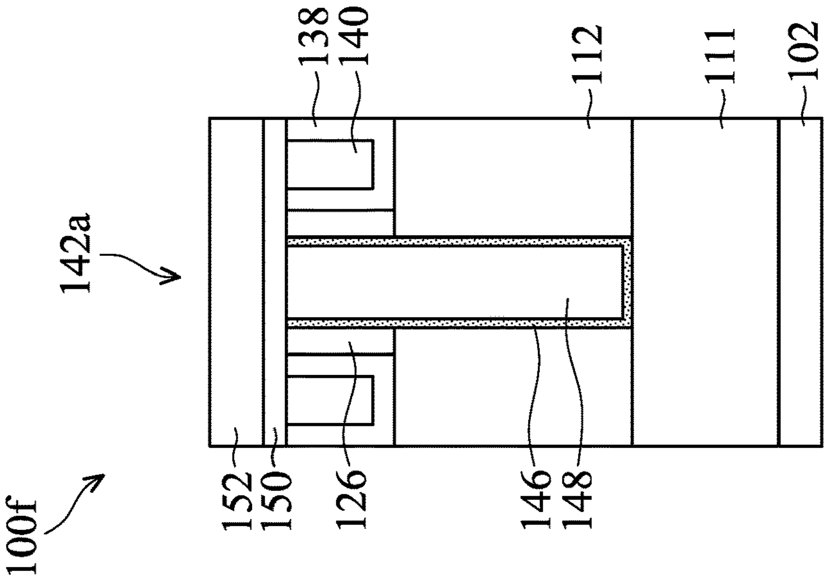
Figures 3, 7B:
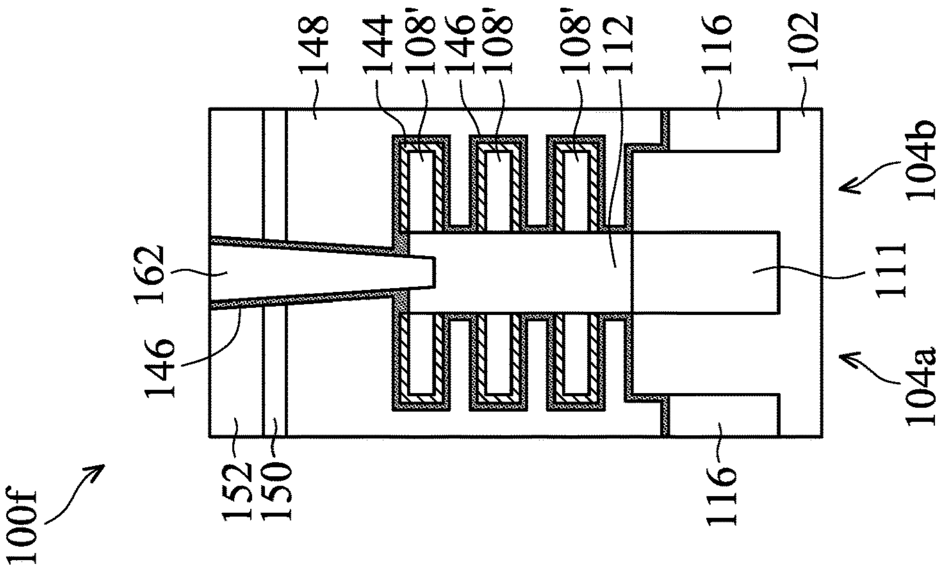
Figures 4, 7B:
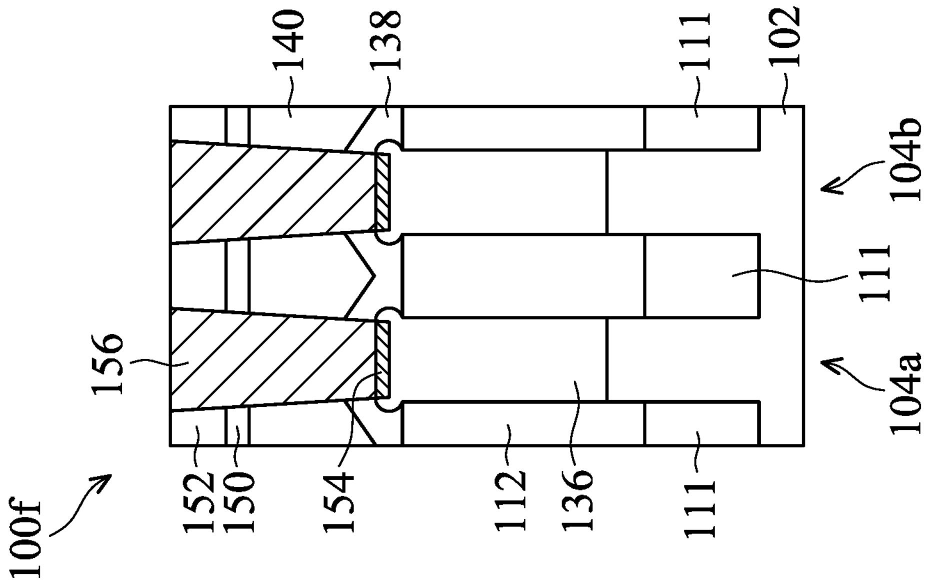
Figures 5, 7B:
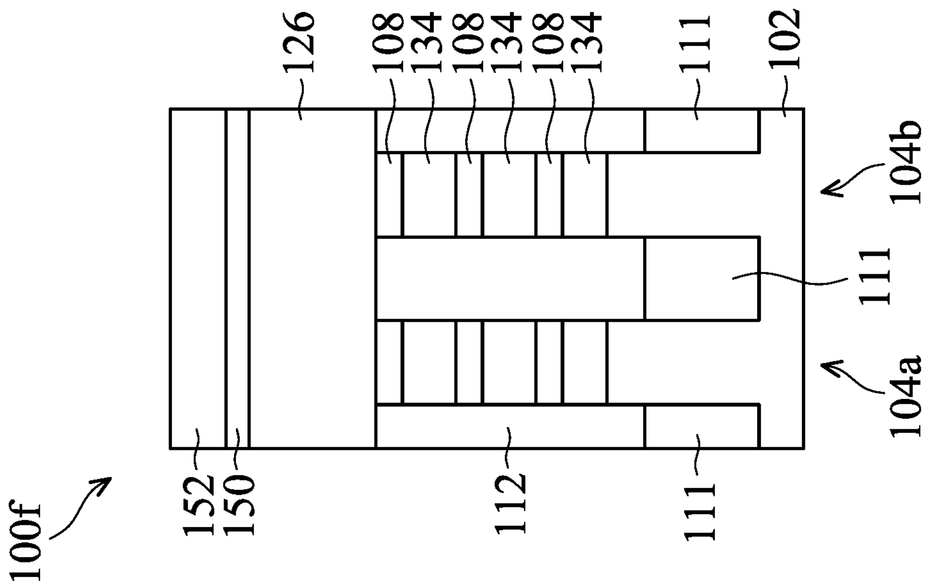

FIGS. 7A-1 to 7B-1 illustrate cross-sectional representations of various stages of manufacturing a semiconductor structure 100*f* shown along line A-A' in FIG. 1C, in accordance with some embodiments. FIGS. 7A-2 to 7B-2 illustrate cross-sectional representations of various stages of manufacturing the semiconductor structure 100*f* shown along line B-B' in FIG. 1C, in accordance with some embodiments. FIGS. 7A-3 to 7B-3 illustrate cross-sectional representations of various stages of manufacturing the semiconductor structure 100*f* shown along line C-C' in FIG. 1C, in accordance with some embodiments. FIGS. 7A-4 to 7B-4 illustrate cross-sectional representations of various stages of manufacturing the semiconductor structure 100*f* shown along line D-D' in FIG. 1C, in accordance with some embodiments. FIGS. 7A-5 to 7B-5 illustrate cross-sectional representations of various stages of manufacturing the semiconductor structure 100*f* shown along line E-E' in FIG. 1C, in accordance with some embodiments. Some processes and materials used to form the semiconductor device structure 100*f* are similar to, or the same as, those used to form the semiconductor device structure 100*e* and are not repeated herein.

FIGS. 7A-1, 7A-2, 7A-3, 7A-4 and 7A-5, are similar to FIGS. 6E-1, 6E-2, 6E-3, 6E-4 and 6E-5, the difference is that the refill material 112 is formed on the isolation material 111. The dielectric wall including the refill material 112 and the isolation material 111. The dielectric wall 111 and 112 extends from a first position to a second position, the first position is directly below the first gate structure 142*a*, and the second position is between two adjacent S/D structures 136.

Furthermore, the cutting structure 162 is formed before the first gate structure 142*a* is formed, and therefore the gate dielectric layer 142 is formed along the sidewall surface of the cutting structure 162.

Afterwards, as shown in FIGS. 6B-1, 6B-2, 6B-3, 6B-4 and 6B-5, after the first gate structure 142*a* is formed, the etch stop layer 150 is formed over the gate structure 142, and the dielectric layer 152 is formed over the etch stop layer 150, in accordance with some embodiments.

Afterwards, the silicide layer 154 and the S/D contact structure 156 are formed over the S/D structure 136, in accordance with some embodiments. The S/D contact structure 156 is electrically connected to the S/D structure 136. The silicide layer 154 is used to reduce the resistance between the S/D contact structure 156 and the S/D structure 136.

Since the planar top surface is formed before forming the first dummy gate structure 118*a* and the second dummy gate structure 118*b*, the risk of collapse issue of the first dummy gate structure 118*a* and the second dummy gate structure 118*b* can be reduced.

The dielectric wall 111 is formed after the dummy gate structure 118*a*/118*b* is removed, and therefore unwanted wall interaction between the dielectric wall 111 and the dummy gate structure 118*a*/118*b* is reduced, and uniformity of the depth of the S/D recess 130 is well controlled. In addition, the dielectric wall 111 extends from a first position, through a second position, to a third position. The first position is directly below the first gate structure 142*a*, the second position is between two adjacent S/D structures 136, and the third position is directly below the second gate structure 142*b*.

Furthermore, the dielectric wall is high enough to prevent the merge between two adjacent S/D structures 136. The risk of unwanted merge issue of the two adjacent S/D structures 136 is reduced. The dielectric wall is made of low-k dielectric material to reduce the capacitance of the semiconductor structure. This aids in improving the performance of the semiconductor structure.

It should be appreciated that the semiconductor structures 100*a* to 100*g* having different number of nanostructures 108' (or channel layers) in different region for performing different functions described above may also be applied to FinFET structures, although not shown in the figures.

It should be noted that same elements in FIGS. 1A to 13 may be designated by the same numerals and may include similar or the same materials and may be formed by similar or the same processes; therefore such redundant details are omitted in the interest of brevity. In addition, although FIGS. 1A to 13 are described in relation to the method, it will be appreciated that the structures disclosed in FIGS. 1A to 13 are not limited to the method but may stand alone as structures independent of the method. Similarly, although the methods shown in FIGS. 1A to 13 are not limited to the disclosed structures but may stand alone independent of the structures. Furthermore, the nanostructures described above may include nanowires, nanosheets, and other applicable nanostructures in accordance with some embodiments.

Also, while disclosed methods are illustrated and described below as a series of acts or events, it will be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms "approximately," "substantially," "substantial" and "about" describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments for forming semiconductor structures may be provided. The semiconductor structure includes a first fin structure and a second fin structure formed over a substrate. The first fin structure includes first nanostructures, and the second fin structure includes second nanostructures along a first direction (e.g. x-axis). A first gate structure and a second gate structure formed over the first nanostructures and the second nanostructures. An S/D structure is formed adjacent to the first gate structure. A high dielectric wall (formed from an isolation material) is formed between and in direct contact with the first nanostructures and the second nanostructures. The dielectric wall is formed after the dummy gate structure is removed, and therefore unwanted wall interaction between the dielectric wall and the dummy gate structure is reduced, and uniformity of the depth of the S/D recess is well controlled. In addition, the dielectric wall extends from a first position, through a second position, to a third position. The first position is directly below the first gate structure, the second position is between two adjacent S/D structure, and the third position is directly below the second gate structure. The dielectric wall is made of low-k dielectric material to reduce the capacitance of the semiconductor structure. This helps to improve the performance of the semiconductor structure.

In some embodiments, a semiconductor structure is provided. The semiconductor includes an isolation structure formed over a substrate, and first nanostructures formed over an isolation structure along a first direction. The semiconductor includes second nanostructures adjacent to the first nanostructure along the first direction. The semiconductor also includes a dielectric wall between the first nanostructures and the second nanostructures, and the dielectric wall includes a low-k dielectric material. The dielectric wall is in direct contact with the first nanostructures and the second nanostructures, and a top surface of the dielectric wall is higher than a top surface of the isolation structure. The semiconductor includes a gate structure formed over the first nanostructures along a second direction, and a cutting structure formed over the dielectric wall. The gate structure is divided into two portions by the cutting structure.

In some embodiments, a semiconductor structure is provided. The semiconductor includes first nanostructures formed over a substrate along a first direction, and second nanostructures adjacent to the first nanostructure along the first direction. The semiconductor includes a first gate structure formed over the first nanostructures and the second nanostructures, and a first S/D structure adjacent to the first nanostructures. The semiconductor also includes a second S/D structure adjacent to the second nanostructures. The semiconductor further includes a dielectric wall between the first nanostructures and the second nanostructures. The dielectric wall includes a top portion and a bottom portion, and an interface between the top portion and the bottom portion is lower than a topmost first nanostructure.

In some embodiments, a method for forming a semiconductor structure is provided. The method includes forming a first fin structure and a second fin structure over a first region and a second region of a substrate, respectively. The first fin structure includes first semiconductor material layers and second semiconductor material layers alternately stacked, and the second fin structure includes first semiconductor material layers and second semiconductor material layers alternately stacked. The method also includes forming an isolation material adjacent to the first fin structure and the second fin structure, and forming a first dummy gate structure over the isolation material, the first fin structure and the second fin structure. The method includes removing the first dummy gate structure to expose the first fin structure and the second fin structure. The method also includes after removing the first dummy gate structure, removing a portion of the isolation material to form an isolation structure, and a remaining portion of the isolation material becomes a dielectric wall between the first fin structure and the second fin structure. The method also includes removing all of the second semiconductor material layers to expose the first semiconductor material layers, and forming a gate structure surrounding the first semiconductor material layers. The gate structure is in direct contact with the dielectric wall and the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:

forming a first fin structure and a second fin structure over a first region and a second region of a substrate, respectively, wherein the first fin structure comprises first semiconductor material layers and second semiconductor material layers alternately stacked, and the second fin structure comprises the first semiconductor material layers and the second semiconductor material layers alternately stacked;

forming an isolation material adjacent to the first fin structure and the second fin structure;

forming a first dummy gate structure over the isolation material, the first fin structure and the second fin structure;

removing the first dummy gate structure to expose the first fin structure and the second fin structure;

after removing the first dummy gate structure, removing a portion of the isolation material to form an isolation structure, and a remaining portion of the isolation material becomes a dielectric wall between the first fin structure and the second fin structure;

removing all of the second semiconductor material layers to form a plurality of nanostructures, wherein the plurality of nanostructures is directly connected to the dielectric wall; and forming a gate structure surrounding the plurality of nanostructures, wherein the gate structure is in direct contact with the dielectric wall and the isolation structure.

2. The method for forming the semiconductor structure as claimed in claim 1, wherein a top surface of the isolation material is substantially coplanar with a top surface of the first fin structure and a top surface of the second fin structure before forming the first dummy gate structure.

3. The method for forming the semiconductor structure as claimed in claim 1, further comprising:

forming a separating structure over the dielectric wall.

4. The method for forming the semiconductor structure as claimed in claim 3, further comprising:

forming a gate dielectric layer lining on a sidewall surface of the separating structure.

5. The method for forming the semiconductor structure as claimed in claim 1, further comprising:

forming a first gate spacer layer adjacent to the first dummy gate structure; and forming an inner spacer directly below the first gate spacer layer, wherein a topmost surface of the inner spacer is lower than a top surface of the dielectric wall.

6. The method for forming the semiconductor structure as claimed in claim 1, further comprising:

forming an etch stop layer over the gate structure;

forming a dielectric layer on the etch stop layer; and forming a separating structure through the etch stop layer and the dielectric layer, wherein the separating structure is through a portion of the dielectric wall.

7. The method for forming the semiconductor structure as claimed in claim 1, further comprising:

forming a refill material on the isolation material, wherein the refill material and the isolation material are made of different materials.

8. The method for forming the semiconductor structure as claimed in claim 1, further comprising:
removing a portion of the first fin structure and a portion of the second fin structure to form a first S/D recess and a second S/D recess;
forming a first S/D structure in the first S/D recess; and
forming a second S/D structure in the second S/D recess, wherein the isolation material is between the first S/D structure and the second S/D structure.

9. The method for forming the semiconductor structure as claimed in claim 1, wherein forming the gate structure further comprises:
forming a gate dielectric layer on a top surface of the dielectric wall; and
forming a gate electrode layer on the gate dielectric layer.

10. A method for forming a semiconductor structure, comprising:
forming a first fin structure and a second fin structure along a first direction over a substrate, wherein the first fin structure comprises first semiconductor material layers and second semiconductor material layers alternately stacked, and the second fin structure comprises the first semiconductor material layers and the second semiconductor material layers alternately stacked;
forming an isolation material adjacent to the first fin structure and the second fin structure;
forming a first dummy gate structure along a second direction over the isolation material, the first fin structure and the second fin structure;
removing the first dummy gate structure to expose the first fin structure and the second fin structure;
after removing the first dummy gate structure, forming a photoresist layer on the isolation material, wherein the photoresist layer is between the first fin structure and the second fin structure, and a portion of a top surface of the first fin structure is covered by the photoresist layer;
removing a first portion of the isolation material, such that a second portion of the isolation material covered by the photoresist layer is left to form a dielectric wall between the first fin structure and the second fin structure;
removing the first semiconductor material layers to form a plurality of nanostructures; and
forming a gate structure on the dielectric wall.

11. The method for forming the semiconductor structure as claimed in claim 10, further comprising:
after removing the first dummy gate structure, removing the first portion of the isolation material to form an isolation structure, wherein a top surface of the isolation structure is lower than a top surface of the dielectric wall.

12. The method for forming the semiconductor structure as claimed in claim 11, further comprising:
forming a separating structure over the dielectric wall, wherein a portion of the separating structure extends into the dielectric wall.

13. The method for forming the semiconductor structure as claimed in claim 10, wherein a top surface of the dielectric wall is leveled with a topmost surface of the second semiconductor material layers.

14. The method for forming the semiconductor structure as claimed in claim 10, further comprising:
forming a refill material on the isolation material, wherein the refill material and the isolation material are made of different materials.

15. A method for forming a semiconductor structure, comprising:
forming a first fin structure, a second fin structure on a substrate, wherein the first fin structure and the second fin structure, respectively, comprise first semiconductor material layers and second semiconductor material layers alternately stacked;
forming an isolation material adjacent to the first fin structure and the second fin structure, wherein the isolation material, the first fin structure and the second fin structure form a surface level;
forming a first dummy gate structure on the surface level, wherein a bottom surface of the first dummy gate structure interfaces with a top surface of the isolation material;
removing the first dummy gate structure to expose the first fin structure and the second fin structure;
after removing the first dummy gate structure, forming a photoresist layer on the isolation material;
removing a portion of the isolation material to form an isolation structure, and a remaining portion of the isolation material becomes a dielectric wall between the first fin structure and the second fin structure, wherein the dielectric wall is connected to the first fin structure and the second fin structure;
removing all of the second semiconductor material layers to form a plurality of nanostructures; and
forming a gate structure on the plurality of nanostructures and the dielectric wall.

16. The method for forming the semiconductor structure as claimed in claim 15, wherein forming the gate structure further comprises:
forming a gate dielectric layer on a top surface of the dielectric wall; and
forming a gate electrode layer on the gate dielectric layer.

17. The method for forming the semiconductor structure as claimed in claim 15, further comprising:
forming a refill material on the isolation material, wherein an interface between the refill material and the isolation material is lower than a topmost surface of the second semiconductor material layers.

18. The method for forming the semiconductor structure as claimed in claim 15, wherein the surface level is a planar top surface.

19. The method for forming the semiconductor structure as claimed in claim 15, further comprising:
removing a portion of the first fin structure and a portion of the second fin structure to form a first S/D recess and a second S/D recess;
forming a first S/D structure in the first S/D recess; and
forming a second S/D structure in the second S/D recess, wherein the isolation material is between the first S/D structure and the second S/D structure.

20. The method for forming the semiconductor structure as claimed in claim 15, further comprising:
forming a separating structure over the dielectric wall, wherein a bottom portion of the separating structure is embedded in the dielectric wall.

* * * * *